US006864033B2

(12) United States Patent
Nakamura et al.

(10) Patent No.: US 6,864,033 B2
(45) Date of Patent: Mar. 8, 2005

(54) MULTICOLOR IMAGE-FORMING MATERIAL

(75) Inventors: Hideyuki Nakamura, Shizuoka (JP); Mitsuru Yamamoto, Shizuoka (JP); Kazuhito Miyake, Shizuoka (JP); Shinichi Yoshinari, Shizuoka (JP); Akira Hatakeyama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/052,392

(22) Filed: Jan. 23, 2002

(65) Prior Publication Data

US 2002/0187418 A1 Dec. 12, 2002

(30) Foreign Application Priority Data

Jan. 24, 2001 (JP) .................................... P.2001-015892
Mar. 16, 2001 (JP) .................................... P.2001-076252
Mar. 16, 2001 (JP) .................................... P.2001-076562
Mar. 19, 2001 (JP) .................................... P.2001-078847
Mar. 19, 2001 (JP) .................................... P.2001-079566
Jan. 15, 2002 (JP) .................................... P.2002-006509

(51) Int. Cl.[7] ............................ G03F 7/34; G03F 7/11
(52) U.S. Cl. .................... 430/200; 430/271.1; 430/952
(58) Field of Search ................................ 430/200, 201, 430/271.1, 952

(56) References Cited

U.S. PATENT DOCUMENTS 5,053,381 A 10/1991 Chapman et al.
5,126,760 A 6/1992 DeBoer
5,300,398 A 4/1994 Kaszczuk
5,352,562 A * 10/1994 Takahashi et al. .......... 430/253
5,512,931 A 4/1996 Nakajima et al.
5,580,693 A 12/1996 Nakajima et al.
5,593,808 A 1/1997 Ellis
5,611,881 A 3/1997 Kimura et al.
5,629,129 A * 5/1997 Yamamoto et al. ......... 430/200
5,759,738 A * 6/1998 Tsuno et al. ................ 430/200
5,935,902 A * 8/1999 Imamura .................... 430/200
6,027,850 A 2/2000 Kawakami et al.
6,326,121 B1 * 12/2001 Takahashi ................... 430/200
6,458,504 B2 * 10/2002 Wachi et al. ............... 430/200
6,468,634 B1 * 10/2002 Miyake et al. .............. 438/195

FOREIGN PATENT DOCUMENTS

JP 5-16553 A 1/1993
JP 6-219052 A 8/1994
JP 8-104063 A 4/1996
JP 8-224975 A 9/1996
JP 9-11651 A 1/1997
JP 9-169165 A 6/1997

(List continued on next page.)

*Primary Examiner*—Richard L. Schilling
(74) *Attorney, Agent, or Firm*—Sughrue Mion, PLLC

(57) ABSTRACT

A multicolor image-forming material comprising: an image-receiving sheet comprising an image-receiving layer; and at least four thermal transfer sheets each comprising a support, a photothermal converting layer and an image-forming layer, and each having a different color, wherein an image is formed by the method comprising the steps of: superposing each one of the at least four thermal transfer sheets on the image-receiving sheet to be in a state of the image-forming layer being in contact with the image-receiving layer; and irradiating the thermal transfer sheet with a laser beam to transfer an image in an area of the image-forming layer subjected to irradiation onto the image-receiving layer, and a ratio of the reflection optical density ($OD_r$) of the image-forming layer to a thickness of the image-forming layer ($\mu$m unit) is 1.50 or more to 1, and a contact angle in relation to water of the image-forming layer and the image-receiving layer is from 7.0 to 120.0°.

28 Claims, 11 Drawing Sheets

FOREIGN PATENT DOCUMENTS

| | | | |
|---|---|---|---|
| JP | 2000-37956 | A | 2/2000 |
| JP | 2000-71634 | A | 3/2000 |
| JP | 2000-135862 | A | 5/2000 |
| JP | 2000-168252 | A | 6/2000 |
| JP | 2000/225776 | * | 8/2000 |
| JP | 2000/355177 | * | 12/2000 |
| JP | 2001-10244 | A | 1/2001 |
| JP | 2001-47753 | A | 2/2001 |
| JP | 2001/310491 | * | 11/2001 |
| JP | 2001/328287 | * | 11/2001 |

* cited by examiner

ENLARGED VIEW OF DOTS IN PRINTED MATTER

MULTICOLOR IMAGE-FORMING MATERIAL

FIELD OF THE INVENTION

The present invention relates to a multicolor image-forming material for forming a full color image of high definition with a laser beam, and a method for forming a multicolor image. In particular, the present invention relates to a multicolor image-forming material which is useful for forming a color proof (DDCP: direct digital color proof) or a mask image from digital image signals by laser recording in the field of printing, and a method for forming a multicolor image.

BACKGROUND OF THE INVENTION

In the field of graphic arts, printing of a printing plate is performed with a set of color separation films formed from a color original by a lith film. In general, color proofs are formed from color separation films before actual printing work for checking an error in the color separation step and the necessity for color correction. Color proofs are desired to realize high definition which makes it possible to surely reproduce a half tone image and have performances such as high stability of processing. Further, for obtaining color proofs closely approximating to an actual printed matter, it is preferred to use materials which are used in actual printing as the materials for making color proofs, e.g., the actual printing paper as the base material and pigments as the coloring materials. As the method for forming a color proof, a dry method not using a developing solution is strongly desired.

As the dry method for forming color proofs, a recording system of directly forming color proofs from digital signals has been developed with the spread of electronized system in preprocessing of printing (pre-press field) in recent years. Such electronized system aims at forming in particular high quality color proofs, generally reproducing a dot image of 150 lines/inch or higher. For recording a proof of high image quality from digital signals, laser beams capable of modulation by digital signals and capable of finely diaphragming recording lights are used as recording heads. Therefore, the development of an image-forming material having high recording sensitivity to laser beams and exhibiting high definition property capable of reproducing highly minute dots is required.

As the image-forming material for use in a transfer image-forming method using laser beams, a heat fusion transfer sheet comprising a support having thereon in the order of a photothermal converting layer which absorbs laser beams and generates heat, and an image-forming layer which contains a pigment dispersed in components such as a heat fusion type wax and a binder is known (JP-A-5-58045 (the term "JP-A" as used herein means an "unexamined published Japanese patent application")). In the image-forming method using such an image-forming material, an image-forming layer corresponding to the area of a photothermal converting layer irradiated with laser beams is fused by heat generated in that area and transferred onto an image-receiving sheet arranged on the transfer sheet by lamination, thus a transferred image is formed on the image-receiving sheet.

Further, a thermal transfer sheet comprising a support having provided thereon in the order of a photothermal converting layer containing a light-to-heat converting material, an extremely thin heat-releasing layer (from 0.03 to 0.3 $\mu$m), and an image-forming layer containing a coloring material is disclosed in JP-A-6-219052. In the thermal transfer sheet, the bonding strength between the image-forming layer and the photothermal converting layer bonded through the intervening heat-releasing layer is reduced by laser beam irradiation, as a result, a highly minute image is formed on an image-receiving sheet arranged on the thermal transfer sheet by lamination. The image-forming method by the thermal transfer sheet utilizes so-called ablation, specifically the heat-releasing layer partially decomposes at the area irradiated with laser beams and vaporizes, thereby the bonding strength of the image-forming layer and the photothermal converting layer at the irradiated area is reduced and the image-forming layer at that area is transferred to the image-receiving sheet laminated thereon.

These image-forming methods have advantages such that an actual printing paper provided with an image-receiving layer (an adhesion layer) can be used as the material of an image-receiving sheet, and a multicolor image can be easily obtained by transferring images different in colors in sequence on the image-receiving sheet. In particular, the image-forming method utilizing ablation has the advantage such that highly minute image can be easily obtained, and so these methods are useful for forming a color proof (DDCP: direct digital color proof) or a highly minute mask image.

DTP is prevailing more and more and the intermediate process of using films is omitted when CTP (computer to plate) is used, and the need for proof is shifting from analog proof to DDCP. In recent years the demand for large sized high grade DDCP which is highly stable and excellent in coincidence in printing has increased.

High definition printing can be effected according to a heat transfer method by laser irradiation, and as the laser heat transfer methods, (1) a laser sublimation method, (2) a laser ablation method, and (3) a laser fusion method are conventionally used, but any of these methods has a drawback such that the shape of a recorded dots are not sharp. In (1) a laser sublimation method, since dyes are used as the coloring material, the approximation of proofs to printed matters is not sufficient, further, since this is a method of sublimating coloring materials, the outline of a dot is fuzzy, and so definition is not sufficiently high. On the other hand, since pigments are used as the coloring materials in (2) a laser ablation method, the approximation to printed matters is good, but since this is a method of sputtering coloring materials, the outline of a dot is also fuzzy as in the sublimation method, and so definition is not sufficiently high. Further, in (3) a laser fusion method, since a molten substance flows, the outline of a dot is not also clear.

SUMMARY OF THE INVENTION

Accordingly, the subjects of the present invention are to solve the above-described problems of the prior art technique and to accomplish the following objects. That is, an object of the present invention is to provide a large sized high grade DDCP which is highly stable and excellent in coincidence in printing. Specifically, the present invention is characterized in that: 1) a thermal transfer sheet can provide dots showing sharpness and stability by membrane transfer of coloring materials, which are not influenced by light sources of illumination as compared with the pigment materials and printed matters, 2) an image-receiving sheet can receive stably and surely the image-forming layer in a thermal transfer sheet by laser energy, 3) transfer to actual printing paper can be effected corresponding to the range of at least from 64 to 157 g/$m^2$ such as art paper (coated paper), mat paper and finely coated paper, delicate texture can be imaged, and a high-key part can be reproduced accurately, and 4) extremely stable transfer releasability can be obtained. A further object of the present invention is to provide a method for forming a multicolor image which can form an image having good image quality and stable transfer image density on an image-receiving sheet even when recording is performed by multi-beam laser beams of high energy under different temperature and humidity conditions.

That is, the present invention has been attained by the following means.

(1) A multicolor image-forming material which comprises an image-receiving sheet having an image-receiving layer, and four or more thermal transfer sheets each comprising a support having at least a photothermal converting layer and an image-forming layer each having a different color, wherein image-recording is performed by irradiating the image-forming layer in each thermal transfer sheet and the image-receiving layer in the image-receiving sheet superposed vis-a-vis with laser beams, thereby the area of the image-forming layer subjected to irradiation with laser beams is transferred onto the image-receiving layer in the image-receiving sheet, wherein the ratio of the reflection optical density ($OD_r$) of the image-forming layer to the layer thickness of the image-forming layer, $OD_r$/layer thickness ($\mu$m unit) is 1.50 or more, and the contact angle with water of the image-forming layer and the image-receiving layer is from 7.0 to 120.0°.

(2) The multicolor image-forming material as described in the above item (1), wherein the difference between the contact angle with water of the image-forming layer and the contact angle with water of the image-receiving layer is 73° or less.

(3) The multicolor image-forming material as described in the above item (2), wherein the difference between the contact angle with water of the image-forming layer and the contact angle with water of the image-receiving layer is 65° or less.

(4) The multicolor image-forming material as described in the above item (1), wherein at least one monomer unit constituting the binder of the image-forming layer and at least one monomer unit constituting the binder of the image-receiving layer in the image-receiving sheet are the same.

(5) The multicolor image-forming material as described in the above item (4), wherein the monomer unit of the binder is a vinyl acetal unit.

(6) The multicolor image-forming material as described in the above item (4), wherein the monomer unit of the binder is at least one unit of a styrene unit, a butyral unit and a styrene acrylate unit.

(7) The multicolor image-forming material as described in the above item (1), wherein any coating layer in the thermal transfer sheet and the image-receiving sheet contains a surface tension decreasing agent.

(8) The multicolor image-forming material as described in the above item (7), wherein the surface tension decreasing agent is a surface tension decreasing agent which makes, when contained in each solvent of 1-propanol, methyl ethyl ketone and N-methyl-2-pyrrolidone in concentration of 0.5 mass %, the surface tension of 1-propanol 22.5 mN/m or less, and that of methyl ethyl ketone 22.5 mN/m or less, and that of N-methyl-2-pyrrolidone 25.0 mN/m or less.

(9) The multicolor image-forming material as described in the above item (7), wherein the surface tension decreasing agent is a perfluoroalkylpolyoxyalkylene oligomer.

(10) The multicolor image-forming material as described in the above item (1), wherein any coating layer in the thermal transfer sheet and the image-receiving sheet contains at least two kinds of waxes having a melting point of 100° C. or less.

(11) The multicolor image-forming material as described in the above item (10), wherein the waxes are two or more kinds of fatty acid amides.

(12) The multicolor image-forming material as described in the above item (11), wherein the fatty acid amides are the combination of the fatty acid amide in which the fatty acid moiety is a saturated fatty acid and the fatty acid amide in which the fatty acid moiety is an unsaturated fatty acid.

(13) The multicolor image-forming material as described in the above item (10), wherein any coating layer in the thermal transfer sheet and the image-receiving sheet contains at least one of monomethacrylate, monoacrylate, dimethacrylate, diacrylate, trimethacrylate, triacrylate, tetramethacrylate and tetraacrylate.

(14) The multicolor image-forming material as described in the above item (10), wherein any coating layer in the thermal transfer sheet and the image-receiving sheet contains a monomer represented by the following formula (1) or a homo- or copolymer containing the monomer as the main component:

$$R_1R_2R_3C—CH_2—OCO—CR=CH_2 \qquad (1)$$

wherein $R_1$, $R_2$ and $R_3$ each represents a hydrogen atom, a lower alkyl group, or a $—CH_2—OCO—CR=CH_2$ group; and R represents a hydrogen atom or a methyl group.

(15) The multicolor image-forming material as described in the above item (1), wherein the image-forming layer contains a rosin-based resin having a softening point of 100° C. or less measured by a ring and ball method and an acid value of from 2 to 220 measured according to JIS K3504.

(16) The multicolor image-forming material as described in the above item (15), wherein the rosin-based resin is a resin selected from a rosin, a hydrogenated rosin, a modified rosin, derivatives of these rosins, and a rosin-modified maleic acid resin.

(17) The multicolor image-forming material as described in the above item (15), wherein the rosin-based resin contains 30 mass % or more of an abietic acid type rhodinic acid.

(18) The multicolor image-forming material as described in the above item (15), wherein the rosin-based resin is an esterified product of a rosin containing 30 mass % or more of an abietic acid type rhodinic acid and at least one kind of polyhydric alcohol selected from ethylene glycol, glycerol and pentaerythritol.

(19) The multicolor image-forming material as described in the above item (1), wherein the image-receiving layer contains a rosin-based resin having a softening point of less than 130° C. measured by a ring and ball method and an acid value of from 2 to 250 according to JIS K3504.

(20) The multicolor image-forming material as described in any of the above items (1) to (19), wherein the ratio of the optical density ($OD_{LH}$) of the photothermal converting layer to the layer thickness of the photothermal converting layer, $OD_{LH}$/layer thickness ($\mu$m unit) is 4.36 or more.

(21) The multicolor image-forming material as described in any of the above items (1) to (20), wherein the transferred image is an image having definition of 2,400 dpi or more.

(22) The multicolor image-forming material as described in any of the above items (1) to (21), wherein the recording area of the multicolor image is a size of 515×728 mm or more.

(23) The multicolor image-forming material as described in any of the above items (1) to (22), wherein the ratio of the reflection optical density ($OD_r$) of the image-forming layer to the layer thickness of the image-forming layer, $OD_r$/layer thickness (μm unit) is 2.50 or more.

(24) The multicolor image-forming material as described in any of the above items (1) to (23), wherein the ratio of the reflection optical density ($OD_r$) of the image-forming layer to the layer thickness of the image-forming layer, $OD_r$/layer thickness (μm unit) is 1.80 or more, and the contact angle with water of the image-receiving layer is 8.6° or less.

(25) The multicolor image-forming material as described in any of the above items (1) to (24), wherein the photothermal converting layer contains a heat resisting resin having a glass transition temperature of from 200 to 400° C. and a heat decomposition temperature of 450° C. or more.

(26) The multicolor image-forming material as described in any of the above items (1) to (25), wherein the heat resisting resin contained in the light-to-heat converting layer is an organic solvent-soluble polyimide resin.

(27) The multicolor image-forming material as described in any of the above items (1) to (26), wherein the image-forming layer contains a pigment in an amount of from 20 to 80 mass %, and an amorphous organic high molecular weight polymer having a softening point of from 40 to 150° C. in an amount of from 20 to 80 mass %, and has a layer thickness of from 0.2 to 1.5 μm.

(28) A method for forming a multicolor image using the image-receiving sheet as described in any of the above items (1) to (27), and four or more thermal transfer sheets as described in any of the above items (1) to (27) comprising the steps of superposing the image-forming layer in each thermal transfer sheet and the image-receiving layer in the image-receiving sheet vis-a-vis, and irradiating the thermal transfer sheet with laser beams and transferring the area of the image-forming layer subjected to laser beam irradiation onto the image-receiving layer in the image-receiving sheet, to thereby effect image-recording, wherein the image-forming layer in the laser beam irradiation area is transferred to the image-receiving sheet in a membrane state.

DESCRIPTION OF REFERENCE CHARACTERS

Figure 1A:
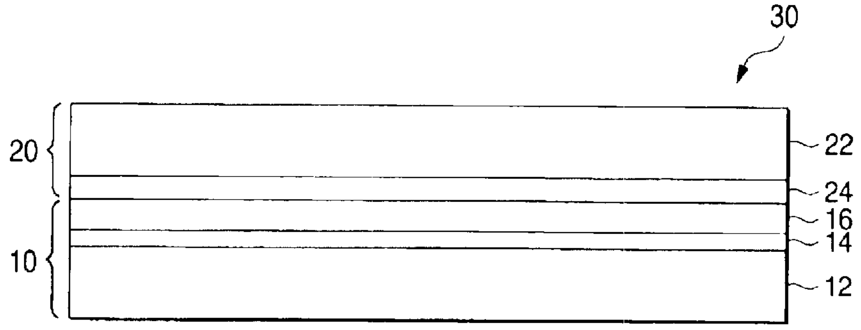
FIGS. 1-(*a*), 1-(*b*) and 1-(*c*) are a drawings showing the outline of the scheme of multicolor image-forming by membrane heat transfer by irradiation with a laser.

1: Recording unit
2: Recording head
3: By-scan rail
4: Recording drum
5: Thermal transfer sheet-loading unit
6: Image-receiving sheet roll
7: Carrier roller
8: Squeeze roller
9: Cutter
10: Thermal transfer sheet
10K, 10C, 10M, 10Y: Thermal transfer sheet rolls
12: Support
14: Photothermal converting layer
16: Image-forming layer
20: Image-receiving sheet
22: Support for image-receiving sheet
24: Image-receiving layer
30: Laminate
31: Discharge platform
32: Discard port
33: Discharge port
34: Air
35: Discard box
42: Actual paper
43: Heat roller
44: Insert platform
45: Mark showing the position of placement
46: Insert roller
47: Guide made of heat resisting sheet
48: Releasing claw
49: Guide plate
50: Discharge port

DETAILED DESCRIPTION OF THE INVENTION

As a result of eager investigation to provide a B2/A2 or larger, further, a B1/A1 or larger sized high grade DDCP which is highly stable and excellent in coincidence in printing, the present inventors have developed a heat transfer recording system by laser irradiation for DDCP which comprises an image-forming material of a B2 size or larger having performances of transfer to actual printing paper, reproduction of actual dots and of a pigment type, and output driver and high grade CMS software.

The characteristics of the heat transfer recording system by laser irradiation which has been developed by the present inventors, the constitution of the system and the outline of technical points are as follows. As the characteristics of performances, (1) since the dot shapes are sharp, dots which are excellent in approximation to printed matters can be reproduced, (2) the approximation of hue to printed matters is good, and (3) since the recorded quality is hardly influenced by the surrounding temperature and humidity and repeating reproducibility is good, a stable proof can be formed. The technical points of the material capable of obtaining such characteristics of performances are the establishment of the technique of membrane transfer, and the improvement of the retentivity of vacuum adhesion of the material required of a laser heat transfer system, following up of high definition recording, and the improvement of heat resistance. Specifically, (1) thinning of a photothermal converting layer by the introduction of an infrared absorbing dye, (2) strengthening of the heat resistance of a photothermal converting layer by the introduction of a polymer having a high Tg, (3) stabilization of hue by the introduction of a heat resisting pigment, (4) control of the adhesive strength and the cohesive strength of the material by the addition of low molecular weight components, such as a wax and an inorganic pigment, and (5) the provision of vacuum adhesion property to the material not being accompanied by the deterioration of an image quality by the addition of a matting agent to a photothermal converting layer, can be exemplified. As the technical points of the system, (1) carrying by air for continuous accumulation of multi sheets of films in a recording unit, (2) insert of a heat transfer unit on an actual paper for reducing curling after transfer, and (3) connection of output driver of a wide use having system connecting expendability, can be exemplified. The laser irradiation heat transfer recording system developed by the present inventors consists of diverse characteristics of performances, system constitution and technical points as described above, but these are exemplifications and the present invention is not limited thereto.

The present inventors have performed development on the basis of thoughts that individual material, each coating layer such as a photothermal converting layer, an image-forming layer and an image-receiving layer, and each thermal transfer sheet and image-receiving sheet are not present individually separately but they must function organically and synthetically, further these image-forming materials exhibit the highest possible performances when combined with a recording unit and a heat transfer unit. The present inventors sufficiently examined each coating layer and the constituting materials of the image-forming material and prepared coating layers which brought out the best of their characteristics to make the image-forming material, and found proper ranges of various physical properties so that the image-forming material could exhibit the best performance. As a result, a high performance image-forming material could be found unexpectedly by thoroughly investigating the relationships between each material, each coating layer and each sheet and the physical properties, and functioning the image-forming material organically and synthetically with the recording unit and the heat transfer unit. The positioning of the present invention in the system developed by the present inventors is thus important, which prescribes that the ratio of the reflection optical density ($OD_r$) of the image-forming layer to the layer thickness, $OD_r$/layer thickness ($\mu$m unit) should be 1.50 or more, the contact angle with water of the image-forming layer and that of the image-receiving layer be from 7.0 to 120.0°, preferably the characteristics of both layers should be brought to close to each other such that the difference between the contact angle with water of the image-forming layer and that of the image-receiving layer is 73° or less, the binders contained in the image-forming layer and the image-receiving layer should be in definite relationship, the image-forming layer and the image-receiving layer should contain a surface tension decreasing agent and a wax having a melting point of 100° C. or less, and further the image-forming layer should contain a rosin-based resin.

In the multicolor image-forming material according to the present invention, the ratio of the reflection optical density ($OD_r$) of the image-forming layer in each thermal transfer sheet to the layer thickness, $OD_r$/layer thickness ($\mu$m unit) should be 1.50 or more, preferably 1.80 or more, and more preferably 2.50 or more. The upper limit of $OD_r$/layer thickness is not particularly restricted but the limit is 6 or so at the present point of time taking the balance with other characteristics into consideration.

$OD_r$/layer thickness is a barometer of the transfer density of the image-forming layer and the transferred image. By restricting $OD_r$/layer thickness within the above range, an image having high transfer density and good definition can be obtained. Further, by thinning the image-forming layer, the hue reproduction can be improved.

$OD_r$ is the reflection optical density obtained by transferring the image, which has been transferred from a thermal transfer sheet to an image-receiving sheet, further to Tokuryo art paper, and measuring by color mode of each color such as yellow (Y), magenta (M), cyan (C) or black (K) with a densitometer (X-rite 938, manufactured by X-rite Co.). $OD_r$ is preferably from 0.5 to 3.0, more preferably from 0.8 to 2.0.

In the multicolor image-forming material according to the present invention, $OD_r$/layer thickness is restricted to 1.50 or more, and at the same time the contact angle with water of the image-forming layer in each thermal transfer sheet and the image-receiving layer in the image-receiving sheet is restricted to 7.0 to 120.0°. With the above range of the contact angle with water, sufficient adhesion can be obtained at image forming and sharp dot shapes can be obtained, which makes it possible to reproduce excellent dots according to image data. Further, a proof free of a defect can be formed without causing transfer failure when an image is transferred to an actual printing paper. Regarding the above point, the contact angle with water of the image-forming layer and the image-receiving layer is preferably from 30 to 100.0°, and the contact angle with water of the image-receiving layer is more preferably 86° or less.

The contact angle with water of each layer surface in the present invention is the value obtained by measuring with a contact angle meter CA-A model (manufactured by Kyowa Kaimen Kagaku Co., Ltd.).

In one embodiment of the present invention, an image-forming layer and an image-receiving layer are formed so that the difference between the contact angle with water of the image-forming layer and that of the image-receiving layer is 73° or less. When the difference in the contact angle with water of both layers is within this range, the compatibility of the image-forming layer with the image-receiving layer becomes good and heat adhesion is improved, thus transfer sensitivity is improved. The smaller the difference in the contact angle, the better is the compatibility, therefore, the difference in the contact angle with water of the image-forming layer and the image-receiving layer is generally 73° or less, preferably 65° or less, more preferably 50° or less, and particularly preferably 30° or less.

Various kinds of polymers can be used as the binder in the image-forming layer and the image-receiving layer as described later, but in one embodiment of the present invention, at least one monomer unit constituting the binder for use in the image-forming layer and at least one monomer unit constituting the binder for use in the image-receiving layer are the same. By making the monomer unit which constitutes the binder the same in the image-forming layer and the image-receiving layer, the adhesion of the image-forming layer and the image-receiving layer at laser transfer recording can be increased, thereby recording sensitivity, image quality and transferability to an actual paper can be improved.

Vinyl acetal, styrene, butyral, and styrene acrylate can be exemplified as preferred monomer units which are particularly excellent in sensitivity and transferability to an actual paper. Vinyl acetal, styrene, butyral, and styrene acrylate are particularly preferred above all. Polymers of these monomer units alone or copolymers with other units are preferably used as the binders, e.g., polyvinyl butyral-based and polystyrene-based resins and vinyl chloride-vinyl acetate copolymers can be exemplified as such polymers.

In one embodiment of the present invention, at least one layer of coating layers of the light-to-heat converting layer and the image-forming layer in the thermal transfer sheet and the image-receiving layer in the image-receiving sheet contains a surface tension decreasing agent. This embodiment of the present invention plays an important role in the system developed by the present inventors to conspicuously improve the coating aptitude of the coating solutions of the photothermal converting layer, the image-forming layer and the image-receiving layer and contribute to the thinning and uniformalization of each layer.

The surface tension decreasing agent in the present invention has the function of, when contained in the coating solutions of the photothermal converting layer, the image-forming layer and the image-receiving layer, decreasing the surface tension of the coating solutions and improving the wetting property of the coating solutions to the support to thereby get rid of coating failures such as repellency and dents, which results in thinning and uniformalization of each layer and increasing a recording area. The representative examples of surface tension decreasing agents include fluorine-based surfactants, silicon-based surfactants and hydrocarbon-based surfactants, and fluorine-based surfactants are preferably used of them.

Surfactants having molecular structure substituted with F in place of H bonded to C of a lipophilic group are called fluorine-based surfactants in the present invention. Fluorine-based surfactants consist of the moieties of a fluoroalkyl group, a solvent-philic group and a hydrophilic group, and those having a solvent-philic group show a surface tension decreasing property to solvents other than water.

As the fluoroalkyl group, a fluoroalkyl group having from 7 to 9 carbon atoms is preferred. As the solvent-philic group, an alkyl group is preferred. As the hydrophilic group, a carboxyl group and a sulfonate group are preferred.

In one embodiment of the present invention, the surface tension decreasing agent is a surface tension decreasing agent which makes, when contained in each solvent of 1-propanol, methyl ethyl ketone and N-methyl-2-pyrrolidone in concentration of 0.5 mass %, the surface tension of 1-propanol 22.5 mN/m or less, and that of methyl ethyl ketone 22.5 mN/m or less, and that of N-methyl-2-pyrrolidone 25.0 mN/m or less.

In one embodiment of the present invention, the surface tension decreasing agent is a perfluoroalkylpolyoxyalkylene oligomer.

The specific examples of the fluorine-based surfactants include Megafac series (e.g., Megafac F177, F176, F113 and F178K, manufactured by Dainippon Chemicals and Ink Co., Ltd.), Sarfron series (e.g., S111, S121 and S131, manufactured by Asahi Glass Co., Ltd.), and Florard series (e.g., FC93, FC135 and FC430, manufactured by Sumitomo 3M Limited).

The addition amount of the surface tension decreasing agent to each layer can be arbitrarily selected according to the surrounding conditions, such as the temperature and humidity and the conditions of the systems to be applied, but the addition amount to the photothermal converting layer in the thermal transfer sheet is preferably from 0.00001 to 2 mass % of the entire amount of the photothermal converting layer coating solution, to the image-forming layer is preferably from 0.00001 to 2 mass % of the entire amount of the image-forming layer coating solution, and to the image-receiving layer is preferably from 0.00001 to 2 mass % of the entire amount of the image-receiving layer coating solution.

In one embodiment of the present invention, two or more kinds of waxes having a melting point of 100° C. or less are contained in any coating layer in the thermal transfer sheet and the image-receiving sheet. This embodiment of the present invention which prescribes the waxes to be used in each coating layer of the photothermal converting layer, the image-forming layer and the image-receiving layer plays an important role in the system developed by the present inventors to improve transfer sensitivity.

These waxes are organic compounds having alkyl group which are solid or semisolid at normal temperature (the waxes melt at the temperature range of from normal temperature to about 150° C. and have low melt viscosity), and the various compounds described later in the item of wax can be used in the present invention. The melting point of these waxes is preferably from 30 to 200° C., more preferably from 40 to 100° C. The addition amount of the waxes to the image-forming layer and the image-receiving layer is preferably from 0.5 to 50 mass % of the entire mass of the layer, more preferably from 5 to 30 mass %. When waxes are added to the layers other than the image-forming layer and the image-receiving layer, the amount is preferably from 0.5 to 30 mass % of the entire mass of the layer, more preferably from 1 to 15 mass %. The effect of these waxes is that they are easily melted when heat is conducted to the image-forming layer and the image-receiving layer, and can enhance the adhesion of the image-forming layer and the image-receiving layer. When the waxes are added to the image-forming layer, breaking of the image-forming layer at high temperature can be suppressed, thereby unevenness of an image can be prevented from occurring and further transfer sensitivity can be improved. On the other hand when they are added to the photothermal converting layer, the separating force from the image-forming layer can be controlled and definition can be increased.

In one embodiment of the present invention, as the two or more kinds of waxes, two or more fatty acid amides are preferably used, and as the two or more fatty acid amides, the combination of the fatty acid amide in which the fatty acid moiety is a saturated fatty acid and the fatty acid amide in which the fatty acid moiety is an unsaturated fatty acid is preferably used.

As the effects of using two or more waxes are that the melting point can be lowered and the above effects can be more exhibited as compared with the case of using alone, and crystallization can be prevented, as a result a hardware, an image-forming unit, can be prevented from being contaminated.

In one embodiment of the present invention, acrylate and methacrylate are contained in each coating layer. They are compounds which are liquid at normal temperature. As the specific examples of them, acrylate compounds described later in the item of plasticizer can be exemplified. The addition amount of them to each coating layer of the image-forming layer and the image-receiving layer is preferably from 0.5 to 20 mass % based on the entire mass of the layer to be added to, more preferably from 1 to 10 mass %. When they are added to other layers, the amount is preferably from 0.5 to 20 mass % based on the entire mass of the layer to be added to, more preferably from 1 to 10 mass %. The effects of the addition of acrylate and methacrylate are to improve the breaking elongation of the image-forming layer, thereby unevenness of an image can be prevented from occurring, and to lower Tg of the image-forming layer to thereby effect transfer even with less heat, thus sensitivity can be improved. Further, in one embodiment of the present invention, any coating layer in the thermal transfer sheet and the image-receiving sheet contains a monomer represented by the formula (1) or a homo- or copolymer containing the monomer as the main component.

In one embodiment of the present invention, the image-forming layer in the thermal transfer sheet contains a rosin-based resin having a softening point of 100° C. or less measured by a ring and ball method, preferably from 80 to 90° C., and an acid value of from 2 to 220 measured according to JIS K3504, preferably from 11 to 180, and more preferably from 160 to 180. A softening point measured by ring and ball method can be measured according to JIS K2207, K7234.

By adding the rosin-based resin having the above physical properties to the image-forming layer, the rosin-based resin functions as an excellent adhesive agent, and so the image formed on the image-forming layer in the thermal transfer sheet can be easily transferred to the image-receiving sheet with good definition.

When the melting point of the rosin-based resin exceeds 100° C., the melting point of the image-forming layer itself increases, which results in the reduction of sensitivity, the deterioration of transfer to an actual paper, and the above effect cannot be exhibited. Further, when the acid value is less than 11, the transfer to an actual paper is deteriorated and also the above effect cannot be exhibited.

As the rosin-based resin, a rosin, a hydrogenated rosin, a modified rosin, derivatives of these rosins (esterified products), and a rosin-modified maleic acid resin can be exemplified. As the rhodinic acid constituting the rosin-based resin, either an abietic acid type or a pimaric acid type can be used. Resins containing 30 mass % or more of an abietic acid type rhodinic acid are preferably used, and a rosin containing 30 mass % or more of an abietic acid type rhodinic acid, and the esterified products of the rosin and at least one kind of polyhydric alcohol selected from ethylene glycol, glycerol and pentaerythritol are more preferably used.

The specific examples of the abietic acid type rhodinic acids include an abietic acid, a neoabietic acid, a palustric acid, a dihydroabietic acid, and a dehydroabietic acid.

The rosin-based resin is preferably added to the image-forming layer in an amount of from 5 to 40 mass %, more preferably from 10 to 20 mass %.

Styrene-maleic acid copolymer resins may be used in combination with the rosin-based resin in the above range of the use amount.

In one embodiment of the present invention, the image-receiving layer in the image-receiving sheet contains a rosin-based resin having a softening point of less than 130° C. measured by a ring and ball method, preferably from 80 to 90° C., and an acid value of from 2 to 250 measured according to JIS K3504, preferably from 10 to 250, and more preferably from 160 to 180.

By adding the rosin-based resin having the above physical properties to the image-receiving layer, the rosin-based resin functions as an excellent adhesive agent, and so the image formed on the image-forming layer in the thermal transfer sheet can be easily transferred to the image-receiving sheet with good definition.

When the melting point of the rosin-based resin exceeds 130° C., the melting point of the image-forming layer itself increases, which results in the reduction of sensitivity, the deterioration of transfer to an actual paper, and the above effect cannot be exhibited. Further, when the acid value is less than 10, the transfer to an actual paper is deteriorated and also the above effect cannot be exhibited.

As the rosin-based resin to be added to the image-receiving layer, a rosin, a hydrogenated rosin, a modified rosin, derivatives of these rosins (esterified products), and a rosin-modified maleic acid resin can be exemplified. As the rhodinic acid constituting the rosin-based resin, either an abietic acid type or a pimaric acid type can be used. A rosin containing 30 mass % or more of an abietic acid type rhodinic acid, and the esterified products of the rosin and at least one kind of polyhydric alcohol selected from ethylene glycol, glycerol and pentaerythritol are preferably used.

The specific examples of the abietic acid type rhodinic acids include an abietic acid, a neoabietic acid, a palustric acid, a dihydroabietic acid, and a dehydroabietic acid.

The rosin-based resin is preferably added to the image-receiving layer in an amount of from 5 to 40 mass %, more preferably from 10 to 20 mass %.

Styrene-maleic acid copolymer resins may be used in combination with the rosin-based resin in the above range of the use amount.

The rosin-based resin may be used in either one, or both of the thermal transfer sheet and the image-receiving sheet.

In the present invention, the ratio of the optical density ($OD_{LH}$) of the photothermal converting layer in the thermal transfer sheet to the layer thickness of the photothermal converting layer, $OD_{LH}$/layer thickness (μm unit) is preferably 4.36 or more. The upper limit of $OD_{LH}$/layer thickness is not particularly restricted and, the larger the more preferred, but the limit is 10 or so at the present point of time taking the balance with other characteristics into consideration.

In the present invention, $OD_{LH}$ of the thermal transfer sheet means the absorbance of the photothermal converting layer at peak wavelength of the laser beams to be used when the image-forming material of the present invention is subjected to recording and can be measured with well-known spectrophotometers. UV-spectrophotometer UV-240 (manufactured by Shimadzu Seisakusho Co. Ltd.) was used in the present invention. The $OD_{LH}$ value obtained by subtracting the optical density of the support alone from the optical density including the support is taken as the above optical density.

$OD_{LH}$/layer thickness concerns a heat conducting property at recording and which is a barometer largely affecting sensitivity and the temperature and humidity dependency of recording. By restricting $OD_{LH}$/layer thickness within the above range in the present invention, the image density required of a printing proof can be easily obtained and, at the same time, the thickness of the image-forming layer can be thinned, the transfer to the image-receiving layer can be performed efficiently, transfer sensitivity can be increased, dot shape can be made sharp, and excellent dots can be reproduced corresponding to image data. Further, as the photothermal converting layer can be made thinner, the influence of the surrounding temperature and humidity can be decreased to the utmost, which results in good repeating reproduction of images and stable proofs can be formed.

Further, by setting $OD_{LH}$/layer thickness high, an image can be recorded to obtain a transferred image having definition of preferably 2,400 dpi or more, more preferably 2,600 dpi or more, with the recording area of a size of preferably 515 mm×728 mm or more, more preferably 594 mm×841 mm or more.

In the present invention, as described above, the recording area of the multicolor image of the thermal transfer sheet can be made a size of preferably 515 mm×728 mm or more, more preferably 594 mm×841 mm or more.

The size of the image-receiving sheet is preferably smaller than the size of the thermal transfer sheet by 0.5 cm or more on every side, more preferably by 1 cm or more. To arrange the thermal transfer sheet on a drum having suction holes with the image-receiving sheet being underside and to suck the thermal transfer sheet onto the drum, the image-receiving sheet preferably has the above size.

In the next place, the system at large developed by the present inventors will be described below together with the content of the present invention. In the system of the present invention, high definition and high image quality have been attained by inventing and adopting a membrane heat transfer system. The system of the present invention is capable of obtaining a transferred image having definition of 2,400 dip or more, preferably 2,600 dip or more. The heat transfer system by membrane is a system of transferring a thin image-forming layer having a layer thickness of from 0.01 to 0.9 $\mu$m to an image-receiving sheet in the state of partially not melting or hardly melting. That is, since the recorded part is transferred as a membrane, an extremely high definition image can be obtained. A preferred method of efficiently performing membrane heat transfer is to deform the inside of the photothermal converting layer to a dome-like form by photo-recording, push up the image-forming layer, to thereby enhance the adhesion of the image-forming layer and the image-receiving layer to make transferring easy. When the deformation is large, transferring becomes easy, since the force of pressing the image-forming layer against the image-receiving layer is great. While when the deformation is small, sufficient transferring cannot be effected in part, since the force of pressing the image-forming layer against the image-receiving layer is small. Deformation preferred for the membrane transfer can be observed by a laser microscope (VK8500, manufactured by Keyence Corporation), and the size of deformation can be evaluated by a deformation factor obtained by dividing [increased cross-sectional area of the recording area of the photothermal converting layer after photo-recording (a) plus cross-sectional area of the recording area of the photothermal converting layer before photo-recording (b)] by [cross-sectional area of the recording area of the photothermal converting layer before photo-recording (b)] and multiplying 100. That is, deformation factor=$[(a+b)/(b)]\times 100$. The deformation factor is generally 110% or more, preferably 125% or more, and more preferably 150% or more. The deformation factor may be greater than 250% when the breaking elongation is made great but it is preferred to restrict the deformation factor to about 250%.

The technical points of the image-forming material in membrane transfer are as follows.

1. Compatibility of High Heat Responsibility and Storage Stability

For obtaining high image quality, transferring of a membrane of submicron order is necessary, but for obtaining desired density, it is necessary to forma layer having dispersed therein a pigment in high concentration, which is reciprocal to heat responsibility. Heat responsibility is also in the relationship reciprocal to storage stability (adhesion). By the development of novel polymer-additive, this reciprocal relationship has been solved.

2. Security of High Vacuum Adhesion

In membrane transfer pursuing high definition, the interface of transfer is preferably smooth, by which, however, sufficient vacuum adhesion cannot be obtained. Vacuum adhesion could be obtained by adding a little much amount of a matting agent having a relatively small particle size to the under layer of the image-forming layer, departing from general knowledge of obtaining vacuum adhesion, with maintaining proper gap uniform between the thermal transfer sheet and the image-receiving sheet, without causing image dropout and securing the characteristics of membrane transfer.

3. Use of Heat Resisting Organic Material

A photothermal converting layer which converts laser beam to heat at laser recording attains the temperature of about 700° C. and an image-forming layer containing pigment materials reaches about 500° C. The present inventors have developed, as the material of a photothermal converting layer, modified polyimide capable of coating with an organic solvent, and at the same time pigments which are higher heat resisting than pigments for printing, safe and coincident in hue, as the pigment materials.

4. Security of Surface Cleanliness

In membrane transfer, dust between a thermal transfer sheet and an image-receiving sheet causes an image defect, which is a serious problem. Dust is coming from the outside of the apparatus, or is generated by cutting of materials, therefore dust cannot be excluded by only material control, and it is necessary that apparatus must be provided with a dust removing device. We found a material capable of maintaining appropriate viscosity and capable of cleaning the surface of a transfer material and realized the removal of dust by changing the material of the transfer roller without reducing the productivity.

In the next place, the system at large of the present invention will be described in detail below.

The present invention has realized a heat transfer image having sharp dots and transferring of an image to actual printing paper of a recording size of B2 size or larger (515 mm×728 mm or more). More preferably, B2 size is 543 mm×765 mm, and recording on this size or larger is possible according to the present invention.

One characteristic of the performances of the system of the present invention is that sharp dot shape can be obtained. A heat transfer image obtained by this system is a dot image corresponding to print line number of definition of 2,400 dpi or more. Since individual dot obtained according to this system is very sharp and almost free of blur and chip, dots of a wide range from highlight to shadow can be clearly formed. As a result, output of dots of high grade having the same definition as obtained by an image setter and a CTP setter is possible, and dots and gradation which are excellent in approximation to the printed matter can be reproduced.

The second characteristic of the performances of the system of the present invention is that repeating reproducibility is good. Since a heat transfer image obtained by this system is sharp in dot shape, dots corresponding to laser beam can be faithfully reproduced, further recording characteristics are hardly influenced by the surrounding temperature and humidity, repeating reproducibility stable in hue and density can be obtained under wide temperature humidity conditions.

The third characteristic of the performances of the system of the present invention is that color reproduction is good. A heat transfer image obtained by this system is formed with coloring pigments used in printing inks and since excellent in repeating reproducibility, highly minute CMS (color management system) can be realized.

The heat transfer image by the system of the present invention almost coincides with the hues of Japan color and SWOP color, i.e., the hues of printed matters, and the colors appear similarly to the printed matters even when light sources of illumination are changed, such as a fluorescent lamp, an incandescent lamp.

The fourth characteristic of the performances of the system of the present invention is that the quality of a character is good. Since a heat transfer image obtained by this system is sharp in dot shape, the fine line of a fine character can be reproduced sharply.

The characteristic technical points of the materials for use in the system of the present invention are further described in detail below. As the heat transfer methods for DDCP, there are (1) a sublimation method, (2) an ablation method, and (3) a heat fusion method. Methods (1) and (2) are systems using sublimation or sputtering, and the outline of a dot becomes fuzzy. In method (3), since a molten substance flows, the outline of a dot is not also clear. On the basis of a membrane transfer technique, the present inventors incorporated the following techniques to the system of the present invention for solving the new problems in laser transfer systems and obtaining further high image quality. The first characteristic of the technique of the materials is sharpening of dot shape. Image recording is performed by converting laser beams to heat in a photothermal converting layer and conducting the heat to the image-forming layer contiguous to the photothermal converting layer, and adhering the image-forming layer to an image-receiving layer. For sharpening dot shape, heat generated by laser beams should not be diffused in the surface direction but be conducted to the transfer interface, and the image-forming layer rupture sharply at interface of heating area/non-heating area. The thickness of the photothermal converting layer in the thermal transfer sheet is thinned and dynamic properties of the image-forming layer are controlled for this purpose.

The first technique of sharpening of dot shape is thinning of the photothermal converting layer. The photothermal converting layer is presumed from simulation to reach about 700° C. in a moment, and a thin film is liable to be deformed and ruptured. When deformation and rupturing occur, the photothermal converting layer is transferred to the image-receiving layer together with the image-forming layer or a transferred image becomes uneven. On the other hand, a light-to-heat converting material must be present in the photothermal converting layer in high concentration for obtaining a desired temperature, which results in a problem of precipitation of the light-to-heat converting material or migration of the material to the contiguous layer. Carbon black has been conventionally used in many cases as the light-to-heat converting material, but an infrared absorbing dye is used as the light-to-heat converting material in the present invention which can save the use amount as compared with carbon black. Polyimide compounds having sufficient dynamic strength even at high temperature and high retentivity of an infrared absorbing dye were introduced as the binder.

In this manner, it is preferred to make thin the photothermal converting layer up to about 0.5 μm or less by selecting an infrared absorbing dye excellent in light-to-heat converting property and a heat-resisting binder such as polyimide compounds.

The second technique of sharpening of dot shape is the improvement of the characteristics of an image-forming layer. When a photothermal converting layer is deformed or an image-forming layer itself is deformed due to high temperature, thickness unevenness is caused in an image-forming layer transferred to an image-receiving layer corresponding to the by-scanning pattern of laser beams, as a result the image becomes uneven and apparent transfer density is reduced. The thinner the thickness of an image-forming layer, the more conspicuous is this tendency. On the other hand, when the thickness of an image-forming layer is thick, dot sharpness is impaired and sensitivity decreases.

To reconcile these reciprocal properties, it is preferred to improve transfer unevenness by adding a low melting point material to an image-forming layer, e.g., a wax. Transfer unevenness can be improved with maintaining dot sharpness and sensitivity by adding inorganic fine particles in place of a binder to adjust the layer thickness of an image-forming layer properly so that the image-forming layer ruptures sharply at interface of heating area/non-heating area.

In general, materials having a low melting point, such as a wax, are liable to ooze to the surface of an image-forming layer or to be crystallized and cause a problem in image quality and the aging stability of a thermal transfer sheet in some cases.

To cope with this problem, it is preferred to use a low melting point material having no great difference from the polymer of an image-forming layer in an SP value, by which the compatibility with the polymer can be increased and the separation of the low melting point material from the image-forming layer can be prevented. It is also preferred to mix several kinds of low melting point materials to prevent crystallization by eutectic mixture. As a result, an image showing a sharp dot shape and free of unevenness can be obtained.

The second characteristic of the technique of the materials is that the present inventors have found that recording sensitivity has temperature humidity dependency. The dynamic properties and thermal physical properties of the coated layers of a thermal transfer sheet are generally varied by absorbing moisture and the humidity dependency of recording condition is caused.

For reducing the temperature-humidity dependency, it is preferred that the dye/binder system of a photothermal converting layer and the binder system of an image-forming layer are organic solvents. Further, it is preferred to use polyvinyl butyral as the binder of an image-receiving layer and to introduce a hydrophobitization technique of polymers for the purpose of lowering water absorption properties of polymers. As the hydrophobitization technique of polymers, the technique of reacting a hydroxyl group with a hydrophobic group, or crosslinking two or more hydroxyl groups with a hardening agent as disclosed in JP-A-8-238858 can be exemplified.

The third characteristic of the technique of the materials is the improvement of the approximation of hue to the printed matter. In addition to color matching of pigments by thermal head system color proof (First Proof, manufactured by Fuji Photo Film Co., Ltd.) and the technique of stable dispersion, a problem newly occurred in the laser heat transfer system was solved. That is, technique 1 of the improvement of the approximation of hue to the printed matter is to use a highly heat resisting pigment. About 500° C. or more heat is also generally applied to an image-forming layer by laser exposure imaging, and so some of conventionally used pigments are heat-decomposed, but this problem can be prevented by using highly heat resisting pigments in an image-forming layer.

Technique 2 of the improvement of the approximation of hue to the printed matter is the diffusion prevention of an infrared absorbing material. For preventing the variation of hue due to migration of an infrared absorbing dye from a photothermal converting layer to an image-forming layer by high heat at exposure, it is preferred to design a photothermal converting layer by combination of an infrared absorbing dye having high retentivity and a binder as described above.

The fourth characteristic of the technique of the materials is to increase sensitivity. Shortage of energy generally occurs in high speed printing and, in particular, time lag is caused in intervals of laser by-scanning and gaps are generated. As described above, using a dye of high concentration in a photothermal converting layer and thinning of a photothermal converting layer and an image-forming layer can improve the efficiency of generation and conduction of heat. It is also preferred to add a low melting point material to an image-forming layer for the purpose of slightly fluidizing the image-forming layer at heating to thereby fill the gaps and improving the adhesion with the image-receiving layer. Further, for enhancing the adhesion of the image-receiving layer and the image-forming layer and sufficiently strengthening a transferred image, it is preferred to use the same polyvinyl butyral as used in the image-forming layer as the binder in the image-receiving layer.

The fifth characteristic of the technique of the materials is the improvement of vacuum adhesion. It is preferred that an image-receiving sheet and a thermal transfer sheet are retained on a drum by vacuum adhesion. Since an image is formed by the adhesion control of both sheets, image transfer behavior is very sensitive to the clearance between the image-receiving layer surface in an image-receiving sheet and the image-forming layer surface in a transfer sheet, hence vacuum adhesion is important. If the clearance between the materials is widened with foreign matter, e.g., dust, as a cue, image defect and image transfer unevenness come to occur.

For preventing such image defect and image transfer unevenness, it is preferred to give uniform unevenness to a thermal transfer sheet to thereby improve the air passage, to obtain uniform clearance.

Technique 1 of the improvement of vacuum adhesion is the provision of unevenness to the surface of a thermal transfer sheet. For obtaining sufficient effect of vacuum adhesion even in superposed printing of two or more colors, unevenness is provided to a thermal transfer sheet. For providing uneven-ness to a thermal transfer sheet, a method of post treatment such as embossing treatment and a method of the addition of a matting agent to the coating layer are generally used, but in view of the simplification of manufacturing process and stabilization of materials with the lapse of time, the addition of a matting agent is preferred. The particle size of a matting agent must be larger than the thickness of the coating layer. When a matting layer is added to an image-forming layer, there arises a problem of coming out of the image of the part where the matting layer is present, accordingly, it is preferred to add a matting agent having an optimal particle size to the photothermal converting layer, thereby the layer thickness of the image-forming layer itself becomes almost uniform and an image free of defect can be obtained on the image-receiving sheet.

The characteristics of the technique of systematization of the system of the present invention are described below. The first characteristic of the technique of systematization is the constitution of a recording unit. For surely reproducing sharp dots as described above, highly precise design is required also for a recording unit. The recording unit for use in the system of the present invention is the same as conventionally used recording units for laser heat transfer in fundamental constitution. The constitution is a so-called heat mode outer drum recording system and recording is performed such that a recording head provided with a plurality of high power lasers emit laser rays on a thermal transfer sheet and an image-receiving sheet fixed on a drum. Preferred embodiments are as follows.

Constitution 1 of a recording unit is to prevent mixing of dust. Feeding of an image-receiving sheet and a thermal transfer sheet is performed by full automatic roll feeding. Mixture of dusts generated from the human body cannot be helped by sheet feeding of a small number, thus roll feeding is adopted.

Since thermal transfer sheet comprises four colors each one roll, a roll of each color is switched to another by a rotating loading unit. Each film is cut to a prescribed length by a cutter during loading and fixed on a drum.

Constitution 2 of a recording unit is to enhance the adhesion of an image-receiving sheet and a thermal transfer sheet on a recording drum. The adhesion of an image-receiving sheet and a thermal transfer sheet on a recording drum is performed by vacuum adhesion, since the adhesion of an image-receiving sheet and a thermal transfer sheet cannot be strengthened by mechanical fixing. Many vacuum suction holes are formed on a recording drum, and a sheet is sucked by a drum by reducing the pressure in a drum with a blower or a decompression pump. Since a thermal transfer sheet is further sucked over the sucked image-receiving sheet, the size of the thermal transfer sheet is made larger than the size of the image-receiving sheet. The air between the thermal transfer sheet and the image-receiving sheet which most affects recording performance is sucked from the area outside of the image-receiving sheet where the thermal transfer sheet is alone.

Constitution 3 of a recording unit is stable accumulation of multi sheets of films on a discharge platform. In the apparatus of the present invention, a large number of sheets of B2 size or larger can be accumulated on the discharge platform. When sheet B is discharged on the image-receiving layer of the already accumulated heat-adhesive film A, sometimes both cling to each other. When the previous sheet clings to the previous of the previous sheet, the next sheet cannot be discharged correctly, which leads to the problem of jamming. For preventing clinging, the prevention of the contact of film A and film B is the best. Some means are known as the contact preventing method, e.g., (a) a method of making difference in discharge platform level to make a gap between films by making film shape not plane, (b) a method of providing a discharge port at higher position than a discharge platform and dropping a discharged film, and (c) a method of floating the film discharged later by blasting air between two films. In the system of the present invention, as the sheet size is very big (B2), the structures of the units are large scaled when methods (a) and (b) are used, hence, (c) a method of floating the film discharged later by blasting air between two films is adopted.

Figure 2:
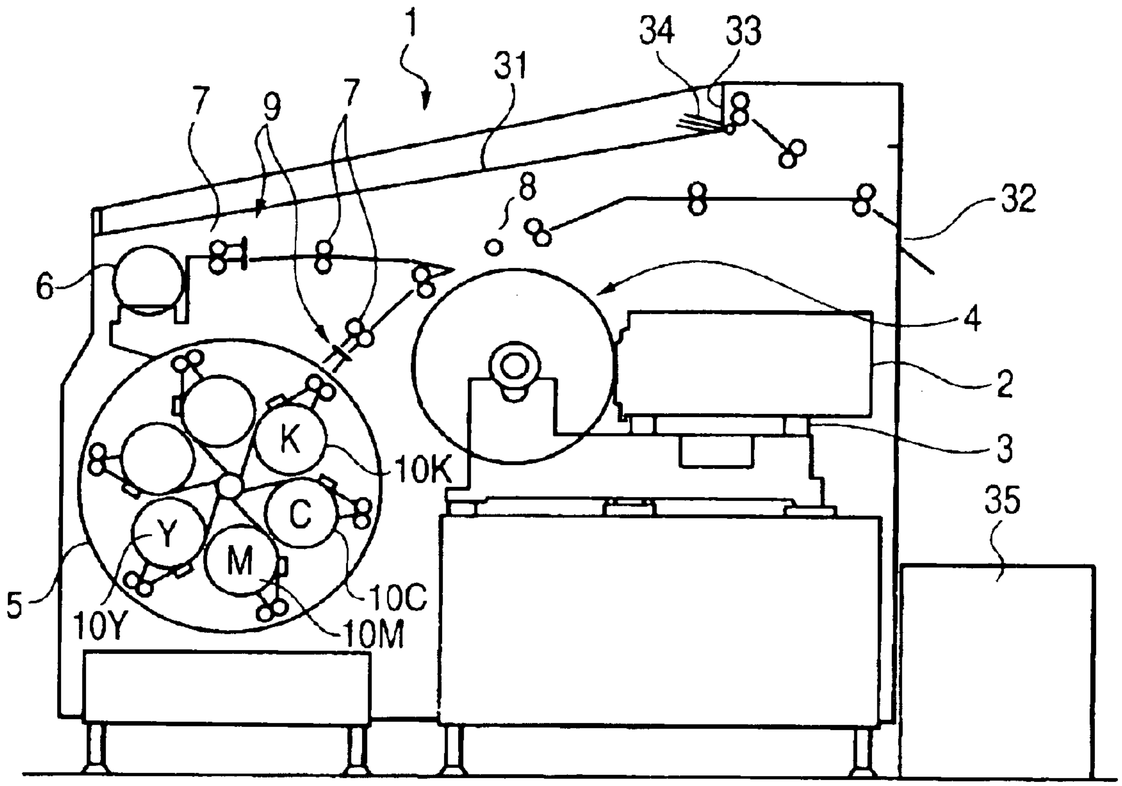
FIG. 2 is a drawing showing an example of constitution of a recording unit for laser heat transfer.

An example of the constitution of the apparatus of the present invention is shown in FIG. 2.

The sequence of forming a full color image by applying an image-forming material to the apparatus of the present invention (hereinafter referred to as image-forming sequence of the system of the present invention) is described below.

1) By-scan axis of recording head 2 of recording unit 1 is reset by by-scan rail 3, main scan rotation axis of recording drum 4 and thermal transfer sheet loading unit 5 are respectively reset at origin.
2) Image-receiving sheet roll 6 is unrolled by carrier roller 7, and the tip of the image-receiving roll is fixed on recording drum 4 by vacuum suction via suction holes provided on the recording drum.
3) Squeeze roller 8 comes down on recording drum 4 and presses the image-receiving sheet, and when the prescribed amount of the image-receiving sheet is conveyed by the rotation of the drum, the sheet is stopped and cut by cutter 9 in a prescribed length.
4) Recording drum 4 further makes a round, thus the loading of the image-receiving sheet is finished.
5) In the next place, in the same sequence as the image-receiving sheet, thermal transfer sheet K of the first color, black, is drawn out from thermal transfer sheet roll 10K, cut and loaded.
6) Recording drum 4 starts high speed rotation, recording head 2 on by-scan rail 3 starts to move and when reaches the start position of recording, recording laser is emitted on recording drum 4 by recording head 2 according to recording signals. Irradiation is finished at finishing position of recording, operation of by-scan rail and drum rotation are finished. The recording head on the by-scan rail is reset.
7) Only thermal transfer sheet K is released with the image-receiving sheet remaining on the recording drum. For the releasing, the tip of thermal transfer sheet K is caught by the claw, pulled out in the discharge direction, and discarded from discard port 32 to discard box 35.
8) The procedures of 5) to 7) are repeated for the remaining three colors. Recording is performed in the order of black, cyan, magenta and yellow. That is, thermal transfer sheet C of the second color, cyan, is drawn out from thermal transfer sheet roll 10C, thermal transfer sheet M of the third color, magenta, is from thermal transfer sheet roll 10M, and thermal transfer sheet Y of the fourth color, yellow, is from thermal transfer sheet roll 10Y in order. This is the inverse of general printing order, since the order of the colors on actual paper becomes inverse by the later process of transfer to actual paper.
9) After recording of four colors, the recorded image-receiving sheet is discharged to discharge platform 31. The releasing method from the drum is the same as that of the thermal transfer sheet in above 7), but since the image-receiving sheet is not discarded differently from the thermal transfer sheets, the image-receiving sheet is returned to the discharge platform by switch back when conveyed to discard port 32. When the image-receiving sheet is discharged to the discharge platform, air 34 is blasted from under discharge port 33 to make it possible to accumulate a plurality of sheets.

It is preferred to use an adhesive roller provided with an adhesive material on the surface as carrier roller 7 of either feeding part or carrying part of the thermal transfer sheet roll and the image-receiving sheet roll.

The surfaces of the thermal transfer sheet and the image-receiving sheet can be cleaned by providing an adhesive roller.

As the adhesive materials provided on the surface of the adhesive roller, an ethylene-vinyl acetate copolymer, an ethylene-ethyl acrylate copolymer, a polyolefin resin, a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), an acrylic ester copolymer, a polyester resin, a polyurethane resin, an acrylate resin, a butyl rubber, and a polynorbornene can be exemplified.

An adhesive roller can clean the surfaces of the thermal transfer sheet and the image-receiving sheet by being brought into contact with the surfaces of them, and the contact pressure is not particularly limited so long as they are in contact with the adhesive roller.

Vickers hardness Hv of the material having viscosity used in the adhesive roller is preferably 50 $kg/mm^2$ (≈490 MPa) or less in view of capable of sufficiently removing foreign matters and suppressing image defect.

Vickers hardness is the hardness obtained by measurement with applying static load to a pyramid indenter of diamond having the angle between the opposite faces of 136°, and Vickers hardness Hv can be obtained by the following equation:

$$\text{Hardness } Hv=1.854\ P/d^2 (kg/mm^2) \approx 18.1692\ P/d^2 (Mpa)$$

wherein P: load (kg), d: the length of diagonal line of the square of depressed area (mm).

Also in the present invention, the modulus of elasticity at 20° C. of the material having viscosity used in the adhesive roller is preferably 200 $kg/cm^2$ (≈19.6 MPa) or less in view of capable of sufficiently removing foreign matters and suppressing image defect similarly to the above.

The second characteristics of the technique of systematization is the constitution of a heat transfer unit.

The heat transfer unit is used for the step of transferring the image-receiving sheet, on which an image has been printed by a recording unit, to an actual printing paper (hereinafter referred to as "actual paper"). This step is completely the same with First Proof™. When the image-receiving sheet and an actual paper are superposed and heat and pressure are applied thereto, both are adhered, and then the image-receiving film is released from the actual paper, an image and the adhesion layer remain on the actual paper, and the support of the image-receiving sheet and the cushioning layer are peeled off. Accordingly, it can be said that the image is transferred from the image-receiving sheet to the actual paper in practice.

Figure 3:
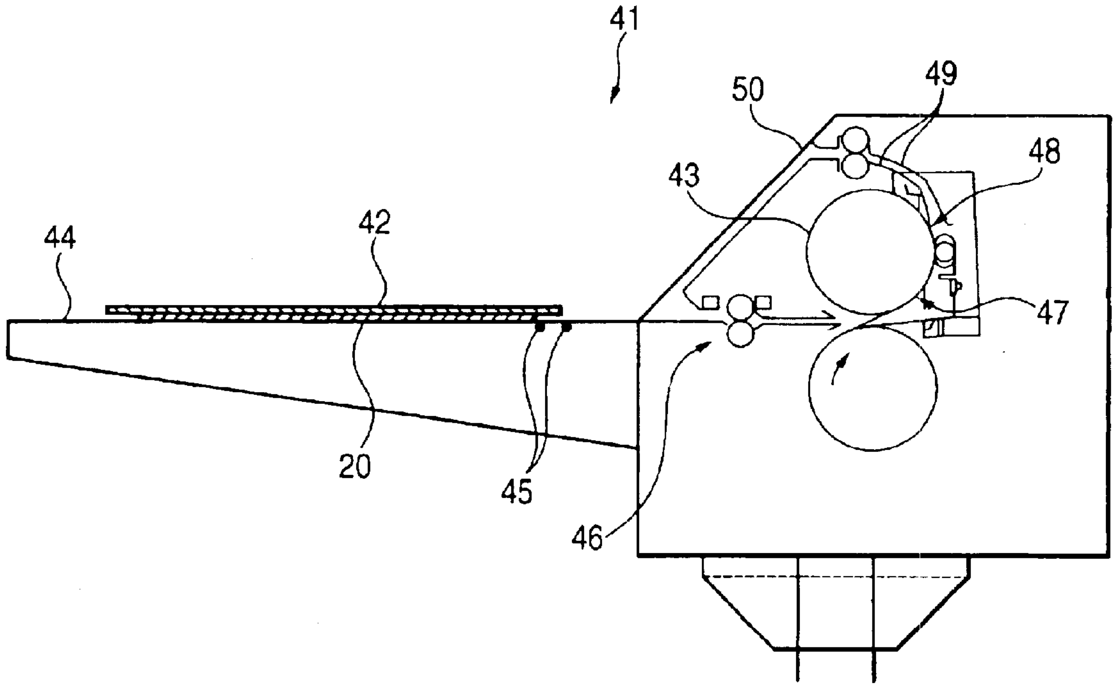
FIG. 3 is a drawing showing an example of constitution of a heat transfer unit.

In First Proof™, transferring is performed by superposing an actual paper and an image-receiving sheet on an aluminum guide plate and passing them through a heat roller. The aluminum guide plate is for preventing the deformation of the actual paper. However, when an aluminum guide plate is adopted in the system of the present invention of B2 size, an aluminum guide plate larger than B2 size is necessary, which results in the problem that a large installation space is required. Accordingly, the system of the present invention does not use an aluminum guide plate and adopts the structure such that a carrier path further rotates in a 180° arc and sheets are discharged on the side of insertion, thus the installation space can be largely saved (FIG. 3). However, there arises a problem of the deformation of an actual paper, since an aluminum guide plate is not used. Specifically, a pair of an actual paper and an image-receiving sheet curl with the image-receiving sheet inside and roll on the discharge platform. It is very difficult work to release the image-receiving sheet from the curled actual paper.

Therefore, curling prevention is tried by bimetallic effect by making use of the difference in shrinking amount between an actual paper and an image-receiving sheet and ironing effect of winding them around a hot roller. In the case where an image-receiving sheet is superposed on an actual paper and inserted as in conventional way, since the thermal shrinkage of an image-receiving sheet in the direction of insertion is larger than that of an actual paper, curling by bimetallic effect is such that the upper tends inward, which is the same direction as in the ironing effect and curling becomes serious by synergistic effect. Contrary to this, when an image-receiving sheet is superposed under an actual paper, curling by bimetallic effect tends downward and curling by ironing effect tends upward, thus curls are offset each other.

The sequence of an actual paper transfer is as follows (hereinafter referred to as the transfer method of an actual paper for use in the system of the present invention). Heat transfer unit 41 for use in this method as shown in FIG. 3 is a manual apparatus differently from a recording unit.

1) In the first place, the temperature of heat rollers 43 (from 100 to 110° C.) and the carrying velocity at transferring are set by dials (not shown) according to the kind of actual paper 42.
2) In the next place, image-receiving sheet 20 is put on an insert platform with the image being upward, and the dust on the image is removed by an antistatic brush (not shown). Actual paper 42 from which dust has been removed is superposed thereon. At that time, since the size of actual paper 42 put upper side is larger than image-receiving sheet 20 put lower side, the position of image-receiving sheet 20 is not seen and alignment is difficult to do. For improving this work, marks showing the positions of placement of an image-receiving sheet and an actual paper 45 are marked on insert platform 44. The reason the actual paper is larger than image-receiving sheet 20 is to prevent image-receiving sheet 20 from deviating and coming out from actual paper 42 and to prevent the image-receiving layer of image-receiving sheet 20 from smearing heat rollers 43.
3) When the image-receiving sheet and the actual paper with being superposed are inserted into an insert port, insert roller 46 rotates and feeds them to heat rollers 43.
4) When the tip of the actual paper comes to the position of heat rollers 43, the heat rollers nip them and transfer is started. The heat rollers are heat resisting silicone rubber rollers. Pressure and heat are applied simultaneously to the image-receiving sheet and the actual paper, thereby they are adhered. Guide 47 made of heat resisting sheet is installed on the down stream of the heat rollers, and a pair of image-receiving sheet and actual paper is carried upward through the upper heat roller and guide 47 with heating, they are released from the heat roller at releasing claw 48 and guided to discharge port 50 along guide plate 49.
5) A pair of image-receiving sheet and actual paper coming out of discharge port 50 is discharged on the insert platform with being adhered. Thereafter, image-receiving sheet 20 is released from actual paper 42 manually.

The third characteristic of the technique of systematization is the constitution of a system.

By connecting the above units with a plate-making system, the function as color proof can be exhibited. As the system, it is necessary that a printed matter having an image quality approximating as far as possible to the printed matter outputted from certain plate-making data must be outputted from a proof. Therefore, a software for approximating dots and colors to the printed matter is necessary. The specific example of connection is described below.

When the proof of a printed matter is taken from the plate-making system Celebra™ (manufactured by Fuji Photo Film Co., Ltd.), the system connection is as follows. CTP (computer to plate) system is connected with Celebra. The final printed matter can be obtained by mounting the printing plate outputted from this system on a printing machine. As a color proof, the above recording unit Luxel FINALPROOF 5600 (manufactured by Fuji Photo Film Co., Ltd.) (hereinafter sometimes also referred to as "FINALPROOF") is connected with Celebra, and as proof drive software for approximating dots and colors to the printed matter, PD SYSTEM™ (manufactured by Fuji Photo Film Co., Ltd.) is also connected with Celebra.

Figure 4:
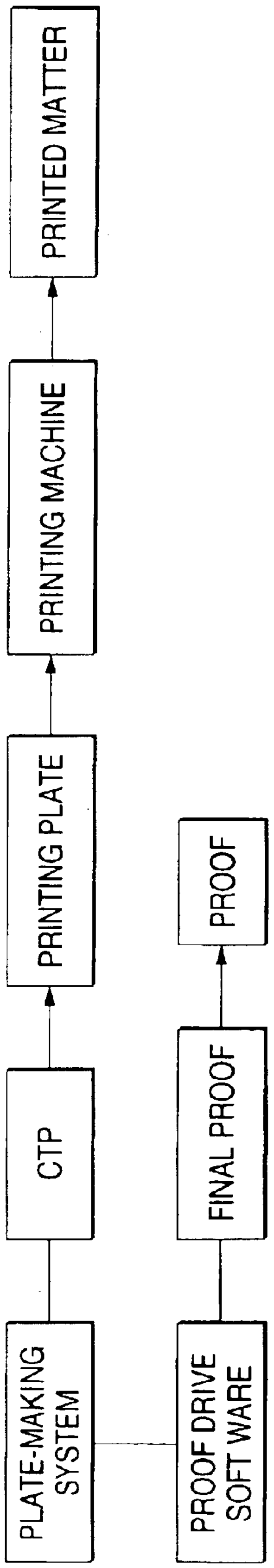
FIG. 4 is a drawing showing the scheme of a system using a recording unit FINALPROOF for laser heat transfer.
Figure 5:
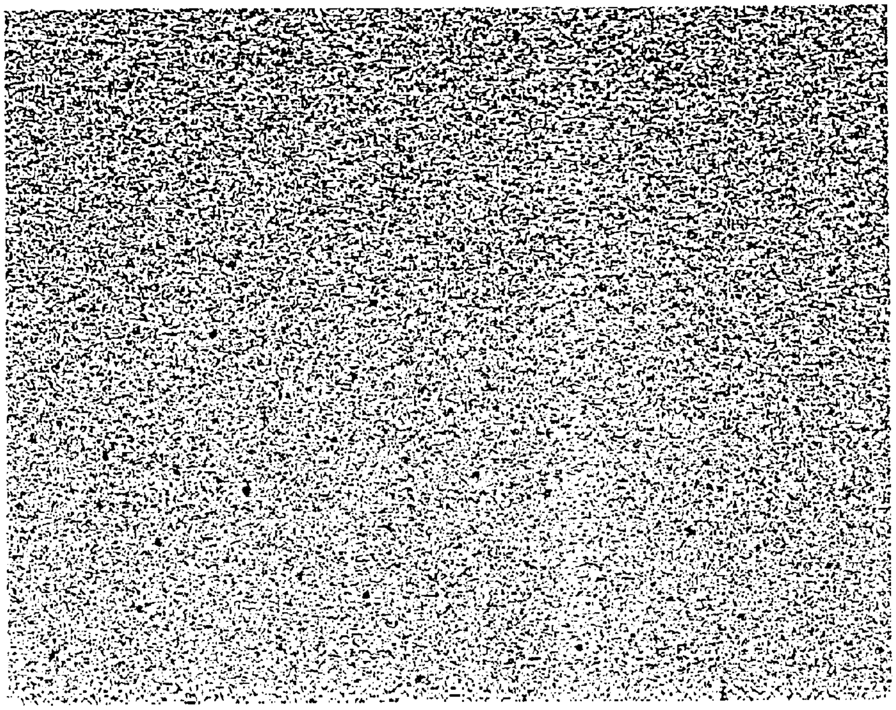
FIG. 5 shows the shapes of the dots of the image obtained in the Example below. The center distance of dots is 125 μm.
Figure 6:
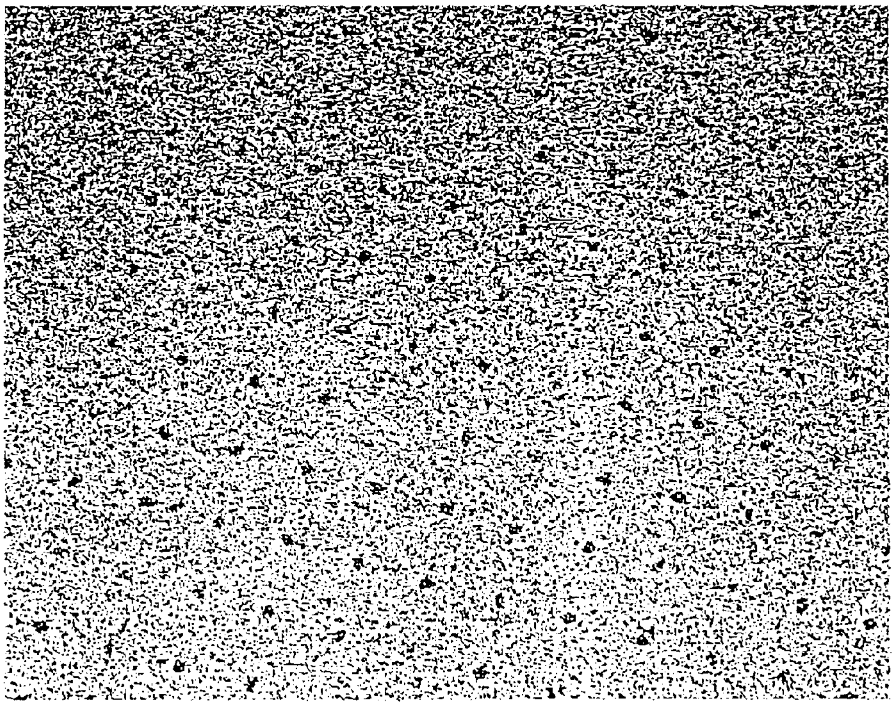
FIG. 6 shows the shapes of the dots of the image obtained in the Example below. The center distance of dots is 125 μm.
Figure 7:
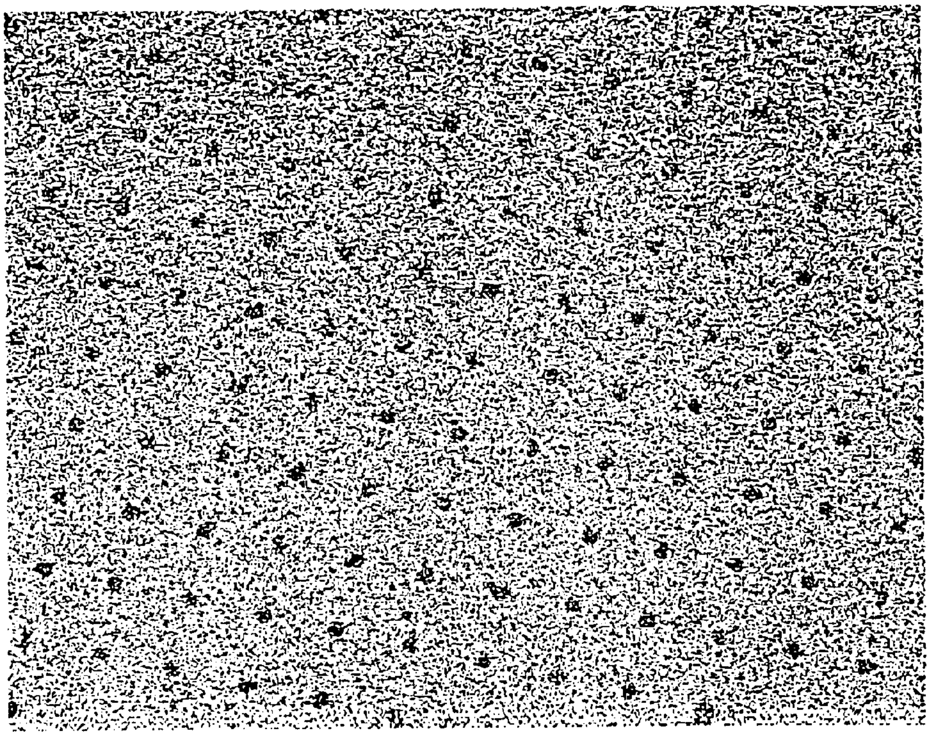
FIG. 7 shows the shapes of the dots of the image obtained in the Example below. The center distance of dots is 125 μm.
Figure 8:
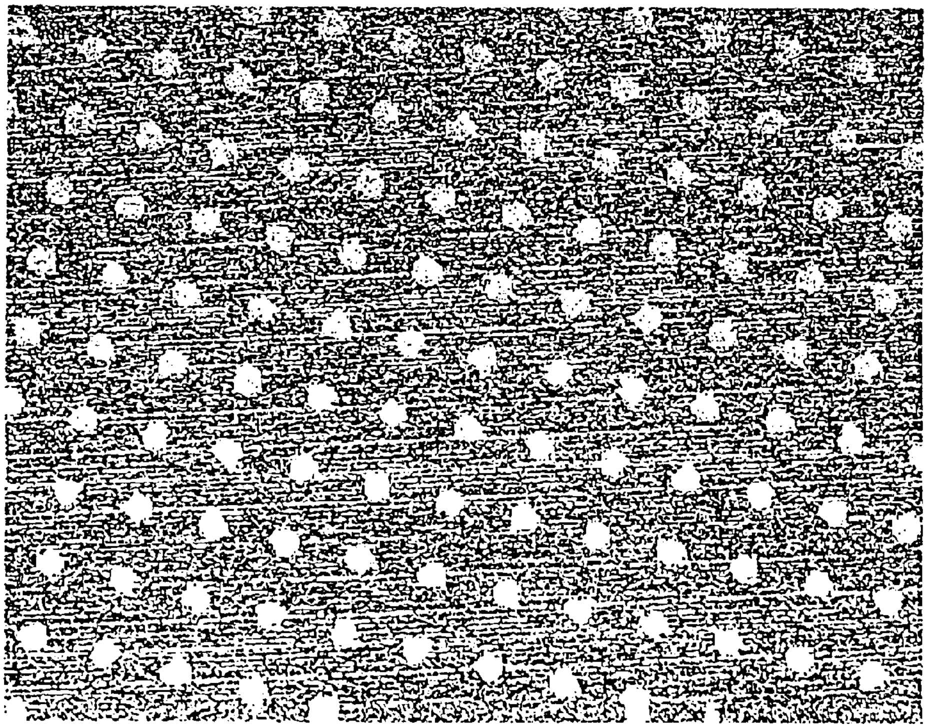
FIG. 8 shows the shapes of the dots of the image obtained in the Example below. The center distance of dots is 125 μm.
Figure 9:
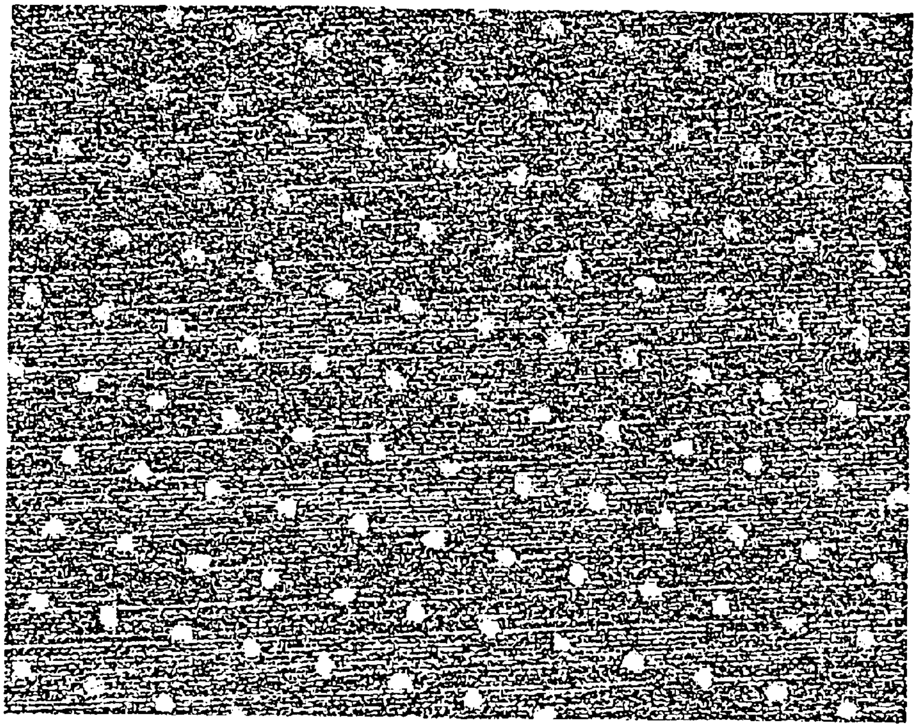
FIG. 9 shows the shapes of the dots of the image obtained in the Example below. The center distance of dots is 125 μm.
Figure 10:
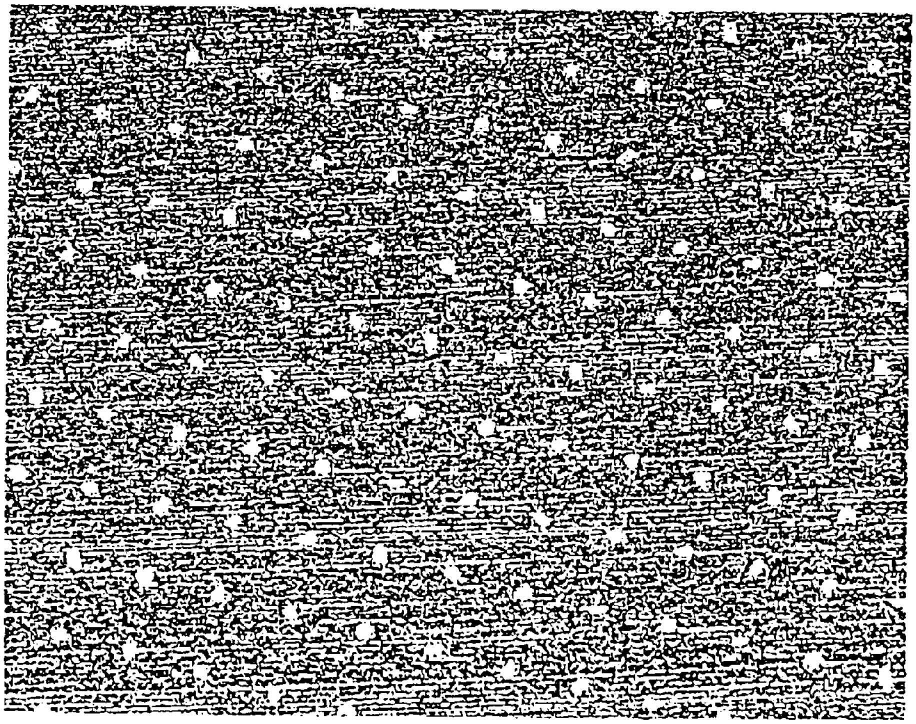
FIG. 10 shows the shapes of the dots of the image obtained in the Example below. The center distance of dots is 125 μm.
Figure 11:
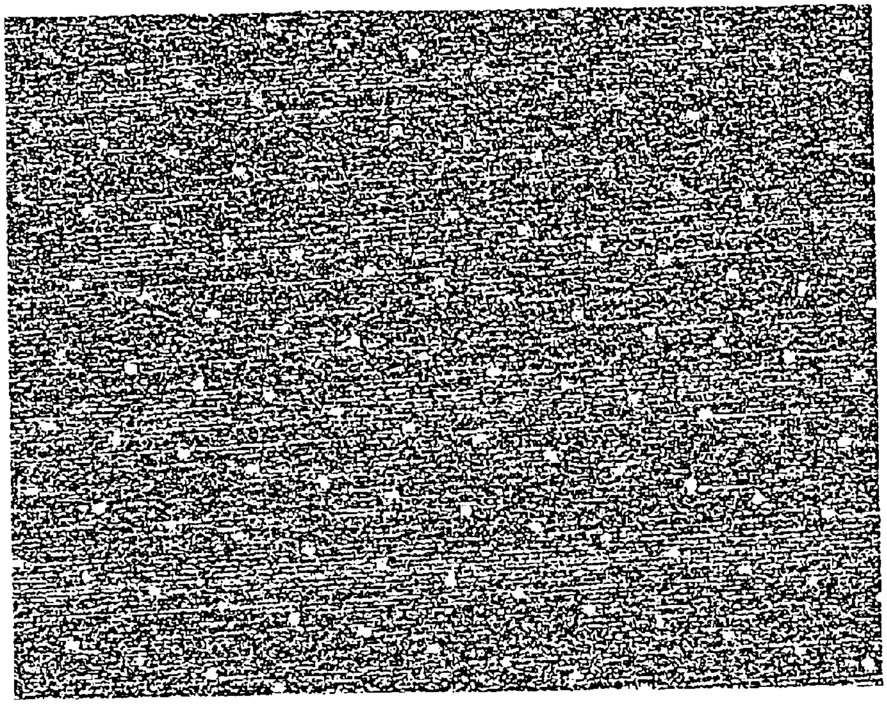
FIG. 11 shows the shapes of the dots of the image obtained in the Example below. The center distance of dots is 125 μm.
Figure 12:
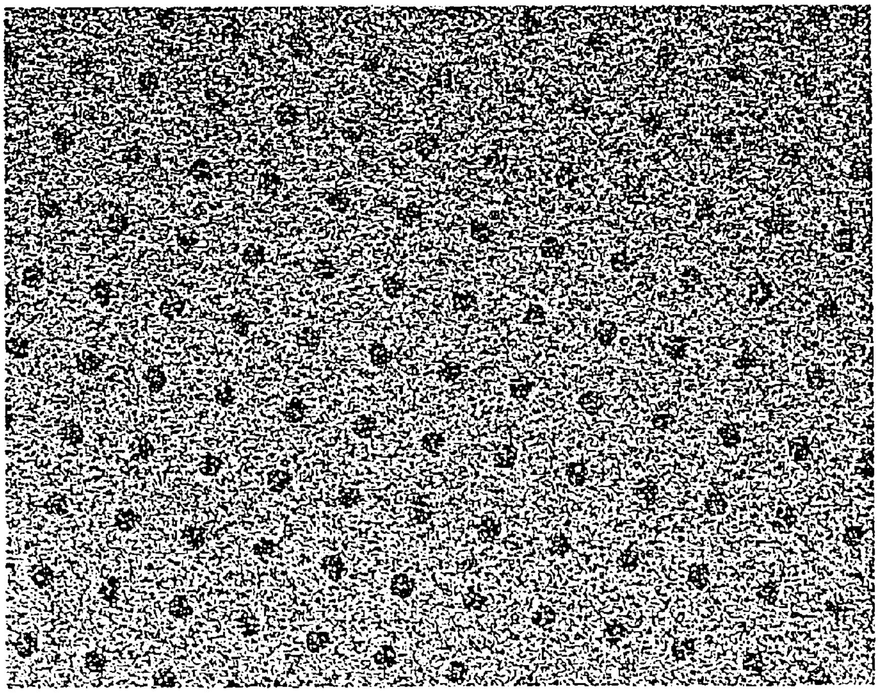
FIG. 12 shows the shapes of the dots of the image obtained in the Example below. The center distance of dots is 125 μm.

Contone data (continuous tone data) converted to raster data by Celebraa reconverted to binary data for dots and out putted to CTP system and finally printed. On the other hand, the same contone data are also outputted to PD system. PD system converts the received data according to four dimensional (black, cyan, magenta and yellow) table so that the colors coincide with the printed matter, and finally converts to binary data for dots so that the dots coincide with the dots of the printed matter and the data is outputted to FINALPROOF (FIG. 4).

The four dimensional table is experimentally prepared in advance and saved in the system. The experiment for the preparation of the four dimensional table is as follows. The printed image of important color data via CTP system and the outputted image of important color data from FINALPROOF via PD system are prepared, the measured color values of these images are compared and the table is formed so that the difference becomes minimum.

Thus, the present invention has realized the system constitution which can sufficiently exhibit the performance of the image-forming material having high definition.

The material of the heat transfer system for use in the system of the present invention is described below.

It is preferred that the absolute value of the difference between the surface roughness Rz of the front surface of the image-forming layer in the thermal transfer sheet and the surface roughness Rz of the back surface of the image-forming layer is 3.0 or less, and the absolute value of the difference between the surface roughness Rz of the front surface of the image-receiving layer in the image-receiving sheet and the surface roughness Rz of the back surface of the image-receiving layer is 3.0 or less. By such constitution of the present invention, conjointly with the above cleaning means, image defect can be prevented, jamming in carrying can be done away with, and dot gain stability can be improved.

The surface roughness Rz in the present invention means ten point average surface roughness corresponding to Rz of JIS (maximum height). The surface roughness is obtained by inputting and computing the distance between the average value of the altitudes of from the highest peak to the fifth peak and the average value of the depths of from the deepest valley to the fifth valley with the average surface of the part obtained by removing by the reference area from the curved surface of roughness as the reference level. A feeler type three dimensional roughness meter (Surfcom 570A-3DF, manufactured by Tokyo Seimitsu Co., Ltd.) is used in measurement. The measurement is performed in machine direction, the cutoff value is 0.08 mm, the measured area is 0.6 mm×0.4 mm, the feed pitch is 0.005 mm, and the speed of measurement is 0.12 mm/sec.

For further improving the above-described effects, it is more preferred that the absolute value of the difference between the surface roughness Rz of the front surface of the image-forming layer in the thermal transfer sheet and the surface roughness Rz of the back surface of the image-forming layer is 1.0 or less, and the absolute value of the difference between the surface roughness Rz of the front surface of the image-receiving layer in the image-receiving sheet and the surface roughness Rz of the back surface of the image-receiving layer is 1.0 or less.

Further, as another embodiment, it is preferred that the surface roughness Rz of the front surface and the back surface of the thermal transfer sheet and/or the surface roughness Rz of the front surface and the back surface of the image-receiving sheet is from 2 to 30 μm. By such constitution of the present invention, conjointly with the above cleaning means, image defect can be prevented, jamming in carrying can be done away with, and dot gain stability can be improved.

It is also preferred that the glossiness of the image-forming layer in the thermal transfer sheet is from 80 to 99.

The glossiness largely depends upon the surface smoothness of the image-forming layer and can affect the uniformity of the layer thickness of the image-forming layer. When the glossiness is higher, the image-forming layer becomes more uniform and more preferred for highly minute use, but when the smoothness is high, the resistance at conveying becomes larger, thus they are in relationship of trade off. When the glossiness is from 80 to 99, both are compatible and well-balanced.

Figure 1B:
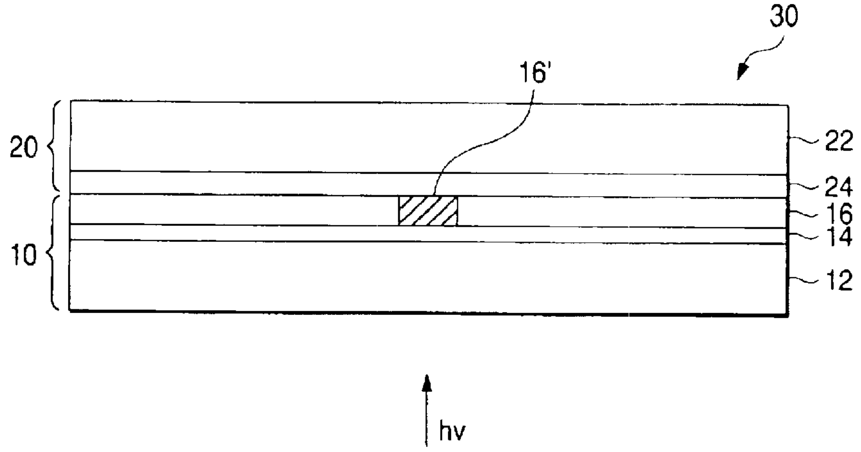
Figure 1C:
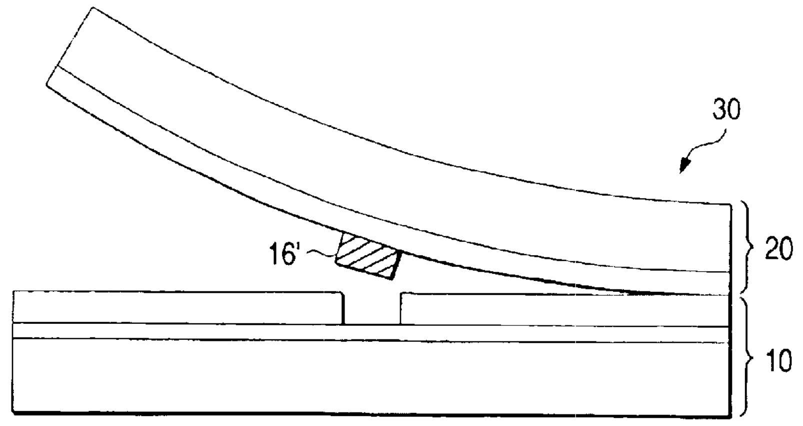

The scheme of multicolor image-forming by membrane heat transfer using a laser is outlined with referring to FIG. 1.

Laminate 30 for image formation comprising image-receiving sheet 20 laminated on the surface of image-forming layer 16 containing pigment black (K), cyan (C), magenta (M) or yellow (Y) in thermal transfer sheet 10 is prepared. Thermal transfer sheet 10 comprises support 12, having provided thereon photothermal converting layer 14 and further thereon image-forming layer 16, and image-receiving sheet 20 comprises support 22 and having provided thereon image-receiving layer 24, and image-receiving layer 24 is laminated on the surface of image-forming layer 16 in thermal transfer sheet 10 in contact therewith (FIG. 1(*a*)). When laser beams are emitted image wise in time series from the side of support 12 in thermal transfer sheet 10 of laminate 30, the irradiated area with laser beams of photothermal converting layer 14 in thermal transfer sheet 10 generates heat, thereby the adhesion with image-forming layer 16 is reduced (FIG. 1(*b*)). Thereafter, when image-receiving sheet 20 and thermal transfer sheet 10 are peeled off, the area irradiated with laser beams 16' of image-forming layer 16 is transferred to image-receiving layer 24 in image-receiving sheet 20 (FIG. 1(*c*)).

In multicolor image formation, the laser beam for use in irradiation preferably comprises multi-beams, particularly preferably comprises multi-beams of two-dimensional array. Multi-beams of two-dimensional array means that a plurality of laser beams are used when recording by irradiation with laser beam is performed, and the spot array of these laser beams comprises two-dimensional array comprised of a plurality of rows along the main scanning direction and a plurality of rows along the by-scanning direction.

The time required in laser recording can be shortened by using multi-beams of two-dimensional array.

Any laser beam can be used in recording with no limitation, such as gas laser beams, e.g., an argon ion laser beam, a helium neon laser beam, and a helium cadmium laser beam, solid state laser beams, e.g., a YAG laser beam, and direct laser beams, e.g., a semiconductor laser beam, a dye laser beam and an eximer laser beam, can be used. Alternatively, laser beams obtained by converting these laser beams to half the wavelength through second harmonic generation elements can also be used. In multicolor image formation, semiconductor laser beams are preferably used taking the output power and easiness of modulation into consideration. In multicolor image formation, it is preferred that laser beam emission is performed on conditions that the beam diameter of laser beam on the photothermal converting layer is from 5 to 50 μm (in particular from 6 to 30 μm), and scanning speed is preferably 1 m/second or more (particularly preferably 3 m/second or more).

In addition, it is preferred in multicolor image formation that the layer thickness of the image-forming layer in the black thermal transfer sheet is larger than the layer thickness of the image-forming layer in each of yellow, magenta and cyan thermal transfer sheets, and is preferably from 0.5 to 0.7 μm. By adopting this constitution, the reduction of density due to transfer unevenness by the irradiation of the black thermal transfer sheet with laser beams can be suppressed.

By restricting the layer thickness of the image-forming layer in the black thermal transfer sheet to 0.5 μm or more, transfer unevenness is not generated by high energy recording and image density is maintained, thus required image density as the proof of printing can be attained. This tendency becomes more conspicuous under high humidity conditions, and so density variation due to circumferential conditions can be prevented. On the other hand, by making the layer thickness 0.7 μm or less, transfer sensitivity can be maintained at recording time by laser and impression of small dots and fine lines can be improved. This tendency becomes more conspicuous under low humidity conditions. Definition can also be improved by the layer thickness of this range. The layer thickness of the image-forming layer in the black thermal transfer sheet is more preferably from 0.55 to 0.65 μm and particularly preferably 0.60 μm.

Further, it is preferred that the layer thickness of the image-forming layer in the above black thermal transfer sheet is from 0.5 to 0.7 μm, and the layer thickness of the image-forming layer in each of the above yellow, magenta and cyan thermal transfer sheets is from 0.2 to less than 0.5 μm.

By making the layer thickness of each image-forming layer in yellow, magenta and cyan thermal transfer sheets 0.2 μm or more, image density can be maintained without generating transfer unevenness when recording is performed by laser irradiation. On the other hand, by making the layer thickness less than 0.5 μm, transfer sensitivity and definition can be improved. The layer thickness of each image-forming layer in yellow, magenta and cyan thermal transfer sheets is more preferably from 0.3 to 0.45 μm.

It is preferred for the image-forming layer in the black thermal transfer sheet to contain carbon black, and the carbon black preferably comprises at least two carbon blacks having different tinting strength from the viewpoint of capable of controlling reflection density with maintaining P/B (pigment/binder) ratio in a specific range.

The tinting strength of carbon black can be represented variously, e.g., PVC blackness disclosed in JP-A-10-140033, can be exemplified. PVC blackness is the evaluation of blackness, i.e., carbon black is added to PVC resin, dispersed by a twin roll mill and made to a sheet, and the blackness of a sample is evaluated by visual judgement, with taking the blackness of CarbonBlack #40 and #45 (manufactured by Mitsubishi Chemicals Co., Ltd.) as 1 point and 10 points respectively as the standard values. Two or more carbon blacks having different PVC blacknesses can be used arbitrarily according to purposes.

The specific producing method of a sample is described below.

Producing Method of Sample

In a banbury mixer having a capacity of 250 ml, 40 mass % of sample carbon black is compounded to LDPE (low density polyethylene) resin and kneaded at 115° C. for 4 minutes.

| Compounding condition | |
|---|---|
| LDPE resin | 101.89 g |
| Calcium stearate | 1.39 g |
| Irganox ® 1010 | 0.87 g |
| Sample carbon black | 69.43 g |

In the next place, dilution is performed in a twin roll mill at 120° C. so as to reach the concentration of carbon black of 1 mass %.

| Preparation condition of diluted compound | |
|---|---|
| LDPE resin | 58.3 g |
| Calcium stearate | 0.2 g |
| Resin compounded with 40 mass % of carbon black | 1.5 g |

The above-prepared product is made to a sheet having a slit width of 0.3 mm, the sheet is cut to chips, and a film having a thickness of 65±3 μm is formed on a hot plate at 240° C.

A multicolor image may be formed, as described above, by the method of using the thermal transfer sheet, and repeatedly superposing many image layers (an image-forming layer on which an image is formed) on the same image-receiving sheet, alternatively a multicolor image may be formed by the method of forming images on a plurality of image-receiving sheets once, and then transferring these images to actual paper.

With the latter case, for example, a thermal transfer sheet having image-forming layers each containing coloring material mutually different in hue is prepared, and independently four kinds (cyan, magenta, yellow, black) of laminates for image-forming comprising the above thermal transfer sheet combined with an image-receiving sheet are produced. Laser emission according to digital signal on the basis of the image is performed to each laminate through a color separation filter, subsequently the thermal transfer sheet and the image-receiving sheet are peeled off, to thereby form independently a color separated image of each color on each image-receiving sheet. Thereafter, the thus-formed each color separated image is laminated in sequence on an actual support, such as actual printing paper prepared separately, or on a support approximates thereto, thus a multicolor image can be formed.

It is preferred for the thermal transfer sheet utilizing laser irradiation to form an image by the system of converting laser beams to heat and membrane transferring the image-forming layer containing a pigment on the image-receiving sheet using the above converted heat energy. However, these techniques used for the development of the image-forming material comprising the thermal transfer sheet and the image-receiving sheet can be arbitrarily applied to the development of the thermal transfer sheets of a heat fusion transfer system, an ablation transfer system, and sublimation system and/or the development of an image-receiving sheet, and the system of the present invention may include image-forming materials used in these systems.

A thermal transfer sheet and an image-receiving sheet are described below in detail.

Thermal Transfer Sheet

A thermal transfer sheet comprises a support having thereon at least a photothermal converting layer and an image-receiving layer, and, if necessary, other layers.

Support

The materials of the support of the thermal transfer sheet are not particularly restricted, and various supports can be used according to purposes. The support preferably has stiffness, good dimensional stability, and heat resistance capable of resisting the heat at image formation. The preferred examples of the support include synthetic resins, e.g., polyethylene terephthalate, polyethylene-2,6-naphthalate, polycarbonate, polymethyl methacrylate, polyethylene, polypropylene, polyvinyl chloride, polyvinylidene chloride, polystyrene, styrene-acrylonitrile copolymer, polyamide (aromatic and aliphatic), polyimide, polyamideimide, and polysulfone. Biaxially stretched polyethylene terephthalate is preferred above all from the viewpoint of mechanical strength and dimensional stability against heat. When resins are used in the preparation of color proofs utilizing laser recording, it is preferred to form the support of a thermal transfer sheet from transparent synthetic resins which transmit laser beams. The thickness of the support is preferably from 25 to 130 μm, particularly preferably from 50 to 120 μm. The central line average surface roughness Ra of the support of the side on which an image-forming layer is provided is preferably less than 0.1 μm (the value obtained by measurement using Surfcom, manufactured by Tokyo Seiki Co., Ltd., according to JIS B0601) The Young's modulus of the support in the machine direction is preferably from 200 to 1,200 kg/mm$^2$ (≈2 to 12 GPa), and the Young's modulus of the support in the transverse direction is preferably from 250 to 1,600 kg/mm$^2$ (≈2.5 to 16 GPa). The F-5 value of the support in the machine direction is preferably from 5 to 50 kg/mm$^2$ (≈49 to 490 MPa), and the F-5 value of the support in the transverse direction is preferably from 3 to 30 kg/mm$^2$ (≈29.4 to 294 MPa), and the F-5 value of the support in the machine direction is generally higher than the F-5 value of the support in the transverse direction, but when it is necessary to make the strength particularly in the transverse direction high, this rule does not apply to the case. Further, the heat shrinkage at 100° C. for 30 minutes of the support in the machine direction is preferably 3% or less, more preferably 1.5% or less, the heat shrinkage at 80° C. for 30 minutes is preferably 1% or less, more preferably 0.5% or less. The breaking strength is from 5 to 100 kg/mm$^2$ (≈49 to 980 MPa) in both directions, and the modulus of elasticity is preferably from 100 to 2,000 kg/mm$^2$ (≈0.98 to 19.6 GPa).

The support of the thermal transfer sheet may be subjected to surface activation treatment and/or one or two or more undercoat layers may be provided on the support for the purpose of improving the adhesion with the photothermal converting layer which is provided on the support. As the examples of the surface activation treatments, glow discharge treatment and corona discharge treatment can be exemplified. As the materials of the undercoat layer, materials having high adhering property to both surfaces of the support and the photothermal converting layer, low heat conductivity, and excellent heat resisting property are preferably used. As the materials of such an undercoat layer, styrene, a styrene-butadiene copolymer and gelatin can be exemplified. The thickness of the undercoat layer is generally from 0.01 to 2 μm as a whole. If necessary, various functional layers such as a reflection-preventing layer and an antistatic layer may be provided on the surface of the thermal transfer sheet of the side opposite to the side on which a photothermal converting layer is provided, or the support may be subjected to various surface treatments.

Backing Layer

It is preferred to provide a backing layer on the surface of the thermal transfer sheet of the side opposite to the side on which a photothermal converting layer is provided. The backing layer comprises the first backing layer contiguous to the support and the second backing layer provided on the side of the support opposite to the side on which the first backing layer is provided. In the present invention, the mass A of the antistatic agent contained in the first backing layer to the mass B of the antistatic agent contained in the second backing layer, B/A is less than 0.3. When B/A is 0.3 or higher, a sliding property and powder dropout resistance of the backing layer are liable to be deteriorated.

The layer thickness C of the first backing layer is preferably from 0.01 to 1 μm, more preferably from 0.01 to 0.2 μm. The layer thickness D of the second backing layer is preferably from 0.01 to 1 μm, more preferably from 0.01 to 0.2 μm. The ratio of the layer thickness of the first backing layer to that of the second backing layer, C/D is preferably from 1/2 to 5/1.

As the antistatic agents for use in the first and second backing layers, a nonionic surfactant, e.g., polyoxyethylene alkylamine, and glycerol fatty acid ester; acationic surfactant, e.g., a quaternary ammonium salt; an anionic surfactant, e.g., alkylphosphate; an ampholytic surfactant and electrically conductive resin can be exemplified.

Electrically conductive fine particles can also be used as antistatic agents. The examples of such electrically conductive fine particles include oxides, e.g., ZnO, $TiO_2$, $SnO_2$, $Al_2O_3$, $In_2O_3$, MgO, BaO, CoO, CuO, $Cu_2O$, CaO, SrO, $BaO_2$, PbO, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$ and $MgB_2O_5$; sulfide, e.g., CuS and ZnS; carbide, e.g., SiC, TiC, ZrC, VC, NbC, MoC and WC; nitride, e.g., $Si_3N_4$, TiN, ZrN, VN, NbN and $Cr_2N$; boride, e.g., $TiB_2$, $ZrB_2$, $NbB_2$, $TaB_2$, CrB, MoB, WB and $LaB_5$; silicide, e.g., $TiSi_2$, $ZrSi_2$, $NbSi_2$, $TaSi_2$, $CrSi_2$, $MoSi_2$ and $WSi_2$; metal salts, e.g., $BaCO_3$, $CaCO_3$, $SrCO_3$, $BaSO_4$ and $CaSO_4$; and complex, e.g., $SiN_4$—SiC and $9Al_2O_3$—$2B_2O_3$. These electrically conductive fine particles may be used alone or in combination of two or more. Of these fine particles, $SnO_2$, ZnO, $Al_2O_3$, $TiO_2$, $In_2O_3$, MgO, BaO and $MoO_3$ are preferred, $SnO_2$, ZnO, $In_2O_3$ and $TiO_2$ are more preferred, and $SnO_2$ is particularly preferred.

When the thermal transfer sheet of the present invention is used in a laser heat transfer system, the antistatic agent used in the backing layer is preferably substantially transparent so that laser beams can be transmitted.

When electrically conductive metallic oxides are used as the antistatic agent, their particle size is preferably smaller to make light scattering as small as possible, but the particle size should be determined using the ratio of the refractive indices of the particles and the binder as parameter, which can be obtained according to the theory of Mie. The average particle size of the electrically conductive metallic oxides is generally from 0.001 to 0.5 μm, preferably from 0.003 to 0.2 μm. The average particle size used herein is the value of the particle size of not only the primary particles of the electrically conductive metallic oxides but the particle size of the particles having higher structure is included.

Besides an antistatic agent, the first and second backing layers may contain various additives, such as a surfactant, a sliding agent and a matting agent, and a binder. The amount of the antistatic agent contained in the first backing layer is preferably from 10 to 1,000 mass parts per 100 mass parts of the binder, more preferably from 200 to 800 mass parts. The amount of the antistatic agent contained in the second backing layer is preferably from 0 to 300 mass parts per 100 mass parts of the binder, more preferably from 0 to 100 mass parts.

As the binders for use for forming the first and second backing layers, homopolymers and copolymers of acrylic acid-based monomers, e.g., acrylic acid, methacrylic acid, acrylic ester and methacrylic ester, cellulose-based polymers, e.g., nitrocellulose, methyl cellulose, ethyl cellulose and cellulose acetate, vinyl-based polymers and copolymers of vinyl compounds, e.g., polyethylene, polypropylene, polystyrene, vinyl chloride-based copolymer, vinyl chloride-vinyl acetate copolymer, polyvinyl pyrrolidone, polyvinyl butyral and polyvinyl alcohol, condensed polymers, e.g., polyester, polyurethane and polyamide, rubber-based thermoplastic polymers, e.g., butadiene-styrene copolymer, polymers obtained by polymerization or crosslinking of photopolymerizable or heat polymerizable compounds, e.g., epoxy compounds, and melamine compounds can be exemplified.

Photothermal Converting Layer

The photothermal converting layer may contain a light-to-heat converting material, a binder, and other additives, if necessary.

Alight-to-heat converting material is a material having a function of converting irradiated light energy to heat energy. A light-to-heat converting material is in general a dye (inclusive of a pigment, hereinafter the same) capable of absorbing a laser beam. When image-recording is performed by infrared laser irradiation, it is preferred to use an infrared absorbing dye as the light-to-heat converting material. As the examples of the dyes, black pigments, e.g., carbon black, pigments of macrocyclic compounds having absorption in the visible region to the near infrared region, e.g., phthalocyanine and naphthalocyanine, organic dyes which are used as the laser-absorbing material in high density laser recording such as photo-disc, e.g., a cyanine dye such as an indolenine dye, an anthraquinone dye, an azulene dye and a phthalocyanine dye, and organic metallic compound dyes, e.g., dithiolnickel complex, can be exemplified. Of the above compounds, cyanine dyes are particularly preferably used, since they show a high absorption coefficient to the lights in the infrared region, and the thickness of a photothermal converting layer can be thinned when used as the light-to-heat converting material, as a result, the recording sensitivity of a thermal transfer sheet can be further improved.

As the light-to-heat converting material, particulate metallic materials such as blackened silver and inorganic materials can also be used besides dyes.

As the binder to be contained in the photothermal converting layer, resins having at least the strength capable of forming a layer on a support and preferably having high heat conductivity. Heat resisting resins which are not decomposed by heat generated from the light-to-heat converting material at image recording are preferably used as the binder resin, since the surface smoothness of the photothermal converting layer can be maintained after irradiation even when light irradiation is performed with high energy. Specifically, resins having heat decomposition temperature (the temperature at which the mass decreases by 5% in air current at temperature increasing velocity of 10° C./min by TGA method (thermal mass spectrometry)) of 400° C. or more are preferably used, more preferably 500° C. or more. Binders preferably have glass transition temperature of from 200 to 400° C., more preferably from 250 to 350° C. When the glass transition temperature is lower than 200° C., there is a case where fog is generated on the image to be formed, while when it is higher than 400° C., the solubility of the resin is decreased, followed by the reduction of the productivity in some cases.

Further, the heat resistance (e.g., heat deformation temperature and heat decomposition temperature) of the binder in the photothermal converting layer is preferably higher than the heat resistance of the materials used in other layers provided on the photothermal converting layer.

Specifically, acrylate resins, e.g., polymethyl methacrylate, vinyl resins, e.g., polycarbonate, polystyrene, vinyl chloride/vinyl acetate copolymer and polyvinyl alcohol, polyvinyl butyral, polyester, polyvinyl chloride, polyamide, polyimide, polyether imide, polysulfone, polyether sulfone, aramid, polyurethane, epoxy resin and urea/melamine resin are exemplified as the binder resins for use in the photothermal converting layer. Of these resins, polyimide resin is preferred.

Polyimide resins represented by the following formulae (I) to (VII) are soluble in an organic solvent and the productivity of the thermal transfer sheet is improved when they are used. Further, these polymide resins are preferred in view of capable of improving the stability of viscosity, long term storage stability and moisture resistance of the coating solution for the photothermal converting layer.

(I)

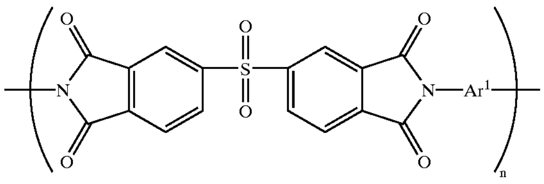

(II)

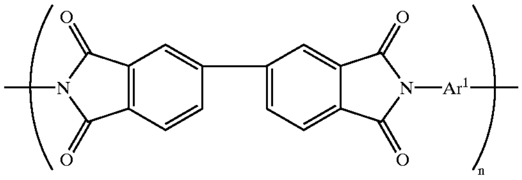

In formulae (I) and (II), $Ar^1$ represents an aromatic group represented by the following formula (1), (2) or (3), and n represents an integer of from 10 to 100.

(1)

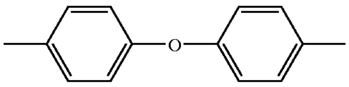

(2)

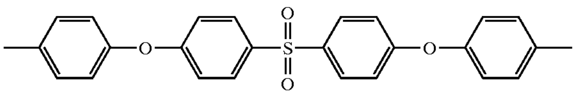

(3)

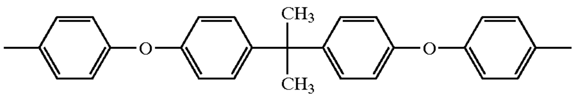

(III)

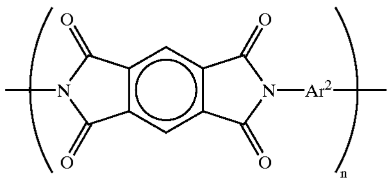

(IV)

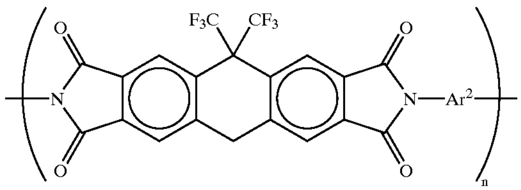

In formulae (III) and (IV), $Ar^2$ represents an aromatic group represented by the following formula (4), (5), (6) or (7), and n represents an integer of from 10 to 100.

(4)

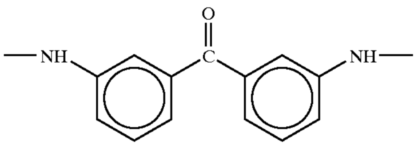

(5)

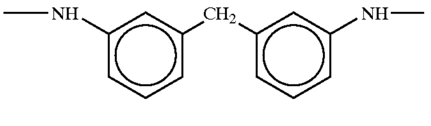

(6)

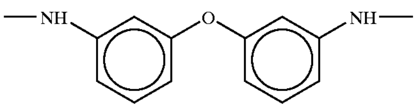

(7)

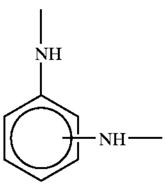

-continued (V)

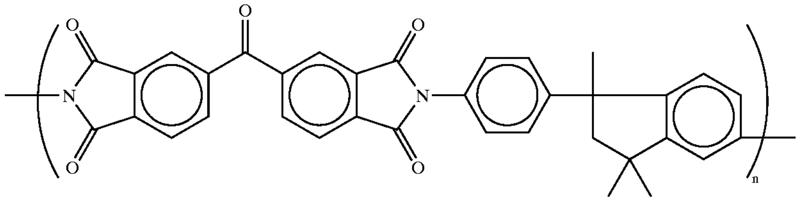

(VI)

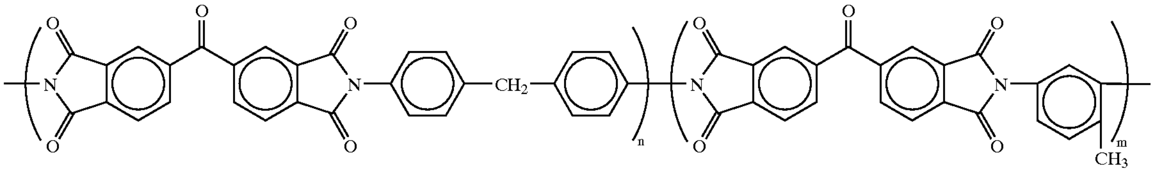

(VII)

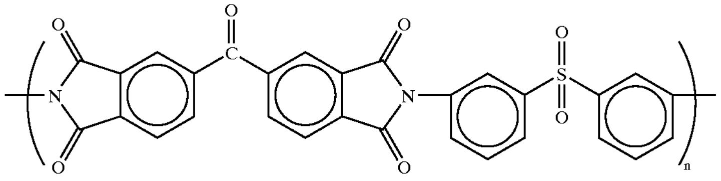

In formulae (V), (VI) and (VII), n and m each represents an integer of from 10 to 100. In formula (VI), the ratio of n/m is from 6/4 to 9/1.

As the criterion whether a resin is soluble in an organic solvent or not, when 10 mass parts or more of the resin is dissolved in 100 mass parts of N-methylpyrrolidone at 25° C., the resin can be preferably used in the photothermal converting layer, more preferably 100 mass parts is dissolved in 100 mass parts of N-methylpyrrolidone.

As the matting agent contained in the photothermal converting layer, inorganic and organic fine particles can be exemplified. The examples of the inorganic fine particles include metal salts, e.g., silica, titanium oxide, aluminum oxide, zinc oxide, magnesium oxide, barium sulfate, magnesium sulfate, aluminum hydroxide, magnesium hydroxide and boron nitride, kaolin, clay, talc, zinc flower, lead white, zeeklite, quartz, diatomaceous earth, pearlite, bentonite, mica and synthetic mica. The examples of the organic fine particles include resin particles, e.g., fluorine resin particles, guanamine resin particles, acrylic resin particles, styrene/acryl copolymer resin particles, silicone resin particles, melamine resin particles and epoxy resin particles.

The matting agents generally have a particle size of from 0.3 to 30 μm, preferably from 0.5 to 20 μm, and the addition amount is preferably from 0.1 to 100 mg/$m^2$.

The photothermal converting layer may contain a surfactant, a thickener, and an antistatic agent, if necessary.

The photothermal converting layer can be provided by dissolving a light-to-heat converting material and a binder, adding, if necessary, a matting agent and other components thereto to thereby prepare a coating solution, coating the coating solution on a support and drying. As the organic solvents for dissolving polyimide resins, e.g., n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethyl sulfoxide, dimethylformamide, dimethylacetamide, γ-butyrolactone, ethanol and methanol can be exemplified. Coating and drying can be performed according to ordinary coating and drying methods. Drying is generally performed at 300° C. or less, preferably 200° C. or less. When polyethylene terephthalate is used as the support, the drying temperature is preferably from 80 to 150° C.

If the amount of the binder in the photothermal converting layer is not sufficient, the cohesive strength of the photothermal converting layer lowers and the photothermal converting layer is liable to be transferred together when an image formed is transferred to an image-receiving sheet, which causes color mixture. While when the amount of the polyimide resin is too much, the layer thickness of the photothermal converting layer becomes too large to achieve a definite absorptivity, thereby sensitivity is liable to be decreased. The mass ratio of the solid content of the light-to-heat converting material to the binder in the photothermal converting layer is preferably 1/20 to 2/1, particularly preferably 1/10 to 2/1.

As described above, when the layer thickness of the photothermal converting layer is thinned, the sensitivity of the thermal transfer sheet is increased and so preferred. The layer thickness of the photothermal converting layer is preferably from 0.03 to 1.0 μm, more preferably from 0.05 to 0.5 μm. Further, when the photothermal converting layer has the optical density of from 0.80 to 1.26 to the beam having wavelength of 808 nm, the transfer sensitivity of the image-forming layer is improved, more preferably the optical density of from 0.92 to 1.15 to the beam having wavelength of 808 nm. When the optical density at wavelength of 808 nm is less than 0.80, irradiated light cannot be sufficiently converted to heat and sometimes transfer sensitivity is reduced. Contrary to this, when it exceeds 1.26, the function of the photothermal converting layer at recording is affected and sometimes fog is generated.

Image-forming Layer

An image-forming layer contains at least a pigment which is transferred to an image-receiving sheet and forms an image, in addition, a binder for forming the layer and, if necessary, other components.

Pigments are broadly classified to organic pigments and inorganic pigments, and they have respectively characteristics such that the former are particularly excellent in the transparency of the film, and the latter are excellent in shielding property, thus they may be used arbitrarily according to purposes. When the thermal transfer sheet is used for the proofs of printing colors, organic pigments which are coincident with yellow, magenta, cyan and black generally used in printing ink or near to them in hue are preferably used. Further, metallic powder and fluorescent pigments are also used in some cases. The examples of the pigments which are preferably used include azo pigments, phthalocyanine pigments, anthraquinone pigments, dioxazine pigments, quinacridone pigments, isoindolinone pigments and nitro pigments. The pigments for use in an image-forming layer are listed below by hues, but the present invention is not limited thereto.

1) Yellow Pigment

Pigment Yellow 12 (C.I. No. 21090)

EXAMPLE

Permanent Yellow DHG (manufactured by Clariant Japan, K.K.), Lionol Yellow 1212B (manufactured by Toyo Ink Mfg. Co., Ltd.), Irgalite Yellow LCT (manufactured by Ciba Specialty Chemicals), Symuler Fast Yellow GTF 219 (manufactured by Dainippon Chemicals and Ink Co., Ltd.)

Pigment Yellow 13 (C.I. No. 21100)

EXAMPLE

Permanent Yellow GR (manufactured by Clariant Japan, K.K.), Lionol Yellow 1313 (manufactured by Toyo Ink Mfg. Co., Ltd.)

Pigment Yellow 14 (C.I. No. 21095)

EXAMPLE

Permanent Yellow G (manufactured by Clariant Japan, K.K.), Lionol Yellow 1401-G (manufactured by Toyo Ink Mfg. Co., Ltd.), Seika Fast Yellow 2270 (manufactured by Dainichi Seika K.K.), Symuler Fast Yellow 4400 (manufactured by Dainippon Chemicals and Ink Co., Ltd.)

Pigment Yellow 17 (C.I. No. 21105)

EXAMPLE

Permanent Yellow GG02 (manufactured by Clariant Japan, K.K.), Symuler Fast Yellow 8GF (manufactured by Dainippon Chemicals and Ink Co., Ltd.)

Pigment Yellow 155

EXAMPLE

Graphtol Yellow 3GP (manufactured by Clariant Japan, K.K.) Pigment Yellow 180 (C.I. No. 21290)

EXAMPLE

Novoperm Yellow P-HG (manufactured by Clariant Japan, K.K.), PV Fast Yellow HG (manufactured by Clariant Japan, K.K.)

Pigment Yellow 139 (C.I. No. 56298)

EXAMPLE

Novoperm Yellow M2R 70 (manufactured by Clariant Japan, K.K.)

2) Magenta Pigment

Pigment Red 57:1 (C.I. No. 15850:1)

EXAMPLE

Graphtol Rubine L6B (manufactured by Clariant Japan, K.K.), Lionol Red 6B-4290G (manufactured by Toyo Ink Mfg. Co., Ltd.), Irgalite Rubine 4BL (manufactured by Ciba Specialty Chemicals), Symuler Brilliant Carmine 6B-229 (manufactured by Dainippon Chemicals and Ink Co., Ltd.)

Pigment Red 122 (C.I. No. 73915)

EXAMPLE

Hosterperm Pink E (manufactured by Clariant Japan, K.K.), Lionogen Magenta 5790 (manufactured by Toyo Ink Mfg. Co., Ltd.), Fastogen Super Magenta RH (manufactured by Dainippon Chemicals and Ink Co., Ltd.)

Pigment Red 53:1 (C.I. No. 15585:1)

EXAMPLE

Permanent Lake Red LCY (manufactured by Clariant Japan, K.K.), Symuler Lake Red C conc (manufactured by Dainippon Chemicals and Ink Co., Ltd.)

Pigment Red 48:1 (C.I. No. 15865:1)

EXAMPLE

Lionol Red 2B-3300 (manufactured by Toyo Ink Mfg. Co., Ltd.), Symuler Red NRY (manufactured by Dainippon Chemicals and Ink Co., Ltd.)

Pigment Red 48:2 (C.I. No. 15865:2)

EXAMPLE

Permanent Red W2T (manufactured by Clariant Japan, K.K.), Lionol Red LX235 (manufactured by Toyo Ink Mfg. Co., Ltd.), Symuler Red 3012 (manufactured by Dainippon Chemicals and Ink Co., Ltd.)

Pigment Red 48:3 (C.I. No. 15865:3)

EXAMPLE

Permanent Red 3RL (manufactured by Clariant Japan, K.K.), Symuler Red 2BS (manufactured by Dainippon Chemicals and Ink Co., Ltd.)

Pigment Red 177 (C.I. No. 65300)

EXAMPLE

Cromophtal Red A2B (manufactured by Ciba Specialty Chemicals)

3) Cyan Pigment

Pigment Blue 15 (C.I. No. 74160)

EXAMPLE

Lionol Blue 7027 (manufactured by Toyo Ink Mfg. Co., Ltd.), Fastogen Blue BB (manufactured by Dainippon Chemicals and Ink Co., Ltd.)

Pigment Blue 15:1 (C.I. No. 74160)

EXAMPLE

Hosterperm Blue A2R (manufactured by Clariant Japan, K.K.), Fastogen Blue 5050 (manufactured by Dainippon Chemicals and Ink Co., Ltd.)

Pigment Blue 15:2 (C.I. No. 74160)

EXAMPLE

Hosterperm Blue AFL (manufactured by Clariant Japan, K.K.), Irgalite Blue BSP (manufactured by Ciba Specialty Chemicals), Fastogen Blue GP (manufactured by Dainippon Chemicals and Ink Co., Ltd.)

Pigment Blue 15:3 (C.I. No. 74160)

EXAMPLE

Hosterperm Blue B2G (manufactured by Clariant Japan, K.K.), Lionol Blue FG7330 (manufactured by Toyo Ink Mfg. Co., Ltd.), Cromophtal Blue 4GNP (manufactured by Ciba Specialty Chemicals), Fastogen Blue FGF (manufactured by Dainippon Chemicals and Ink Co., Ltd.)
Pigment Blue 15:4 (C.I. No. 74160)

EXAMPLE

Hosterperm Blue BFL (manufactured by Clariant Japan, K.K.), Cyanine Blue 700-10FG (manufactured by Toyo Ink Mfg. Co., Ltd.), Irgalite Blue GLNF (manufactured by Ciba Specialty Chemicals), Fastogen Blue FGS (manufactured by Dainippon Chemicals and Ink Co., Ltd.)
Pigment Blue 15:6 (C.I. No. 74160)

EXAMPLE

Lionol Blue ES (manufactured by Toyo Ink Mfg. Co., Ltd.)
Pigment Blue 60 (C.I. No. 69800)

EXAMPLE

Hosterperm Blue RL01 (manufactured by Clariant Japan, K.K.), Lionogen Blue 6501 (manufactured by Toyo Ink Mfg. Co., Ltd.)
4) Black Pigment
Pigment Black 7 (Carbon Black C.I. No. 77266)

EXAMPLE

Mitsubishi Carbon Black MA100 (manufactured by Mitsubishi Chemicals Co., Ltd.), Mitsubishi Carbon Black #5 (manufactured by Mitsubishi Chemicals Co., Ltd.), Black Pearls 430 (manufactured by Cabot Co.)

As the pigments which can be used in the present invention, commercially available products can be arbitrarily selected by referring to *Ganryo Binran* (*Pigment Handbook*), compiled by Nippon Ganryo Gijutsu Kyokai, published by Seibundo-Shinko-Sha (1989), and *COLOUR INDEX, THE SOCIETY OF DYES & COLOURIST*, Third Ed. (1987).

The average particle size of the above pigments is preferably from 0.03 to 1 $\mu$m, more preferably from 0.05 to 0.5 $\mu$m.

When the particle size is 0.03 $\mu$m or more, the costs for dispersion are not increased and the dispersion solution does not cause gelation, while when it is 1 $\mu$m or less, since coarse particles are not contained in pigments, good adhesion of the image-forming layer and the image-receiving layer can be obtained, further, the transparency of the image-forming layer can also be improved.

As the binders for the image-forming layer, amorphous organic high polymers having a softening point of from 40 to 150° C. are preferably used. As the amorphous organic high polymers, homopolymers and copolymers of styrene, derivatives thereof, and substitution products thereof, e.g., butyral resin, polyamide resin, polyethyleneimine resin, sulfonamide resin, polyester polyol resin, petroleum resin, styrene, vinyltoluene, α-methylstyrene, 2-methylstyrene, chlorostyrene, vinylbenzoic acid, sodium vinylbenzenesulfonate, and aminostyrene, methacrylic esters and methacrylic acid, e.g., methyl methacrylate, ethyl methacrylate, butyl methacrylate, and hydroxyethyl methacrylate, acrylic esters and acrylic acid, e.g., methyl acrylate, ethyl acrylate, butyl acrylate, and α-ethylhexyl acrylate, dienes, e.g., butadiene and isoprene, homopolymers of vinyl monomers or copolymers of vinyl monomers with other monomers, e.g., acrylonitrile, vinyl ethers, maleic acid and maleic esters, maleic anhydride, cinnamic acid, vinyl chloride and vinyl acetate can be used. Two or more of these resins may be used as mixture.

The softening point used here means Vicat softening temperature and can be measured by a measurement system of Vicat softening temperature manufactured by Toyo Seiki (Load: 1 kg, Programming rate: 50° C./hr, Displacement: 1 mm).

It is preferred for the image-forming layer to contain a pigment in an amount of from 20 to 80 mass %, more preferably from 30 to 70 mass %, and particularly preferably from 30 to 50 mass %. It is also preferred for the image-forming layer to contain the amorphous organic high polymers in an amount of from 20 to 80 mass %, more preferably from 30 to 70 mass %, and particularly preferably from 40 to 70 mass %.

The image-forming layer can contain the following components (1) to (3) as the above-described other components. Each of the components (1) to (3) may be contained in any coating layer of either the thermal transfer sheet or the image-receiving sheet, but it is particularly preferred to add them to the image-forming layer.

(1) Waxes

The examples of waxes include mineral waxes, natural waxes and synthetic waxes. As the examples of the mineral waxes, petroleum wax such as paraffin wax, microcrystalline wax, ester wax and oxide wax, montan wax, ozokerite and ceresin can be exemplified. Paraffin wax is preferred above all. The paraffin wax is separated from petroleum, and various products are commercially available according to melting points.

As the examples of the natural waxes, vegetable wax, e.g., carnauba wax, Japan wax, oulikyuri wax and esparu wax, animal wax, e.g., bees wax, insect wax, shellac wax and spermaceti can be exemplified.

The synthetic waxes are generally used as a lubricant and generally comprises higher fatty acid compounds. As the examples of the synthetic waxes, the following can be exemplified.

1) Fatty Acid-based Wax

A straight chain saturated fatty acid represented by the following formula:

$$CH_3(CH_2)_nCOOH$$

In the formula, n represents an integer of from 6 to 28. As the specific examples, stearic acid, behenic acid, palmitic acid, 12-hydroxystearic acid, and azelaic acid can be exemplified.

In addition, the metal salts of the above fatty acids (e.g., with K, Ca, Zn and Mg) can be exemplified.

2) Fatty Acid Ester-based Wax

As the examples of the fatty acid esters, ethyl stearate, lauryl stearate, ethyl behenate, hexyl behenate and behenyl myristate can be exemplified.

3) Fatty Acid Amide-based Wax

When a fatty acid amide is used, it is preferred to use a fatty acid amide in which the fatty acid moiety is a saturated fatty acid and a fatty acid amide in which the fatty acid moiety is an unsaturated fatty acid in combination.

The examples of the fatty acid amides in which the fatty acid moiety is a saturated fatty acid include stearic acid amide, lauric acid amide, palmitic acid amide, behenic acid amide and myristic acid amide. The examples of the fatty acid amides in which the fatty acid moiety is an unsaturated fatty acid include oleic acid amide and erucic acid amide. As the examples of other fatty acid amides, substituted amides, e.g., bis-amide and methylolamide can be exemplified.

4) Aliphatic Alcohol-based Wax

A straight chain saturated aliphatic alcohol represented by the following formula:

$$CH_3(CH_2)_nOH$$

In the formula, n represents an integer of from 6 to 28. As the specific examples, stearyl alcohol can be exemplified.

Of the above synthetic waxes 1) to 4), higher fatty acid amides such as stearic acid amide and lauric acid amide are preferred. Further, these wax compounds can be used alone or in arbitrary combination, as desired.

(2) Plasticizers

As the plasticizers, ester compounds are preferred, and well-known plasticizers can be exemplified, such as phthalic esters, e.g., dibutyl phthalate, di-n-octyl phthalate, di(2-ethylhexyl)phthalate, dinonyl phthalate, dilauryl phthalate, butyllauryl phthalate, and butylbenzyl phthalate, aliphatic dibasic esters, e.g., di(2-ethylhexyl)adipate, and di(2-ethylhexyl)sebacate, phosphoric triesters, e.g., tricresyl phosphate and tri(2-ethylhexyl)phosphate, polyol polyesters, e.g., polyethylene glycol ester, and epoxy compounds, e.g., epoxy fatty acid ester. Of these compounds, esters of vinyl monomers, in particular, acrylic esters and methacrylic esters are preferred in view of the improvement of transfer sensitivity, the improvement of transfer unevenness, and the big controlling effect of breaking elongation.

As the acrylic or methacrylic ester compounds, monomethacrylate, monoacrylate, dimethacrylate, diacrylate, trimethacrylate, triacrylate, tetramethacrylate and tetra-acrylate can be exemplified. Specifically, polyethylene glycol dimethacrylate, 1,2,4-butanetriol trimethacrylate, trimethylolethane triacrylate, pentaerythritol acrylate, pentaerythritol tetraacrylate, dipentaerythritol polyacrylate, and a monomer represented by the following formula (1) or a homo- or copolymer containing the monomer as the main component can be exemplified:

$$R_1R_2R_3C—CH_2—OCO—CR{=}CH_2 \qquad (1)$$

wherein $R_1$, $R_2$ and $R_3$ each represents a hydrogen atom, a lower alkyl group (e.g., methyl, ethyl, propyl and butyl), or a $—CH_2—OCO—CR{=}CH_2$ group; and R represents a hydrogen atom or a methyl group.

The above plasticizers may be high polymers, and polyesters are preferred above all, since the addition effect is large and they hardly diffuse under storage conditions. As the polyesters, e.g., sebacic acid polyester and adipic acid polyester are exemplified.

The additives contained in the image-forming layer are not limited thereto. The plasticizers may be used alone or in combination of two or more.

When the content of these additives in the image-forming layer are too much, in some cases, the definition of the transferred image is deteriorated, the film strength of the image-forming layer itself is reduced, or sometimes the unexposed area is transferred to the image-receiving sheet due to the reduction of the adhesion of the photothermal converting layer and the image-forming layer. From the above viewpoint, the content of the waxes is preferably from 0.1 to 30 mass % of the entire solid content in the image-forming layer, more preferably from 1 to 20 mass %. The content of the plasticizers is preferably from 0.1 to 20 mass % of the entire solid content in the image-forming layer, more preferably from 0.1 to 10 mass %.

(3) Others

In addition to the above components, the image-forming layer may further contain a surfactant, inorganic or organic fine particles (metallic powder and silica gel), oils (e.g., linseed oil and mineral oil), a thickener and an antistatic agent. Except for the case of obtaining a black image, energy necessary for transfer can be reduced by containing the materials which absorb the wavelengths of light sources for use in image recording. As the materials which absorb the wavelengths of light sources, either pigments or dyes may be used, but in the case of obtaining a color image, it is preferred in view of color reproduction to use infrared light sources such as a semiconductor laser in image recording and use dyes having less absorption in the visible region and large absorption in the wavelengths of light sources. As the examples of infrared absorbing dyes, the compounds disclosed in JP-A-3-103476 can be exemplified.

The image-forming layer can be provided by dissolving or dispersing the pigment and the binder, to thereby prepare a coating solution, coating the coating solution on the photothermal converting layer (when the following heat-sensitive releasing layer is provided on the photothermal converting layer, on the heat-sensitive releasing layer) and drying. As the solvent for use in the preparation of the coating solution, n-propyl alcohol, methyl ethyl ketone, propylene glycol monomethyl ether (MFG), methanol and water can be exemplified. Coating and drying can be performed according to ordinary coating and drying methods.

A heat-sensitive releasing layer containing a heat-sensitive material which generates gas by the action of the heat generated in the photothermal converting layer or releases adhesive moisture to thereby lower the adhesion strength between the photothermal converting layer and the image-forming layer can be provided on the photothermal converting layer in the thermal transfer sheet. As such heat-sensitive materials, compounds (polymers or low molecular compounds) which themselves are decomposed by heat, or properties of which are changed by heat, and generate gas, and compounds (polymers or low molecular compounds) which are absorbing, or are being adsorbed with, a considerable amount of easily-gasifying gases, such as moisture, can be used. These compounds may be used in combination.

As the examples of the polymers which themselves are decomposed by heat, or properties of which are changed by heat, and generate gas, self oxidizing polymers, e.g., nitrocellulose, halogen-containing polymers, e.g., chlorinated polyolefin, chlorinated rubber, poly-rubber chloride, polyvinyl chloride, and polyvinylidene chloride, acryl-based polymers, e.g., polyisobutyl methacrylate which is being adsorbed with gasifying compound such as moisture, cellulose esters, e.g., ethyl cellulose which is being adsorbed with gasifying compound such as moisture, and natural high molecular compounds, e.g., gelatin which is being adsorbed with gasifying compound such as moisture can be exemplified. As the examples of low molecular compounds which are decomposed by heat, or properties of which are changed by heat, and generate gas, diazo compounds and azide compounds which generate heat, decomposed and generate gas can be exemplified.

Decomposition and property change by heat of the heat-sensitive material as described above preferably occur at 280° C. or less, particularly preferably 230° C. or less.

When low molecular compounds are used as the heat-sensitive material of the heat-sensitive releasing layer, it is preferred to combine the material with a binder. As the binder, the polymers which themselves are decomposed by heat, or properties of which are changed by heat, and generate gas can be used, but ordinary binders which do not have such property can also be used. When the heat-sensitive low molecular compound is used in combination with a binder, the mass ratio of the former to the latter is preferably from 0.02/1 to 3/1, more preferably from 0.05/1 to 2/1. It is preferred that the heat-sensitive releasing layer cover the photothermal converting layer almost entirely and the thickness of the heat-sensitive releasing layer is generally from 0.03 to 1 μm, and preferably from 0.05 to 0.5 μm.

When the constitution of the thermal transfer sheet comprises a support having provided thereon a photothermal converting layer, a heat-sensitive releasing layer and an image-forming layer in this order, the heat-sensitive releasing layer is decomposed by heat conducted from the photothermal converting layer, or properties of which are changed by heat, and generates gas. The heat-sensitive releasing layer is partially lost or cohesive failure is caused in the heat-sensitive releasing layer due to the decomposition or gas generation, as a result the adhesion strength between the photothermal converting layer and the image-forming layer is lowered and, according to the behavior of the heat-sensitive releasing layer, a part of the heat-sensitive releasing layer migrates to the surface of the image finally formed with the image-forming layer and causes color mixture of the image. Therefore, it is preferred that the heat-sensitive releasing layer is scarcely colored, i.e., the heat-sensitive releasing layer shows high transmittance to visible rays, so that color mixture does not appear visually on the image formed, even if such transfer of the heat-sensitive releasing layer occurs. Specifically, the absorptivity of the heat-sensitive releasing layer to visible rays is 50% or less, preferably 10% or less.

Further, instead of providing an independent heat-sensitive releasing layer, the thermal transfer sheet may take the constitution such that the photothermal converting layer is formed by adding the heat-sensitive material to the coating solution of the photothermal converting layer, and the photothermal converting layer doubles as the heat-sensitive releasing layer.

It is preferred that the coefficient of static friction of the outermost layer of the thermal transfer sheet of the side on which the image-forming layer is provided is 0.35 or less, preferably 0.20 or less. When the coefficient of static friction of the outermost layer is 0.35 or less, the contamination of the roll for carrying the thermal transfer sheet can be suppressed and the quality of the image formed can be improved. The measurement of coefficient of static friction is according to the method disclosed in paragraph [0011] of Japanese Patent Application No. 2000-85759.

It is preferred that the image-forming layer surface has a smooster value ("smooster" is a name of a measuring device) at 23° C., 55% RH of from 0.5 to 50 mmHg (≈0.0665 to 6.65 kPa (≈ means "about" ), and Ra of from 0.05 to 0.4 μm, which can reduce a great number of micro voids by which the image-receiving layer and the image-forming layer cannot be brought into contact with each other at the contact area, which is preferred in the point of transfer and image quality. The Ra value can be measured by a surface roughness meter (Surfcom, manufactured by Tokyo Seiki Co., Ltd.) according to JISB0601. It is preferred that the surface hardness of the image-forming layer is 10 g or more when measured with a sapphire needle. When the image-forming layer is electrically charged according to U.S. test standard 4046 and then grounded, the electrification potential 1 second after grounding of the image-forming layer is preferably from −100 to 100 V. It is preferred that the surface resistance of the image-forming layer at 23° C., 55% RH is $10^9$ Ω or less.

In the next place, the image-receiving sheet which can be used in combination with the thermal transfer sheet is described below.

Image-receiving Sheet

Layer Constitution

The constitution of the image-receiving sheet generally comprises a support having provided thereon one or more image-receiving layer(s) and, if necessary, any one or two or more layer(s) of a cushioning layer, a releasing layer and an intermediate layer is(are) provided between the support and the image-receiving layer. It is preferred in view of conveyance to provide a backing layer on the surface of the support opposite to the side on which the image-receiving layer is provided.

Support

A plastic sheet, a metal sheet, a glass sheet, a resin-coated paper, a paper, and ordinary sheet-like substrate materials, e.g., various complexes, are used as the support. As the examples of plastic sheets, a polyethylene terephthalate sheet, a polycarbonate sheet, a polyethylene sheet, a polyvinyl chloride sheet, a polyvinylidene chloride sheet, a polystyrene sheet, a styrene-acrylonitrile sheet, and a polyester sheet can be exemplified. As the examples of papers, an actual printing paper and a coated paper can be used.

It is preferred for the support to have minute voids in view of capable of improving the image quality. Such supports can be produced by mixing a thermoplastic resin and a filler comprising an inorganic pigment and a high polymer incompatible with the above thermoplastic resin to thereby prepare a mixed melt, extruding the mixed melt by a melt extruder to prepare a monolayer or multilayer film, and further monoaxially or biaxially stretching the film. In this step, the void ratio is determined by the selection of the resin and the filler, a mixing ratio and stretching condition.

As the thermoplastic resins, a polyolefin resin, such as polypropylene, and a polyethylene terephthalate resin are preferred, since they are excellent in crystallizability and orientation property and voids can be formed easily. It is preferred to use the polyolefin resin or the polyethylene terephthalate resin as the main component and use a small amount of other thermoplastic resin arbitrarily in combination. The inorganic pigments for use as the filler preferably have an average particle size of from 1 to 20 μm, e.g., calcium carbonate, clay, diatomaceous earth, titanium oxide, aluminum hydroxide and silica can be used. As the incompatible resins for use as the filler, when polypropylene is used as the thermoplastic resin, it is preferred to combine polyethylene terephthalate as the filler. A support having minute voids is disclosed in detail in Japanese Patent Application No. 11-290570.

The content of the filler, e.g., an inorganic pigment, in the support is generally from 2 to 30% or so by volume.

The thickness of the support in the image-receiving sheet is generally from 10 to 400 μm, preferably from 25 to 200 μm. For enhancing the adhesion with the image-receiving layer (or the cushioning layer) or with the image-forming layer in the thermal transfer sheet, the surface of the support in the image-receiving sheet may be subjected to surface treatment, e.g., corona discharge treatment and glow discharge treatment.

Image-receiving Layer

It is preferred to provide one or more image-receiving layer(s) on the support in the image-receiving sheet for transferring and fixing the image-forming layer on the image-receiving sheet. The image-receiving layer is preferably a layer formed with an organic polymer binder as the main component. The binders are preferably thermoplastic resins, such as homopolymers and copolymers of acryl-based monomers, e.g., acrylic acid, methacrylic acid, acrylic ester, and methacrylic ester, cellulose-based polymers, e.g., methyl cellulose, ethyl cellulose and cellulose acetate, homomonomers and copolymers of vinyl-based monomers, e.g., polystyrene, polyvinyl pyrrolidone, polyvinyl butyral, polyvinyl alcohol and polyvinyl chloride, condensed polymers, e.g., polyester and polyamide, and rubber-based polymers, e.g., butadiene-styrene copolymer. The binder for use in the image-receiving layer is preferably a polymer having a glass transition temperature (Tg) of 90° C. or lower for obtaining appropriate adhesion with the image-forming layer. For that purpose, it is possible to added a plasticizer to the image-receiving layer. The binder polymer preferably has Tg of 30° C. or more for preventing blocking between sheets. As the binder polymer of the image-receiving layer, the same at lest one monomer unit as at least one monomer unit constituting the binder polymer of the image-forming layer is preferably used from the point of improving the adhesion with the image-forming layer at laser recording and improving sensitivity and image strength.

It is preferred that the image-receiving layer surface has a smooster value at 23° C., 55% RH of from 0.5 to 50 mmHg (≈0.0665 to 6.65 kPa), and Ra of from 0.05 to 0.4 $\mu$m, which can reduce a great number of micro voids by which the image-receiving layer and the image-forming layer cannot be brought into contact with each other at the contact area, which is preferred in the point of transfer and image quality. The Ra value can be measured by a surface roughness meter (Surfcom, manufactured by Tokyo Seiki Co., Ltd.) according to JIS B0601. When the image-receiving layer is electrically charged according to U.S. test standard 4046 and then grounded, the electrification potential 1 second after grounding of the image-receiving layer is preferably from −100 to 100 V. It is preferred that the surface resistance of the image-receiving layer at 23° C., 55% RH is $10^9\Omega$ or less. It is preferred that the coefficient of static friction of the surface of the image-receiving layer is 0.2 or less. It is preferred that the surface energy of the surface of the image-receiving layer is from 23 to 35 mg/m$^2$.

When the image once formed on the image-receiving layer is re-transferred to the actual printing paper, it is also preferred that at least one image-receiving layer is formed of a photo-setting material. As the composition of such a photo-setting material, combination comprising a) a photo-polymerizable monomer comprising. at least one kind of a polyfunctional vinyl or vinylidene compound which can form a photopolymer by addition polymerization, b) an organic polymer, and c) a photopolymerization initiator, and, if necessary, additives, e.g., a thermal polymerization inhibitor can be exemplified. As the above polyfunctional vinyl monomer, unsaturated ester of polyol, in particular, an acrylic or methacrylic ester (ethylene glycol diacrylate, pentaerythritol tetraacrylate) is used.

As the organic polymer, the polymers for use for forming the image-receiving layer can be exemplified. As the photopolymerization initiator, an ordinary photo-radical polymerization initiator, e.g., benzophenone and Michler's ketone, can be used in proportion of from 0.1 to 20 mass % in the layer.

The thickness of the image-receiving layer is generally from 0.3 to 7 $\mu$m, preferably from 0.7 to 4 $\mu$m. When the thickness of the image-receiving layer is 0.3 $\mu$m or more, the film strength can be ensured at re-transferring to the actual printing paper. While when it is 4 $\mu$m or less, the glossiness of the image after re-transferring to the actual printing paper can be suppressed, thus the approximation to the printed matter can be improved.

Other Layers

A cushioning layer may be provided between the support and the image-receiving layer. When a cushioning layer is provided, it is possible to increase the adhesion of the image-forming layer and the image-receiving layer at heat transfer by laser and the image quality can be improved. Further, even if foreign matters enter between the thermal transfer sheet and the image-receiving sheet during recording, the voids between the image-receiving layer and the image-forming layer are reduced by the deforming action of the cushioning layer, as a result the size of image defect such as blank area can be made small. Further, when the image formed by transfer is re-transferred to the actual printing paper, since the surface of the image-receiving layer is deformed according to the surface unevenness of the paper, the transferring property of the image-receiving layer can be improved. Further, by reducing the glossiness of the transferred image, the approximation to the printed matter can be improved.

The cushioning layer is formed to be liable to be deformed when stress is laid on the image-receiving layer, hence for obtaining the above effect, the cushioning layer preferably comprises materials having a low modulus of elasticity, materials having elasticity of a rubber, or thermoplastic resins easily softened by heat. The modulus of elasticity of the cushioning layer at room temperature is preferably from 0.5 MPa to 1.0 GPa, more preferably from 1 MPa to 0.5 GPa, and particularly preferably from 10 to 100 MPa. For burying foreign matters such as dust, the penetration according to JIS K2530 (25° C., 100 g, 5 seconds) is preferably 10 or more. The cushioning layer has a glass transition temperature of 80° C. or less, preferably 25° C. or less, and a softening point of preferably from 50 to 200° C. It is also preferred to add a plasticizer to the binder for controlling these physical properties, e.g., Tg.

As the specific materials for use as the binder of the cushioning layer, besides rubbers, e.g., urethane rubber, butadiene rubber, nitrile rubber, acryl rubber and natural rubber, polyethylene, polypropylene, polyester, styrene-butadiene copolymer, ethylene-vinyl acetate copolymer, ethylene-acryl copolymer, vinyl chloride-vinyl acetate copolymer, vinylidene chloride resin, vinyl chloride resin containing a plasticizer, polyamide resin and phenol resin can be exemplified.

The thickness of the cushioning layer varies according to the resins used and other conditions, but is generally from 3 to 100 $\mu$m, preferably from 10 to 52 $\mu$m.

It is necessary that the image-receiving layer and the cushioning layer are adhered to each other until the stage of laser recording, but it is preferred that they are designed to be releasable for transferring an image to the actual printing paper. For easy release, it is also preferred to provide a releasing layer having a thickness of from 0.1 to 2 $\mu$m or so between the cushioning layer and the image-receiving layer. When the thickness of the releasing layer is too thick, the properties of the cushioning layer are difficult to be exhibited, thus it is necessary to adjust the thickness by the kind of the releasing layer.

The specific examples of the binders of the releasing layer include thermo-setting resins having Tg of 65° C. or more, e.g., polyolefin, polyester, polyvinyl acetal, polyvinyl formal, polyparabanic acid, methyl polymethacrylate, polycarbonate, ethyl cellulose, nitrocellulose, methyl cellulose, carboxymethyl cellulose, hydroxypropyl cellulose, polyvinyl alcohol, polyvinyl chloride, urethane resin, fluorine resin, styrenes, e.g., polystyrene and acrylonitrile styrene, crosslinked products of these resins, polyamide, polyimide, polyether imide, polysulfone, polyether sulfone, aramid, and hardened products of these resins. As the hardening agent, generally used hardening agents, e.g., isocyanate and melamine, can be used.

When the binders of the releasing layer are selected by taking the above physical properties into consideration, polycarbonate, acetal and ethyl cellulose are preferred in view of the storage stability, and further, when acrylate resins are added to the image-receiving layer, releasability at re-transferring of the image after laser heat transfer becomes good and preferred.

Further, a layer whose adhesion with the image-receiving layer extremely lowers by cooling can be used as the releasing layer. Specifically, layers containing heat fusion compounds such as waxes and binder, and thermoplastic resins as the main component can be used as such a layer.

The examples of the heat fusion compounds are disclosed in JP-A-63-193886. In particular, micro crystalline wax, paraffin wax, and carnauba wax are preferably used. As the thermoplastic resins, ethylene-based copolymers, e.g., ethylene-vinyl acetate resins and cellulose-based resins are preferably used.

As the additives, higher fatty acid, higher alcohol, higher fatty acid ester, amides, and higher amine can be added to the releasing layer, according to necessity.

As another constitution of the releasing layer, there is a layer which has releasability by causing cohesive failure due to fusion or softening by heating. It is preferred to add a supercooling substance to such a releasing layer.

As the supercooling substance, poly-ϵ-caprolactone, polyoxyethylene, benzotriazole, tribenzylamine and vanillin can be exemplified.

Still another constitution of the releasing layer, a compound to reduce the adhesion with the image-receiving layer is added to the releasing layer. As such compounds, silicone-based resins, e.g., silicone oil; Teflon, fluorine-based resins, e.g., fluorine-containing acrylate resin; polysiloxane resins; acetal-based resins, e.g., polyvinyl butyral, polyvinyl acetal and polyvinyl formal; solid waxes, e.g., polyethylene wax and amide wax; and fluorine-based and phosphoric ester-based surfactants can be exemplified.

The releasing layer can be prepared by dissolving the above materials in a solvent or dispersing the above materials in a latex state, and coating the above solution or dispersion on the cushioning layer by a blade coater, a roll coater, a bar coater, a curtain coater, or gravure coater, or extrusion lamination by hot melt. As another method, the solution or dispersion obtained by dissolving the above materials in a solvent or dispersing the above materials in a latex state is coated on a temporary base by the above coating method, the temporary base is adhered with the cushioning layer, and then the temporary base is released.

In the image-receiving sheet to be combined with the thermal transfer sheet, the image-receiving layer may double as the cushioning layer, and in that case, the image-receiving sheet may take the constitution such as support/cushioning image-receiving layer, or support/undercoat layer/cushioning image-receiving layer. In this case, it is also preferred that cushioning image-receiving layer has releasability so that re-transferring to the actual printing paper is possible. In this case, the image after being re-transferred to the actual printing paper becomes a glossy image.

The thickness of the cushioning image-receiving layer is from 5 to 100 μm, preferably from 10 to 40 μm.

It is preferred to provide a backing layer on the side of the support of the image-receiving sheet opposite to the side on which the image-receiving layer is provided for improving the traveling property of the image-receiving sheet. When a surfactant, an antistatic agent, e.g., fine particles of tin oxide, and a matting agent, e.g., silicon oxide and PMMA particles, are added to the backing layer, the traveling property in the recording unit is improved.

These additives can be added not only to the backing layer but also to the image-receiving layer and other layers, if desired. The kinds of the additives cannot be prescribed unconditionally according to purposes, but a matting agent having an average particle size of from 0.5 to 10 μm can be added in concentration of from 0.5 to 80% or so, and an antistatic agent can be added by selecting arbitrarily from among various surfactants and electrically conductive agents so that the surface resistance of the layer at 23° C., 50% RH becomes preferably $10^{12}\Omega$ or less, more preferably $10^{9}\Omega$ or less.

As the binder for use in the backing layer, widely used polymers can be used, e.g., gelatin, polyvinyl alcohol, methyl cellulose, nitrocellulose, acetyl cellulose, aromatic polyamide resin, silicone resin, epoxy resin, alkyd resin, phenol resin, melamine resin, fluorine resin, polyimide resin, urethane resin, acryl resin, urethane-modified silicone resin, polyethylene resin, polypropylene resin, polyester resin, Teflon resin, polyvinyl butyral resin, vinyl chloride-based resin, polyvinyl acetate, polycarbonate, organic boron compounds, aromatic esters, polyurethane fluoride, and polyether sulfone can be used.

When crosslinkable water-soluble binder is used as the binder of the backing layer and crosslinked, dropout prevention of a matting agent and scratch resistance of the backing layer are improved, further it is effective for blocking during storage.

The crosslinking means can be selected with no limitation from heat, actinic rays and pressure, according to the characteristics of the crosslinking agent to be used, and these may be used alone or in combination. For providing an adhering property to the support, an arbitrary adhesion layer may be provided on the same side of the support on which the backing layer is provided.

Organic or inorganic fine particles are preferably added to the backing layer as the matting agent. As the organic matting agent, polymethyl methacrylate (PMMA), polystyrene, polyethylene, polypropylene, fine particles of other radical polymers, and condensed polymers such as polyester and polycarbonate are exemplified.

The backing layer is preferably provided in an amount of about 0.5 to 5 $g/m^2$. When the amount is less than 0.5 $g/m^2$, coating property is unstable and a problem of dropout of the matting agent is liable to occur. While when the coating amount greatly exceeds 5 $g/m^2$, the preferred particle size of the matting agent becomes extremely large and embossing of the image-receiving layer surface by the backing layer is caused during storage, and in the heat transfer of a thin image-forming layer, the dropout of the recorded image and unevenness are liable to occur.

The number average particle size of the matting agent is preferably larger than the layer thickness of the backing layer containing only a binder by 2.5 to 20 μm. Of the matting agents, particles having a particle size of 8 μm or more are necessary to be present in an amount of 5 mg/m or more, preferably from 6 to 600 $mg/m^2$, by which the defect due to foreign matters can be improved. Further, when a matting agent of narrow particle size distribution is used, i.e., when a matting agent having the value obtained by dividing the standard deviation of the particle size distribution by the number average particle size, $\sigma/\gamma n$ (the variation coefficient of particle size distribution) of 0.3 or less is used, the defect which occurs when particles having an extraordinary big particle size are used can be improved, and further, the desired performance can be obtained with the less addition amount. The variation coefficient is more preferably 0.15 or less.

It is preferred to add an antistatic agent to the backing layer for the purpose of preventing adhesion of foreign matters due to the frictional electrification with a carrier roller. As the antistatic agent, a cationic surfactant, an anionic surfactant, a nonionic surfactant, a high molecular antistatic agent, electrically conductive fine particles, in addition, the compounds described in 11290 *no Kagaku Shohin* (11290 Chemical *Commercial Products*), pp. 875 and 876, Kagaku Kogyo Nippo-Sha can be widely used.

As antistatic agents which can be used in the backing layer in combination, of the above compounds, metallic oxide, e.g., carbon black, zinc oxide, titanium oxide and tin oxide, and electrically conductive fine particles, e.g., organic semiconductors, are preferably used. In particular, when electrically conductive fine particles are used, the dissociation of the antistatic agent from the backing layer can be prevented, and stable antistatic effect can be obtained irrespective of the surroundings.

It is also possible to add a mold-releasing agent, e.g., various activators, silicone oil, and fluorine resins, to the backing layer for providing a coating property and a mold-releasing property.

When the softening point of the cushioning layer and the image-receiving layer measured by TMA (Thermomechanical Analysis) is 70° C. or lower, the backing layer is particularly effective.

TMA softening point is obtained by observing the phase of the object with increasing the temperature of the object of observation at constant rate and applying a constant load to the object. In the present invention, the temperature at the time when the phase of the object begins to change is defined as TMA softening point. The softening point by TMA can be measured with an apparatus such as Thermoflex (manufactured by Rigaku Denki-Sha).

The thermal transfer sheet and the image-receiving sheet can be used in image forming as the laminate by superposing the image-forming layer in the thermal transfer sheet and the image-receiving layer in the image-receiving sheet.

The laminate of the thermal transfer sheet and the image-receiving sheet can be produced by various methods. For example, the laminate can be easily obtained by superposing the image-forming layer in the thermal transfer sheet and the image-receiving layer in the image-receiving sheet and passing through a pressure and heating roller. The heating temperature in this case is 160° C. or less, preferably 130° C. or less.

The above-described vacuum adhesion method can also be preferably used for obtaining the laminate. The vacuum adhesion method is a method of winding the image-receiving sheet around the drum provided with suction holes for vacuum sucking, and then vacuum-adhering the thermal transfer sheet of a little larger size than the image-receiving sheet on the image-receiving sheet with uniformly blasting air by a squeeze roller. As other method, a method of mechanically sticking the image-receiving sheet on a metal drum with pulling the image-receiving sheet, and further mechanically sticking the thermal transfer sheet thereon with pulling in the same manner can also be used. Of these methods, the vacuum adhesion method is especially preferred in the point of requiring no temperature control and capable of effecting lamination rapidly and uniformly.

EXAMPLE

The present invention will be described in detail with reference to the examples below but the present invention is not limited thereto at all. In the examples, "parts" means "parts by mass" unless otherwise indicated.

Example 1

Example 1-1

Preparation of Thermal Transfer Sheet (Cyan)

A coating solution having the composition shown below was coated on a PET (polyethylene terephthalate film T100, #100, manufactured by Dia Foil Hoechist Co., Ltd.) support having a thickness of 100 μm by a reverse roll coater and dried, thereby an intermediate layer (a cushioning layer) having a dry thickness of 7 μm was obtained.

| Intermediate layer coating solution | |
|---|---|
| SEBS (Clayton G1657, manufactured by Shell Chemical Co., Ltd.) | 14 parts |
| Tackifier (Super Ester A100, manufactured by Arakawa Kagaku Co., Ltd.) | 6 parts |
| Methyl ethyl ketone | 10 parts |
| Toluene | 80 parts |

In the next place, a coating solution for a photothermal converting layer having the composition shown below was coated on the above intermediate layer by wire bar coating and dried, thereby a photothermal converting layer having a transmission absorptance at wavelength 808 nm of 0.93 was formed. As the preparation procedure, after the prescribed amounts of water and isopropyl alcohol were added to the aqueous solution of PVA, the carbon black dispersion was gradually added thereto to suppress the increment of particle sizes.

| Photothermal converting layer coating solution | |
|---|---|
| PVA (Gosenol EG-30, manufactured by Nippon Gosei Kagaku Co. Ltd., 10 mass % aq. soln.) | 63 parts |
| Carbon black dispersion (SD-9020, manufactured by Dainippon Chemicals and Ink Co., Ltd.) | 9 parts |
| Water | 10 parts |
| Isopropyl alcohol | 18 parts |

Subsequently, a coating solution for a cyan image-forming layer having the composition shown below was coated on the photothermal converting layer in a dry thickness of from 0.55 μm, thereby a cyan image-forming layer was formed. The reflection optical density $OD_r$ of the thus-formed image-forming layer was 1.59.

| Cyan image-forming layer coating solution | |
|---|---|
| Cyan pigment dispersion for cyan image-forming layer (MHI Blue #454, manufactured by Mikuni Shikiso Co., Ltd., methyl ethyl ketone dispersion, solid content: 35%, pigment: 30%) | 14.5 parts |
| Styrene/acrylate resin (Haimer SBM 3F, manufactured by Sanyo Chemical Industries, Co., Ltd., a 40 mass % MEK solution) | 34.7 parts |
| EVA (EV-40Y, manufactured by Mitsui Du Pont Polychemical Co., Ltd., a 10 mass % MEK solution) | 8.8 parts |
| Fluorine surfactant Sarfron S-382, manufactured by Asahi Glass Co., Ltd.) | 0.4 parts |
| Methyl ethyl ketone | 20.0 parts |
| Cyclohexanone | 21.6 parts |

A coating solution for a back coat layer having the composition shown below was then coated on the back surface of the above ink sheet by wire bar coating and dried to form a back coat layer (BC layer) having a dry thickness of 1 μm and protrusions by the matting agent, thereby a cyan thermal transfer sheet was obtained.

Preparation of Image-receiving Sheet

A coating solution for a cushioning intermediate layer and a coating solution for an image-receiving layer each having the composition shown below were prepared.

| | |
|---|---|
| 1) Cushioning intermediate layer coating solution | |
| Vinyl chloride-vinyl acetate copolymer (MPR-TSL, manufactured by Nisshin Kagaku Co., Ltd.) | 20 parts |
| Plasticizer (Paraplex G-40, manufactured by CP. HALL. COMPANY) | 10 parts |
| Surfactant (Megafac F-177, manufactured by Dainippon Chemicals and Ink Co., Ltd.) | 0.5 parts |
| Antistatic agent (SAT-5 Supper (IC), manufactured by Nippon Junyaku Co., Ltd.) | 0.3 parts |
| Methyl ethyl ketone | 60 parts |
| Toluene | 10 parts |
| N,N-Dimethylformamide | 3 parts |
| 2) Image-receiving layer coating solution | |
| Polyvinyl butyral (Eslec B BL-SH, manufactured by Sekisui Chemical Industries, Ltd.) | 8 parts |
| Antistatic agent Sanstat 2012A, manufactured by Sanyo Chemical Industries, Co., Ltd.) | 0.7 parts |
| Surfactant (Megafac F-177, manufactured by Dainippon Chemicals and Ink Co., Ltd.) | 0.1 part |
| n-Propyl alcohol | 20 parts |
| Methanol | 20 parts |
| 1-Methoxy-2-propanol | 50 parts |

The above-prepared coating solution for forming a cushioning intermediate layer was coated on a white PET support (Lumiller E-58, manufactured by Toray Industries Inc., thickness: 130 μm) using a narrow-broad coater and the coated layer was dried, and then the coating solution for an image-receiving layer was coated and dried, thereby an image-receiving sheet was prepared. The coating amounts were controlled so that the layer thickness of the cushioning intermediate layer after drying became about 20 μm and the layer thickness of the image-receiving layer became about 2 μm. The prepared image-receiving sheet was wound in a roll, stored at room temperature for one week.

Example 1-2

Preparation of Thermal Transfer Sheet (Cyan)

A cyan thermal transfer sheet was prepared in the same manner as in Example 1 except for changing the cyan image-forming layer coating solution to the composition shown below.

| | |
|---|---|
| Composition of cyan pigment dispersion mother solution | |
| Polyvinyl butyral (Eslec B BL-SH, manufactured by Sekisui Chemical Industries, Ltd.) | 12.6 parts |
| Cyan pigment (Pigment Blue 15, #700-10 FG CY-Blue) | 15.0 parts |
| Dispersion assistant (PW-36, manufactured by Kusumoto Kasei Co., Ltd.) | 0.8 parts |
| n-Propyl alcohol | 110 parts |

-continued

| | |
|---|---|
| Composition of cyan image-forming layer coating solution | |
| Above cyan pigment dispersion mother solution | 118 parts |
| Polyvinyl butyral (Eslec B BL-SH, manufactured by Sekisui Chemical Industries, Ltd.) | 5.2 parts |
| Wax-based compound | |
| Stearic acid amide (Newtron 2, manufactured by Nippon Seika Co., Ltd.) | 1.0 part |
| Behenic acid amide (Diamid BM, (manufactured by Nippon Kasei Co., Ltd.) | 1.0 part |
| Lauric acid amide (Diamid Y, (manufactured by Nippon Kasei Co., Ltd.) | 1.0 part |
| Palmitic acid amide (Diamid KP, (manufactured by Nippon Kasei Co., Ltd.) | 1.0 part |
| Erucic acid amide (Diamid L-200, (manufactured by Nippon Kasei Co., Ltd.) | 1.0 part |
| Oleic acid amide (Diamid O-200, (manufactured by Nippon Kasei Co., Ltd.) | 1.0 part |
| Rosin (KE-311, (manufactured by Arakawa Kagaku Co., Ltd.) | 2.8 parts |
| Pentaerythritol tetraacrylate (NK ester A-TMMT, manufactured by Shin-Nakamura Kagaku Co., Ltd.) | 1.7 parts |
| Surfactant (Megafac F-176PF, solid content: 20%, manufactured by Dainippon Chemicals and Ink Co., Ltd.) | 1.7 parts |
| n-Propyl alcohol | 890 parts |
| Methyl ethyl ketone | 247 parts |

Preparation of Image-receiving Sheet

An image-receiving sheet was prepared in the same manner as in Example 1-1.

Comparative Example 1-1

Preparation of Thermal Transfer Sheet (Cyan)

A cyan thermal transfer sheet was prepared in the same manner as in Example 1-1.

Preparation of Image-receiving Sheet

| Cushioning layer coating solution | |
|---|---|
| PVA (Gosenol EG-30, manufactured by Nippon Gosei Kagaku Co. Ltd., 10 mass % aq. soln.) | 81 parts |
| Melamine resin (Sumirase Resin 613, manufactured by Sumitomo Chemical Industry Co., Ltd.) | 8 parts |
| Amine salt (Sumirase Resin ACX-P, manufactured by Sumitomo Chemical Industry Co., Ltd.) | 1 part |
| Fluorine resin (Sumirase Resin FP-150, manufactured by Sumitomo Chemical Industry Co., Ltd.) | 5 parts |
| Matting agent (10 mass % dispersion of PMMA having a particle size of 26 μm) | 5 parts |

A coating solution for a back coat layer having the composition shown below was coated on a PET (polyethylene terephthalate film T100, manufactured by Dia Foil Hoechist Co., Ltd.) film having a thickness of 100 μm by wire bar coating in a dry thickness of 1.0 μm and dried, and then an acryl-based latex (Iodosol AD92K, manufactured by Kanebo NSC Co., Ltd.) was coated on the surface of the PET film opposite to the back coat layer by an applicator in a dry thickness of about 35 $\mu$m, thereby a cushioning layer was formed.

In the next place, a coating solution for a releasing layer having the composition shown below was coated on the cushioning layer by wire bar coating and dried, thereby a releasing layer having a dry thickness of 1.3 $\mu$m was formed. Further, a coating solution for a back coat layer having the composition shown below was coated on the side of the support opposite to the side on which the cushioning layer was coated and dried, thereby a back coat layer having a dry thickness of 1.6 $\mu$m was formed.

| | |
|---|---|
| Back coat layer coating solution | |
| PVA (Gosenol EG-30, manufactured by Nippon Gosei Kagaku Co. Ltd., 10 mass % aq. soln.) | 9.4 parts |
| Matting agent (10 mass % water dispersion of PMMA having a particle size of 6 $\mu$m) | 5 parts |
| Water | 90 parts |
| Releasing layer coating solution | |
| Ethyl cellulose (Ethocel 10, manufactured by Dow Chemical Co.) | 10 parts |
| Isopropyl alcohol | 90 parts |

Subsequently, a coating solution for an image-receiving layer having the composition shown below was coated on the releasing layer so that the dry thickness of the part where the matting agent was not present became 1.0 $\mu$m, thereby an image-receiving sheet was obtained.

| Image-receiving layer coating solution | |
|---|---|
| Acryl resin latex (Iodosol A5805, manufactured by Kanebo NSC Co., Ltd.) | 30.4 parts |
| Matting agent (25 mass % water dispersion of PMMA having a particle size of 2 $\mu$m) | 1.9 parts |
| Fluorine-based surfactant (FP-150, manufactured by Sumitomo Chemical Industry Co., Ltd.) | 5.7 parts |
| Water | 60 parts |
| Isopropyl alcohol | 2 parts |

Formation of Transferred Image

The above-prepared image-receiving sheet (56 cm×79 cm) was wound around the rotary drum having a diameter of 25 cm provided with vacuum suction holes having a diameter of 1 mm (surface density of 1 hole in the area of 3 cm×8 cm) and vacuum sucked. Subsequently, the above thermal transfer sheet (cyan) cut to a size of 61 cm×84 cm was superposed on the image-receiving sheet so as to deviate uniformly, squeezed by a squeeze roller, and adhered and laminated so that the suction holes sucked in air. The degree of pressure reduction in the state of suction holes being covered was −150 mmHg per 1 atm (≈81.13 kPa). The drum was rotated and semiconductor laser beams of the wavelength of 808 nm were condensed from the outside on the surface of the laminate on the drum so that the laser beams became a spot of a diameter of 7 $\mu$m on the surface of the photothermal converting layer, and laser image recording (image line) was performed on the laminate by moving the laser beam at a right angle (by-scanning) to the rotary direction of the drum (main scanning direction). The condition of irradiation was as follows. The laser beams used in the Example was multi-beam two dimensional array comprising five rows along the main scanning direction and three rows along the by-scanning direction forming a parallelogram.

Laser power: 110 mW

Main scanning velocity: 6 m/sec

By-scanning pitch: 6.35 $\mu$m

The laminate after laser recording was detached from the drum and the thermal transfer sheet was released from the image-receiving sheet by hands. It was confirmed that only the domain irradiated with laser beams of the image-forming layer of the thermal transfer sheet had been transferred from the thermal transfer sheet to the image-receiving sheet.

Evaluation of Transferred Image

1) Sensitivity Evaluation

The transferred image was observed with an optical microscope. The area irradiated with laser beams was recorded linearly. The recorded line width was measured and sensitivity was obtained according to the following equation.

$$\text{Sensitivity (mJ/cm}^2) = [\text{laser power P (mW)}]/[\text{line width d (cm)} \times \text{linear velocity (cm/s)}]$$

2) Definition

The transferred image used for the above sensitivity evaluation was observed with an optical microscope and evaluated according to the following ranking.

A: Excellent

B: A little inferior in sharpness

C: Thinning of the line and bridging were observed and considerably inferior

The results of the evaluation are shown in Table 1 below.

The contact angle with water of each of the image-forming layer and the image-receiving layer was measured and computed by a contact angle meter CA-A model (manufactured by Kyowa Kaimen Kagaku Co., Ltd.).

The reflection optical density of the image-forming layer was obtained by measuring the image transferred to Tokuryo art paper which had been transferred from the thermal transfer sheet to the image-receiving sheet by color mode of cyan (C) color with a densitometer (X-rite 938, manufactured by X-rite Co.).

TABLE 1

| | $OD_r$/Layer Thickness of Image-Forming Layer | Contact Angle of Image-Forming Layer | Contact Angle of Image-Receiving Layer | Difference in Contact Angle with Water of Image-Forming Layer and Image-Receiving Layer | Sensitivity (mJ/cm$^2$) | Definition |
|---|---|---|---|---|---|---|
| Example 1-1 | 2.89 | 84° | 72° | 12° | 305 | A |
| Example 1-2 | 4.54 | 95° | 72° | 23° | 332 | A |

TABLE 1-continued

| | $OD_r$/Layer Thickness of Image-Forming Layer | Contact Angle of Image-Forming Layer | Contact Angle of Image-Receiving Layer | Difference in Contact Angle with Water of Image-Forming Layer and Image-Receiving Layer | Sensitivity ($mJ/cm^2$) | Definition |
|---|---|---|---|---|---|---|
| Comparative Example 1-1 | 2.89 | 84° | 5° | 79° | 415 | C |

Example 2

Example 2-1

Preparation of Thermal Transfer Sheet K (Black)

Formation of Backing Layer

| Preparation of first backing layer coating solution | |
|---|---|
| Water dispersion solution of acrylate resin (Julymer ET410, 20 mass %, manufactured by Nippon Junyaku Co., Ltd.) | 2 parts |
| Antistatic agent (water dispersion of tin oxide-antimony oxide, average particle size: 0.1 μm, 17 mass %) | 7.0 parts |
| Polyoxyethylenephenyl ether | 0.1 part |
| Melamine compound (Sumitec Resin M-3, manufactured by Sumitomo Chemical Industry Co., Ltd.) | 0.3 parts |
| Distilled water to make the total amount | 100 parts |

Formation of First Backing Layer

One surface (back surface) of a biaxially stretched polyethylene terephthalate support (Ra of both surfaces was 0.01 μm) having a thickness of 75 μm was subjected to corona discharge treatment, and the first backing layer coating solution was coated in dry coating thickness of 0.03 μm, dried at 180° C. for 30 seconds, thereby a first backing layer was prepared. The Young's modulus of the support in the machine direction was 450 $kg/mm^2$ (≈4.45 GPa), and the Young's modulus of the support in the transverse direction was 500 $kg/mm^2$ (≈4.9 GPa). The F-5 value of the support in the machine direction was 10 $kg/mm^2$ (≈98 MPa), and the F-5 value of the support in the transverse direction was 13 $kg/mm^2$ (≈127.4 MPa), the heat shrinkage at 100° C. for 30 minutes of the support in the machine direction was 0.3%, and that in the transverse direction was 0.1%. The breaking strength was 20 $kg/mm^2$ (≈196 MPa) in the machine direction, and that in the transverse direction was 25 $kg/mm^2$ (≈245 MPa), and the modulus of elasticity was 400 $kg/mm^2$ (≈3.9 GPa).

| Preparation of second backing layer coating solution | |
|---|---|
| Polyolefin (Chemipearl S-120, 27 mass %, manufactured by Mitsui Petrochemical Industries, Ltd.) | 3.0 parts |
| Antistatic agent (water dispersion of tin oxide-antimony oxide, average particle size: 0.1 μm, 17 mass %) | 2.0 parts |
| Colloidal silica (Snowtex C, 20 mass %, manufactured by Nissan Chemical Industries, Ltd.) | 2.0 parts |
| Epoxy resin (Dinacole EX-614B, manufactured by Nagase Kasei Co., Ltd.) | 0.3 parts |

-continued

| Preparation of second backing layer coating solution | |
|---|---|
| Sodium polystyrenesulfonate | 0.1 parts |
| Distilled water to make the total amount | 100 parts |

Formation of Second Backing Layer

The second backing layer coating solution was coated on the first backing layer in dry coating thickness of 0.03 μm, dried at 170° C. for 30 seconds, thereby a second backing layer was prepared.

Formation of Photothermal Converting Layer

Preparation of Photothermal Converting Layer Coating Solution

The following components were mixed with stirring by a stirrer and a photothermal converting layer coating solution was prepared.

| Composition of photothermal converting layer coating solution | |
|---|---|
| Infrared absorbing dye (NK-2014, manufactured by Nippon Kanko Shikiso Co., Ltd., cyanine dye having the following composition) | 7.6 parts |
| 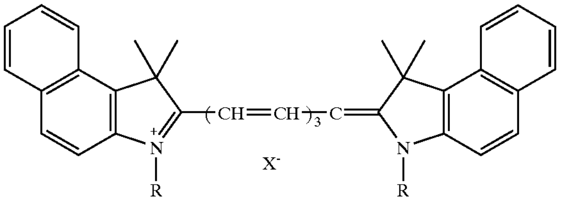 In the formula, R represents $CH_3$, and $X^-$ represents $ClO_4^-$. | |
| Polyvinyl butyral (PVB-2000L, manufactured by Electro Chemical Industry Co., Ltd.) | 29.3 parts |
| Exson naphtha | 5.8 parts |
| N-Methylpyrrolidone (NMP) | 1,500 parts |
| Methyl ethyl ketone | 360 parts |
| Surfactant (Megafac F-176PF, manufactured by Dainippon Chemicals and Ink Co., Ltd., fluorine surfactant) | 0.5 parts |
| Dispersion of matting agent having the following composition | 14.1 parts |

Preparation of Dispersion of Matting Agent

Ten parts of spherical silica fine particles having an average particle size of 1.5 μm (Sea Hoster-KE-P150, manufactured by Nippon Shokubai Co., Ltd.), 2 parts of dispersant polymer (acrylate-styrene copolymer, Joncryl 611, manufactured by Johnson Polymer Corporation), 16 parts of methyl ethyl ketone, and 64 parts of N-methylpyrrolidone were mixed, this mixture and 30 parts of glass beads having a diameter of 2 mm were put in a reaction vessel made of polyethylene having a capacity of 200 ml, and dispersed with a paint shaker (manufactured by Toyo Seiki Co., Ltd.) for 2 hours, thus a silica fine particle dispersion was obtained.

Formation of Photothermal Converting Layer on Support Surface

The above coating solution for a photothermal converting layer was coated with a wire bar coater on one surface of a polyethylene terephthalate film (support) having a thickness of 75 μm, and the coated product was dried in an oven at 120° C. for 2 minutes, thus a photothermal converting layer was formed on the support. The obtained photothermal converting layer had absorption near wavelength 808 nm, and the absorbance (optical density: OD) measured by UV-spectrophotometer UV-240 (manufactured by Shimadzu Seisakusho Co. Ltd.) was 1.03. The layer thickness of the photothermal converting layer measured by observing the cross section with a scanning electron microscope was 0.3 μm on average.

Formation of Image-forming Layer

Preparation of Black Image-forming Layer Coating Solution

Each of the following components was put in a kneading mill, and pre-treatment was performed while adding a small amount of solvent and applying a shear force. The solvent was further added to the dispersion so as to finally obtain the following composition, dispersion was performed for 2 hours in a sand mill, thereby the mother solution of a pigment dispersion was obtained.

| Composition of black pigment dispersion mother solution | |
|---|---|
| Composition 1 | |
| Polyvinyl butyral (PVB-2000L, manufactured by Electro Chemical Industry Co., Ltd.) | 12.6 parts |
| Pigment Black 7 (carbon black, C.I. No. 77266, Mitsubishi Carbon Black #5, manufactured by Mitsubishi Chemicals Co. Ltd., PVC blackness: 1) | 4.5 parts |
| Dispersion assistant (Solspers S-20000, manufactured by ICI) | 0.8 parts |
| n-Propyl alcohol | 79.4 parts |
| Composition 2 | |
| Polyvinyl butyral (PVB-2000L, manufactured by Electro Chemical Industry Co., Ltd.) | 12.6 parts |
| Pigment Black 7 (carbon black, C.I. No. 77266, Mitsubishi Carbon Black MA100, manufactured by Mitsubishi Chemicals Co., Ltd., PVC blackness: 10) | 10.5 parts |
| Dispersion assistant (Solspers S-20000, manufactured by ICI) | 0.8 parts |
| n-Propyl alcohol | 79.4 parts |

The following components were mixed with stirring by a stirrer to prepare a black image-forming layer coating solution.

| Composition of black imgage-forming layer coating solution | |
|---|---|
| Above black pigment dispersion mother solution (composition 1/composition 2: 70/30 (parts)) | 185.7 parts |
| Polyvinyl butyral (PVB-2000L, manufactured by Electro Chemical Industry Co., Ltd.) | 11.9 parts |

-continued

| Composition of black imgage-forming layer coating solution | |
|---|---|
| Wax-based compound | |
| Stearic acid amide (Newtron 2, manufactured by Nippon Seika Co., Ltd.) | 1.7 part |
| Behenic acid amide (Diamid BM, (manufactured by Nippon Kasei Co., Ltd.) | 1.7 part |
| Lauric acid amide (Diamid Y, (manufactured by Nippon Kasei Co., Ltd.) | 1.7 part |
| Palmitic acid amide (Diamid KP, (manufactured by Nippon Kasei Co., Ltd.) | 1.7 part |
| Erucic acid amide (Diamid L-200, (manufactured by Nippon Kasei Co., Ltd.) | 1.7 part |
| Oleic acid amide (Diamid O-200, (manufactured by Nippon Kasei Co., Ltd.) | 1.7 part |
| Rosin (KE-311, (manufactured by Arakawa Kagaku Co., Ltd.) (components: resin acid 80-97%, resin acid components: abietic acid: 30 to 40% neoabietic acid: 10 to 20% dihydroabietic acid: 14% tetrahydroabietic acid: 14%) | 11.4 parts |
| Surfactant (Megafac F-176PF, solid content: 20%, manufactured by Dainippon Chemicals and Ink Co., Ltd.) | 2.1 parts |
| Inorganic pigment (MEK-ST, 30% methyl ethyl ketone solution, manufactured by Nissan Chemical Industries, Ltd.) | 7.1 parts |
| n-Propyl alcohol | 1,050 parts |
| Methyl ethyl ketone | 295 parts |

It was found that the particles in the thus-obtained black image-forming layer coating solution had an average particle size of 0.25 μm, and the ratio of the particles having a particle size of 1 μm or more was 0.5% from the measurement by a particle size distribution measuring apparatus of laser scattering system.

Formation of Black Image-forming Layer on Photothermal Converting Layer Surface

The above black image-forming layer coating solution was coated for 1 minute with a wire bar coater on the surface of the photothermal converting layer, and the coated product was dried in an oven at 100° C. for 2 minutes, thus a black image-forming layer was formed on the photothermal converting layer. By the above procedure, a thermal transfer sheet comprising a support having thereon a photothermal converting layer and a black image-forming layer in this order (hereinafter referred to as thermal transfer sheet K, similarly, a thermal transfer sheet provided with a yellow image-forming layer is referred to as thermal transfer sheet Y, a thermal transfer sheet provided with a magenta image-forming layer is referred to as thermal transfer sheet M, and a thermal transfer sheet provided with a cyan image-forming layer is referred to as thermal transfer sheet C) was prepared.

The optical density (optical density: OD) of the black image-forming layer of the thus-obtained thermal transfer sheet K was 0.91 measured by Macbeth densitometer TD-904 (W filter), and the layer thickness of the black image-forming layer was 0.60 μm on average.

The obtained image-forming layer had the following physical properties.

The surface hardness of the image-forming layer with a sapphire needle is preferably 10 g or more, specifically 200 g or more.

The smooster value of the surface at 23° C., 55% RH is preferably from 0.5 to 50 mmHg (≈0.0665 to 6.65 kPa), and specifically 9.3 mmHg (≈1.24 kPa).-

The coefficient of static friction of the surface is preferably 0.2 or less, and specifically 0.08.

The surface energy was 29 $mJ/m^2$, and the contact angle with water was 94.8°. The reflection optical density was 1.82, the layer thickness was 0.60 μm, and $OD_r$/layer thickness (μm unit) was 3.03.

The deformation rate of the light-to-converting layer was 168% when recording was performed at linear velocity of 1 m/sec or more with laser beams having light strength at exposure surface of 1,000 $W/mm^2$ or more.

Preparation of Thermal Transfer Sheet Y

Thermal transfer sheet Y was prepared in the same manner as in the preparation of thermal transfer sheet K, except that the yellow image-forming layer coating solution having the following composition was used in place of the black image-forming layer coating solution. The layer thickness of the image-forming layer of the obtained thermal transfer sheet Y was 0.42 μm.

| | |
|---|---|
| **Composition of yellow pigment dispersion mother solution Composition 1 of yellow pigment** | |
| Polyvinyl butyral (PVB-2000L, manufactured by Electro Chemical Industry Co., Ltd.) | 7.1 parts |
| Pigment Yellow 180 (C.I. No. 21290) (Novoperm Yellow P-HG, manufactured by Clariant Japan, K. K.) | 12.9 parts |
| Dispersion assistant (Solspers S-20000, manufactured by ICI) | 0.6 parts |
| n-Propyl alcohol | 79.4 parts |
| **Composition of yellow pigment dispersion mother solution Composition 2 of yellow pigment** | |
| Polyvinyl butyral (PVB-2000L, manufactured by Electro Chemical Industry Co., Ltd.) | 7.1 parts |
| Pigment Yellow 139 (C.I. No. 56298) (Novoperm Yellow M2R 70, manufactured by Clariant Japan, K. K.) | 12.9 parts |
| Dispersion assistant (Solspers S-20000, manufactured by ICI) | 0.6 parts |
| n-Propyl alcohol | 79.4 parts |
| **Composition of yellow image-forming layer coating solution** | |
| Above yellow pigment dispersion mother solution (yellow pigment composition 1/ yellow pigment composition 2 = 95:5 (parts)) | 126 parts |
| Polyvinyl butyral (PVB-2000L, manufactured by Electro Chemical Industry Co., Ltd.) | 4.6 parts |
| Wax-based compound | |
| Stearic acid amide (Newtron 2, manufactured by Nippon Seika Co., Ltd.) | 0.7 part |
| Behenic acid amide (Diamid BM, (manufactured by Nippon Kasei Co., Ltd.) | 0.7 part |
| Lauric acid amide (Diamid Y, (manufactured by Nippon Kasei Co., Ltd.) | 0.7 part |
| Palmitic acid amide (Diamid KP, (manufactured by Nippon Kasei Co., Ltd.) | 0.7 part |
| Erucic acid amide (Diamid L-200, (manufactured by Nippon Kasei Co., Ltd.) | 0.7 part |
| Oleic acid amide (Diamid O-200, (manufactured by Nippon Kasei Co., Ltd.) | 0.7 part |
| Nonionic surfactant (Chemistat 1100, manufactured by Sanyo Chemical Industries, Co., Ltd.) | 0.4 parts |
| Rosin (KE-311, (manufactured by Arakawa Kagaku Co., Ltd.) | 2.4 parts |
| Surfactant (Megafac F-176PF, solid content: 20%, manufactured by Dainippon Chemicals and Ink Co., Ltd.) | 0.8 parts |
| n-Propyl alcohol | 793 parts |
| Methyl ethyl ketone | 198 parts |

The obtained image-forming layer had the following physical properties.

The surface hardness of the image-forming layer with a sapphire needle is preferably 10 g or more, specifically 200 g or more.

The smooster value of the surface at 23° C., 55% RH is preferably from 0.5 to 50 mmHg (≈0.0665 to 6.65 kPa), and specifically 2.3 mmHg (≈0.31 kPa).

The coefficient of static friction of the surface is preferably 0.2 or less, and specifically 0.1.

The surface energy was 24 $mJ/m^2$, and the contact angle with water was 108.1°. The reflection optical density was 1.01, the layer thickness was 0.42 μm, and $OD_r$/layer thickness (μm unit) was 2.40.

The deformation rate of the light-to-converting layer was 150%when recording was performed at linear velocity of 1 m/sec or more with laser beams having light strength at exposure surface of 1,000 $W/mm^2$ or more.

Preparation of Thermal Transfer Sheet M

Thermal transfer sheet M was prepared in the same manner as in the preparation of thermal transfer sheet K, except that the magenta image-forming layer coating solution having the following composition was used in place of the black image-forming layer coating solution. The layer thickness of the image-forming layer of the obtained thermal transfer sheet M was 0.38 μm.

| | |
|---|---|
| **Composition of magenta pigment dispersion mother solution Composition 1 of magenta pigment** | |
| Polyvinyl butyral (PVB-2000L, manufactured by Electro Chemical Industry Co., Ltd.) | 12.6 parts |
| Pigment Red 57:1 (C.I. No. 15850:1) (Symuler Brilliant Carmine 6B-229, manufactured by Dainippon Chemicals and Ink Co., Ltd.) | 15.0 parts |
| Dispersion assistant (Solspers S-20000, manufactured by ICI) | 0.6 parts |
| n-Propyl alcohol | 80.4 parts |
| **Composition of magenta pigment dispersion mother solution Composition 2 of magenta pigment** | |
| Polyvinyl butyral (PVB-2000L, manufactured by Electro Chemical Industry Co., Ltd.) | 12.6 parts |
| Pigment Red 57:1 (C.I. No. 15850:1) (Lionol Red 6B-4290G, manufactured by Toyo Ink Mfg. Co., Ltd.) | 15.0 parts |
| Dispersion assistant (Solspers S-20000, manufactured by ICI) | 0.6 parts |
| n-Propyl alcohol | 79.4 parts |
| **Composition of magenta image-forming layer coating solution** | |
| Above magenta pigment dispersion mother solution (magenta pigment composition 1/magenta pigment composition 2 = 95:5 (parts)) | 163 parts |
| Polyvinyl butyral (PVB-2000L, manufactured by Electro Chemical Industry Co., Ltd.) | 4.0 parts |
| Wax-based compound | |
| Stearic acid amide (Newtron 2, manufactured by Nippon Seika Co., Ltd.) | 1.0 part |
| Behenic acid amide (Diamid BM, (manufactured by Nippon Kasei Co., Ltd.) | 1.0 part |
| Lauric acid amide (Diamid Y, (manufactured by Nippon Kasei Co., Ltd.) | 1.0 part |
| Palmitic acid amide (Diamid KP, (manufactured by Nippon Kasei Co., Ltd.) | 1.0 part |
| Erucic acid amide (Diamid L-200, (manufactured by Nippon Kasei Co., Ltd.) | 1.0 part |

-continued

| | |
|---|---|
| Oleic acid amide (Diamid O-200, (manufactured by Nippon Kasei Co., Ltd.) | 1.0 part |
| Nonionic surfactant (Chemistat 1100, manufactured by Sanyo Chemical Industries, Co., Ltd.) | 0.7 parts |
| Rosin (KE-311, (manufactured by Arakawa Kagaku Co., Ltd.) | 4.6 parts |
| Pentaerythritol tetraacrylate (NK ester A-TMMT, manufactured by Shin-Nakamura Kagaku Co., Ltd.) | 2.5 parts |
| Surfactant (Megafac F-176PF, solid content: 20%, manufactured by Dainippon Chemicals and Ink Co., Ltd.) | 1.3 parts |
| n-Propyl alcohol | 848 parts |
| Methyl ethyl ketone | 246 parts |

The obtained image-forming layer had the following physical properties.

The surface hardness of the image-forming layer with a sapphire needle is preferably 10 g or more, specifically 200 g or more.

The smooster value of the surface at 23° C., 55% RH is preferably from 0.5 to 50 mmHg (≈0.0665 to 6.65 kPa), and specifically 3.5 mmHg (≈0.47 kPa).

The coefficient of static friction of the surface is preferably 0.2 or less, and specifically 0.08.

The surface energy was 25 mJ/$m^2$, and the contact angle with water was 98.8°. The reflection optical density was 1.51, the layer thickness was 0.38 $\mu$m, and $OD_r$/layer thickness ($\mu$m unit) was 3.97.

The deformation rate of the light-to-converting layer was 160% when recording was performed at linear velocity of 1 m/sec or more with laser beams having light strength at exposure surface of 1,000 W/$mm^2$ or more.

Preparation of Thermal Transfer Sheet C

Thermal transfer sheet C was prepared in the same manner as in the preparation of thermal transfer sheet K, except that the cyan image-forming layer coating solution having the following composition was used in place of the black image-forming layer coating solution. The layer thickness of the image-forming layer of the obtained thermal transfer sheet C was 0.45 $\mu$m.

| Composition of cyan pigment dispersion mother solution<br>Composition 1 of cyan pigment | |
|---|---|
| Polyvinyl butyral (PVB-2000L, manufactured by Electro Chemical Industry Co., Ltd.) | 12.6 parts |
| Pigment Blue 15:4 (C.I. No. 74160) (Cyanine Blue 700-10FG, manufactured by Toyo Ink Mfg. Co., Ltd.) | 15.0 parts |
| Dispersion assistant (PW-36, manufactured by Kusumoto Kasei Co., Ltd.) | 0.8 parts |
| n-Propyl alcohol | 110 parts |
| Composition of cyan pigment dispersion mother solution<br>Composition 2 of cyan pigment | |
| Polyvinyl butyral (PVB-2000L, manufactured by Electro Chemical Industry Co., Ltd.) | 12.6 parts |
| Pigment Blue 15 (C.I. No. 74160) (Lionol Blue 7027, manufactured by Toyo Ink Mfg. Co., Ltd.) | 15.0 parts |
| Dispersion assistant (PW-36, manufactured by Kusumoto Kasei Co., Ltd.) | 0.8 parts |
| n-Propyl alcohol | 110 parts |

-continued

| Composition of cyan image-forming layer coating solution | |
|---|---|
| Above cyan pigment dispersion mother solution (cyan pigment composition 1/cyan pigment composition 2 = 90:10 (parts)) | 118 parts |
| Polyvinyl butyral (PVB-2000L, manufactured by Electro Chemical Industry Co., Ltd.) | 5.2 parts |
| Inorganic pigment (MEK-ST) | 1.3 parts |
| Wax-based compound | |
| Stearic acid amide (Newtron 2, manufactured by Nippon Seika Co., Ltd.) | 1.0 part |
| Behenic acid amide (Diamid BM, (manufactured by Nippon Kasei Co., Ltd.) | 1.0 part |
| Lauric acid amide (Diamid Y, (manufactured by Nippon Kasei Co., Ltd.) | 1.0 part |
| Palmitic acid amide (Diamid KP, (manufactured by Nippon Kasei Co., Ltd.) | 1.0 part |
| Erucic acid amide (Diamid L-200, (manufactured by Nippon Kasei Co., Ltd.) | 1.0 part |
| Oleic acid amide (Diamid O-200, (manufactured by Nippon Kasei Co., Ltd.) | 1.0 part |
| Rosin (KE-311, (manufactured by Arakawa Kagaku Co., Ltd.) | 2.8 parts |
| Pentaerythritol tetraacrylate (NK ester A-TMMT, manufactured by Shin-Nakamura Kagaku Co., Ltd.) | 1.7 parts |
| Surfactant (Megafac F-176PF, solid content: 20%, manufactured by Dainippon Chemicals and Ink Co., Ltd.) | 1.7 parts |
| n-Propyl alcohol | 890 parts |
| Methyl ethyl ketone | 247 parts |

The obtained image-forming layer had the following physical properties.

The surface hardness of the image-forming layer with a sapphire needle is preferably 10 g or more, specifically 200 g or more.

The smooster value of the surface at 23° C., 55% RH is preferably from 0.5 to 50 mmHg (≈0.0665 to 6.65 kPa), and specifically 7.0 mmHg (≈0.93 kPa).

The coefficient of static friction of the surface is preferably 0.2 or less, and specifically 0.08.

The surface energy was 25 mJ/$m^2$, and the contact angle with water was 98.8°. The reflection optical density was 1.59, the layer thickness was 0.451 $\mu$m, and $OD_r$/layer thickness ($\mu$m unit) was 3.03.

The deformation rate of the light-to-converting layer was 165% when recording was performed at linear velocity of 1 m/sec or more with laser beams having light strength at exposure surface of 1,000 W/$mm^2$ or more.

Preparation of Image-receiving Sheet

A cushioning layer coating solution and an image-receiving layer coating solution each having the following composition were prepared.

| 1) Cushioning layer coating solution | |
|---|---|
| Vinyl chloride-vinyl acetate copolymer (main binder, MPR-TSL, manufactured by Nisshin Kagaku Co., Ltd.) | 20 parts |
| Plasticizer (Paraplex G-40, manufactured by CP. HALL. COMPANY) | 10 parts |
| Surfactant (fluorine surfactant, coating assistant, Megafac F-177, manufactured by Dainippon Chemicals and Ink Co., Ltd.) | 0.5 parts |

-continued

| | |
|---|---|
| Antistatic agent (quaternary ammonium salt, SAT-5 Supper (IC), manufactured by Nippon Junyaku Co., Ltd.) | 0.3 parts |
| Methyl ethyl ketone | 60 parts |
| Toluene | 10 parts |
| N,N-Dimethylformamide | 3 parts |
| 2) Image-receiving layer coating solution | |
| Polyvinyl butyral (PVB-2000L, manufactured by Electro Chemical Industry Co., Ltd.) | 8 parts |
| Antistatic agent Sanstat 2012A, manufactured by Sanyo Chemical Industries, Co., Ltd.) | 0.7 parts |
| Surfactant (Megafac F-177, manufactured by Dainippon Chemicals and Ink Co., Ltd.) | 0.1 parts |
| n-Propyl alcohol | 20 parts |
| Methanol | 20 parts |
| 1-Methoxy-2-propanol | 50 parts |

The above-prepared cushioning layer coating solution was coated on a white PET support (Lumiler #130E58, manufactured by Toray Industries Inc., thickness: 130 μm) using a narrow-broad coater and the coated layer was dried, and then the image-receiving layer coating solution was coated and dried. The coating amounts were controlled so that the layer thickness of the cushioning layer after drying became about 20 μm and the layer thickness of the image-receiving layer became about 2 μm. The white PET support was a void-containing plastic support of a laminate (total thickness: 130 μm, specific gravity: 0.8) comprising a void-containing polyethylene terephthalate layer (thickness: 116 μm, void ratio: 20%), and titanium oxide-containing polyethylene terephthalate layers provided on both sides thereof (thickness: 7 μm, titanium oxide content: 2%). The prepared material was wound in a roll, stored at room temperature for one week, then used in the image recording by laser beam as shown below.

The obtained image-receiving layer had the following physical properties.

The surface roughness Ra is preferably from 0.4 to 0.01 μm, and specifically 0.02 μm.

The undulation of the image-receiving layer surface is preferably 2 μm or less, and specifically 1.2 μm.

The smooster value of the surface of the image-receiving layer at 23C, 55% RH is preferably from 0.5 to 50 mmHg (≈0.0665 to 6.65 kPa), and specifically 0.8 mmHg (≈0.11 kPa).

The coefficient of static friction of the surface of the image-receiving layer is preferably 0.8 or less, and specifically 0.37.

The surface energy was 29 mJ/m$^2$, and the contact angle with water was 87.0°.

Formation of Transferred Image

A transferred image to an actual paper was obtained by the image-forming system shown in FIG. 4 according to the image-forming sequence of the system and the transfer method of the system, and Luxel FINALPROOF 5600 was used as the recording unit.

The above-prepared image-receiving sheet (56 cm×79 cm) was wound around the rotary drum having a diameter of 38 cm provided with vacuum suction holes having a diameter of 1 mm (surface density of 1 hole in the area of 3 cm×8 cm) and vacuum sucked. Subsequently, the above thermal transfer sheet K (black) cut to a size of 61 cm×84 cm was superposed on the image-receiving sheet so as to deviate uniformly, squeezed by a squeeze roller, and adhered and laminated so that the suction holes sucked in air. The degree of pressure reduction in the state of suction holes being covered was −150 mmHg per 1 atm (≈81.13 kPa). The drum was rotated and semiconductor laser beams of the wavelength of 808 nm were condensed from the outside on the surface of the laminate on the drum so that the laser beams became a spot of a diameter of 7 μm on the surface of the photothermal converting layer, and laser image recording (image line) was performed on the laminate by moving the laser beam at a right angle (by-scanning) to the rotary direction of the drum (main scanning direction). The condition of irradiation was as follows. The laser beams used in the Example was multi-beam two dimensional array comprising five rows along the main scanning direction and three rows along the by-scanning direction forming a parallelogram.

Laser power: 110 mW

Main scanning velocity: 500 rpm

By-scanning pitch: 6.35 μm

Circumferential temperature and humidity condition:

18° C. 30%, 23° C. 50%, 26° C. 65%

The diameter of an exposure drum is preferably 360 mm or more, specifically 380 mm was used.

The size of the image was 515 mm×728 mm, and the definition was 2,600 dpi.

The laminate after laser recording was detached from the drum and the thermal transfer sheet K was released from the image-receiving sheet by hands. It was confirmed that only the domain irradiated with laser beams of the image-forming layer of the thermal transfer sheet K had been transferred from the thermal transfer sheet K to the image-receiving sheet.

In the same manner as above, the image was transferred to the image-receiving sheet from each of thermal transfer sheet Y, thermal transfer sheet M and thermal transfer sheet C. The transferred images of four colors were further transferred to a recording paper and a multicolor image was formed. Even when high energy laser recording was performed under different temperature and humidity conditions with laser beams of multi-beam two dimensional array, a multicolor image having excellent image quality and stable transfer density could be formed.

In the stage of transfer to the actual paper, the heat transfer unit having a dynamic friction coefficient against insert platform of polyethylene terephthalate of from 0.1 to 0.7 and traveling speed of from 15 to 50 mm/sec was used. The Vickers hardness of the heat roller of the heat transfer unit is preferably from 10 to 100, and specifically the heat roller having Vickers hardness of 70 was used.

Every image under three different surroundings of temperature and humidity conditions was good.

Example 2-2

A multicolor image-forming material was prepared and a transferred image was formed in the same manner as in Example 2-1 except for replacing the polyvinyl butyral (PVB-2000L, manufactured by Electro Chemical Industry Co., Ltd.) used in the image-forming layer and the image-receiving layer with polyvinyl butyral BL-SH, manufactured by Sekisui Chemical Industries, Ltd.

Example 2-3

A multicolor image-forming material was prepared and a transferred image was formed in the same manner as in Example 2-1 except for replacing the polyvinyl butyral (PVB-2000L, manufactured by Electro Chemical Industry Co., Ltd.) used in the image-forming layer and the image-receiving layer with a styrene-based resin (SMA3840 manufactured by Kawahara Yuka Co., Ltd.).

Example 2-4

A multicolor image-forming material was prepared and a transferred image was formed in the same manner as in Example 2-1 except for replacing the polyvinyl butyral (PVB-2000L, manufactured by Electro Chemical Industry Co., Ltd.) used in the image-forming layer and the image-receiving layer in Example 2-1 with a styrene-acrylonitrile-acrylate copolymer resin as to the image-forming layer, and with a styrene-acrylate copolymer resin as to the image-receiving layer.

Reference Example 2-1

A multicolor image-forming material was prepared and a transferred image was formed in the same manner as in Example 2-1 except that the polyvinyl butyral (PVB-2000L, manufactured by Electro Chemical Industry Co., Ltd.) used in the image-forming layer and the image-receiving layer in Example 2-1 was used in the image-forming layer but a styrene-based resin (SMA3840 manufactured by Kawahara Yuka Co., Ltd.) was used in the image-receiving layer.

Reference Example 2-2

A multicolor image-forming material was prepared and a transferred image was formed in the same manner as in Example 2-1 except that a styrene-based resin (SMA3840 manufactured by Kawahara Yuka Co., Ltd.) was used in the image-forming layer in place of polyvinyl butyral (PVB-2000L, manufactured by Electro Chemical Industry Co., Ltd.) used in the image-forming layer and the image-receiving layer in Example 2-1, and polyvinyl butyral (PVB-2000L, manufactured by Electro Chemical Industry Co., Ltd.) was used in the image-receiving layer. REFERENCE EXAMPLE 2-1 and REFERENCE EXAMPLE 2-2 can show compositions of monomer units of binders in image-forming layer and image-receiving layer.

The images obtained by the above constitutions were evaluated as described below.

(1) Measurement of Reflection Optical Density ($OD_r$) and Computation of Transfer Rate of Image The image density of a transferred image obtained under each temperature/humidity condition was measured by Macbeth reflection densitometer RD-918 using each of the above thermal transfer sheets. Reflection densities ($OD_r$) obtained are shown in Table 2 below.

TABLE 2

| Color | Reflection Optical Density | Reflection Optical Density/Layer Thickness of Image-Forming Layer |
|---|---|---|
| Y | 1.01 | 2.40 |
| M | 1.51 | 3.97 |
| C | 1.59 | 3.03 |
| K | 1.82 | 3.03 |

The above thermal transfer sheet K was transferred to an image-receiving sheet using a heat transfer unit and without laser recording, and the reflection density of the obtained black image measured according to the above method was 1.88. Image transferabilities of thermal transfer sheet K subjected to laser recording under temperature and humidity conditions of 18° C. 30% RH, 23° C. 50% RH and 26° C. 65% RH were respectively 98.4%, 96.8% and 96.3%.

(2) Sensitivity

One line was recorded with laser irradiation and evaluated using an optical microscope of 150 magnifications. The criteria of the evaluation are as follows. The results of the evaluation are shown in Table 3 below.

A: One line is recorded without breaking.

B: One line breaks partially.

C: Almost all of one line cannot be transferred.

(3) Image Quality

Using the above four color thermal transfer sheets, the image quality of the solid part and the line image part of a transferred image was observed with an optical microscope. The time lag in the solid part was not observed in every surrounding condition, definition of the line image was good, and transferred black image having less dependency on the surrounding condition could be obtained. The evaluation was performed visually according to the following criteria. The results obtained are shown in Table 3 below.

Solid Part

A: Time lag in recording time and transfer failure were not observed.

B: Time lag in recording time and transfer failure were observed partially.

C: Time lag in recording time and transfer failure were observed all over the surface.

Line Image Part

A: The edge of the line image was sharp and good definition was shown.

B: The edge of the line image was jagged and bridging occurred partially.

C: Bridging occurred entirely.

(4) Transferability to Actual Paper

An image-receiving sheet to which an image had been transferred from a thermal transfer sheet and an art paper were passed through a laminator (the temperature of the heat roller: 130° C., pressure was applied by compressed air of 39.2 PMa, v=0.3 m/min), and after the temperature was lowered to room temperature, the image-receiving sheet and the art paper were separated to transfer the image-receiving layer. The evaluation was performed according to the following criteria. The results obtained are shown in Table 3 below.

A: All of the image-receiving layer was lifted and transferred without unevenness.

B: The image-receiving layer was lifted a little and glistened.

C: The image-receiving layer was partially remained after transferring.

TABLE 3

| | Binder of Image-Forming Layer | Binder of Image-Receiving Layer | Sensitivity | Image Quality | | Transferability to Actual Paper |
|---|---|---|---|---|---|---|
| | | | | Solid Part | Line Part | |
| Example 2-1 | PVB resin (PVB-2000L) | PVB resin (PVB-2000L) | A | A | A | A |
| Example 2-2 | PVB resin (BL-SH) | PVB resin (BL-SH) | A | A | A | A |
| Example 2-3 | Styrene-based resin (SMA3480) | Styrene-based resin (SMA3480) | A | A | A | A |
| Example 2-4 | Styrene-acrylonitrile-acrylate | Styrene-acrylate | A | A | A | A |
| Reference Example 2-1 | PVB resin (PVB-2000L) | Styrene-based resin (SMA3480) | C | A | A | C |
| Reference Example 2-2 | Styrene-based resin (SMA3480) | PVB resin (PVB-2000L) | C | A | A | C |

(5) Dot Shape

Figure 13:
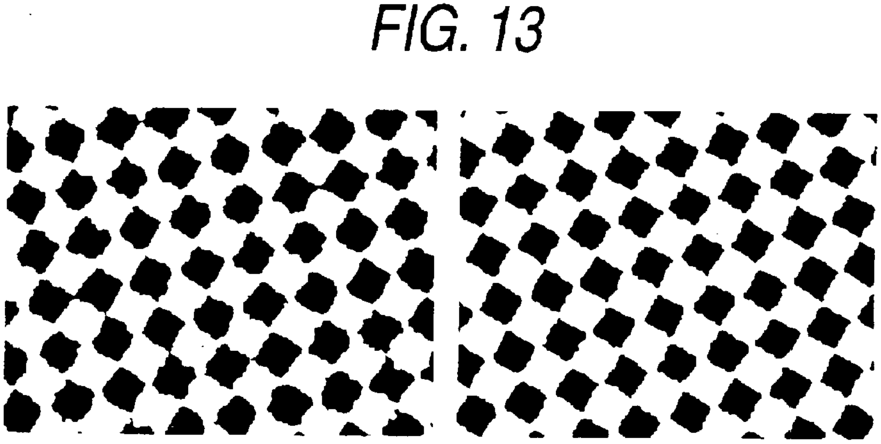
FIG. 13 shows the shapes of the dots of the image obtained in the Example below. The center distance of dots is 125 μm.
Figure 14:
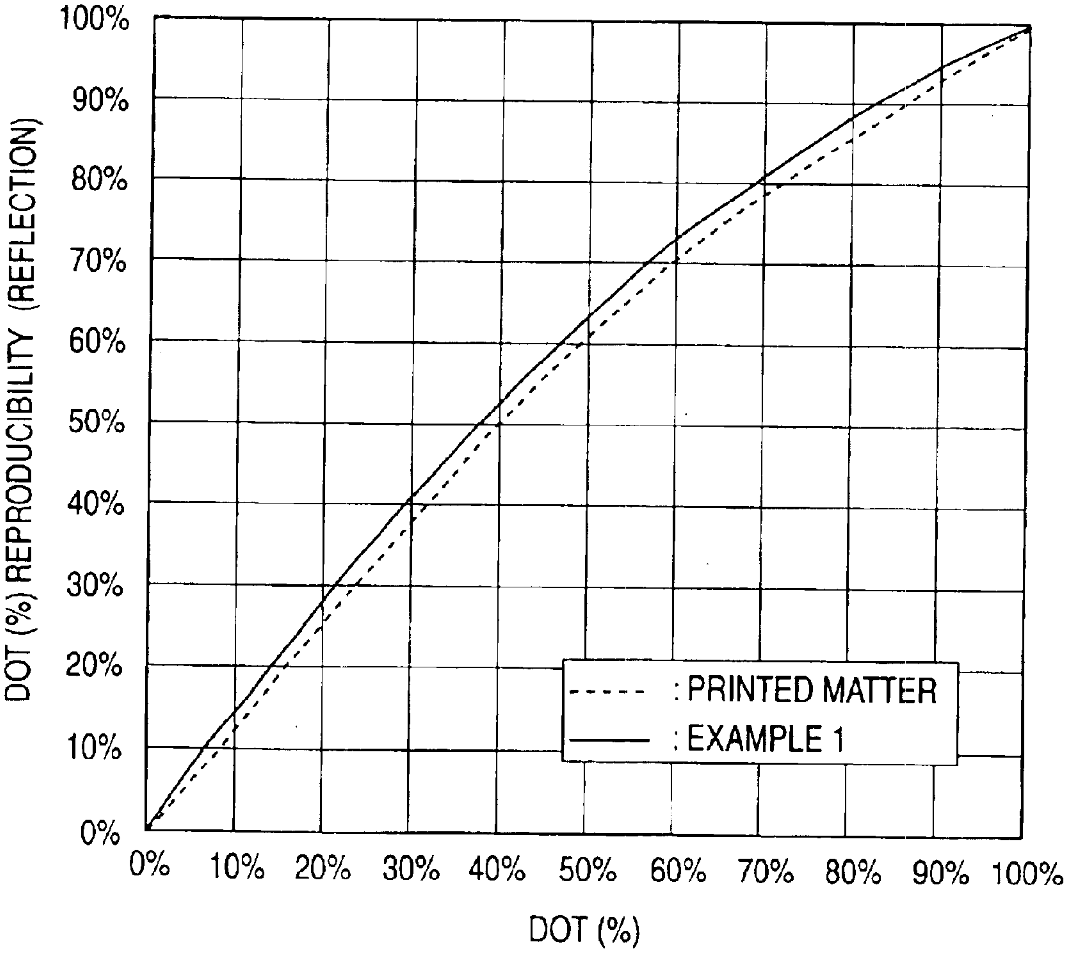
FIG. 14 shows the reproducibility of the dots of the image obtained in the Example below. The axis of ordinate shows the dot area rate computed from the reflection density, and the axis of abscissa shows the dot area rate of the inputted signal.

The images obtained in Example 2 formed the dot image corresponding to print line number of definition of from 2,400 to 2,540 dpi. Since each dot is almost free of blur and chip and the shape is very sharp, dots of a wide range from highlight to shadow can be clearly formed (FIGS. 5 to 12). As a result, output of dots of high grade having the same definition as obtained by an image setter and CTP setter is possible, and dots and gradation which are excellent in approximation to the printed matter can be reproduced (FIGS. 13 and 14). The samples of the present invention also showed good results with definition of 2,600 dpi or higher.

(6) Quality of Character

Figure 17:
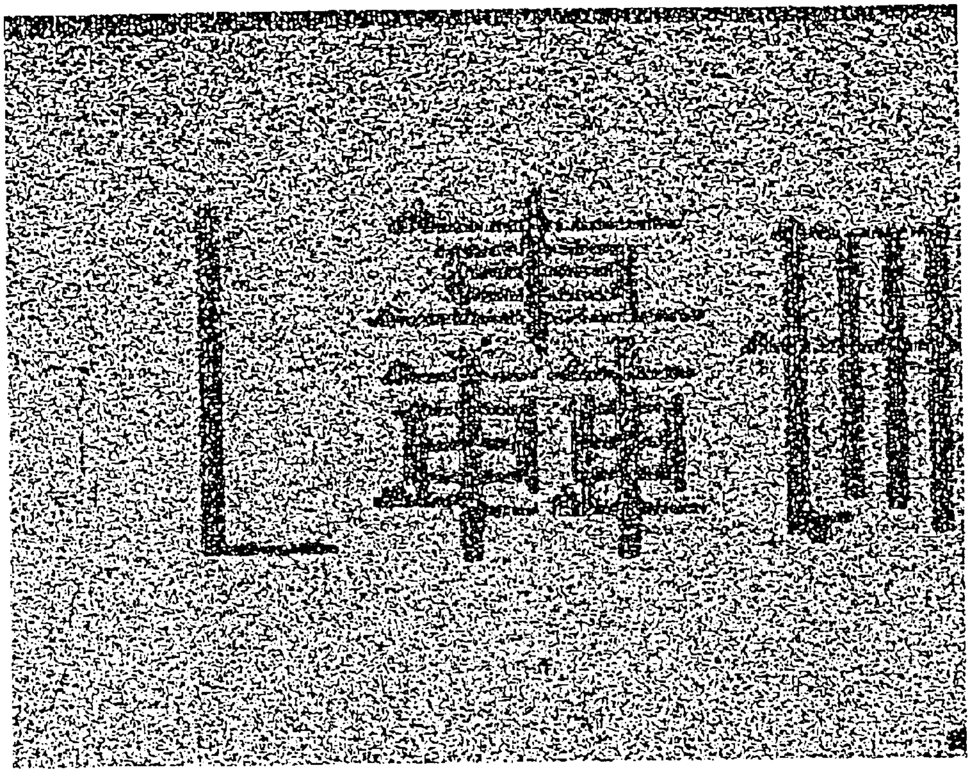
FIG. 17 shows the character quality of 2 points of the image (positive image) obtained in the Example below.
Figure 18:
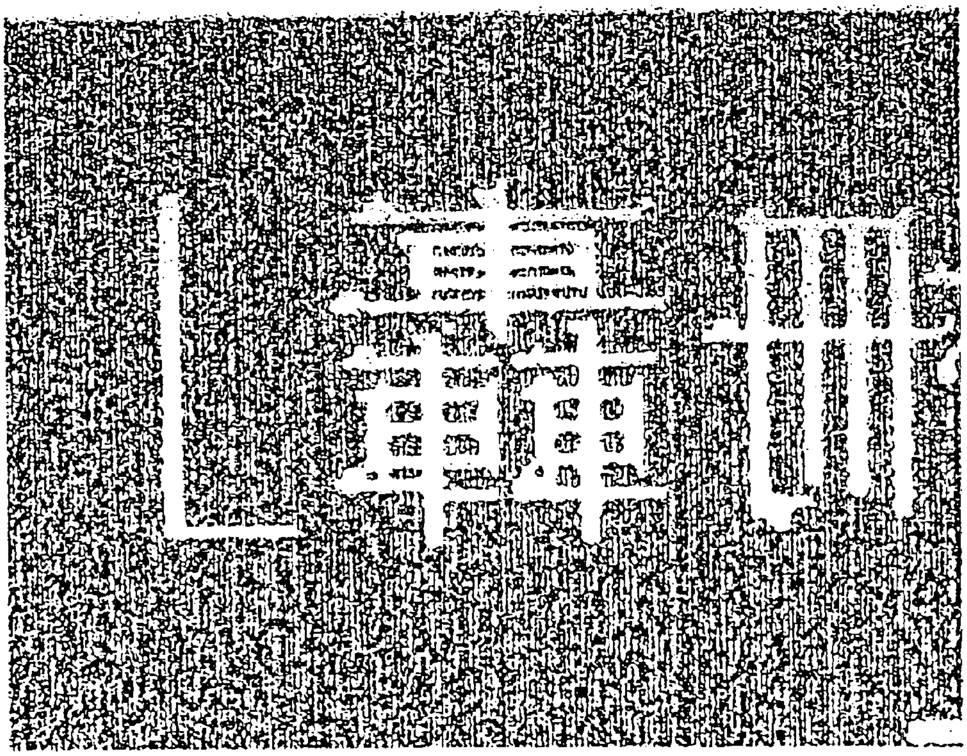
FIG. 18 shows the character quality of 2 points of the image (negative image) obtained in the Example below.

Since the images obtained in Example 2 are sharp in dot shape, the fine line of a fine character can be reproduced sharply (FIGS. 17 and 18).

Example 3

A multicolor image-forming material was prepared and a transferred image was formed in the same manner as in Example 2 (Example 2-1) except for changing the following three points.

(1) The binder in the photothermal converting layer in the thermal transfer sheet was changed from the polyvinyl butyral to the following compound.

| | |
|---|---|
| Polyimide resin represented by the following formula (Rika Coat SN-20F, manufactured by Shin Nihon Rika K. K., heat decomposition temperature: 510° C.) | 29.3 parts |

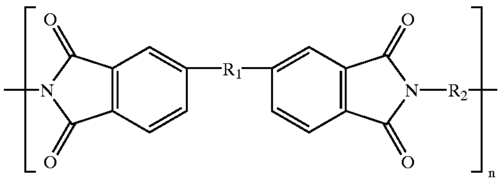

In the formula, $R_1$ represents $SO_2$, $R_2$ represents the following formula:

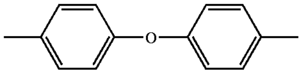

or

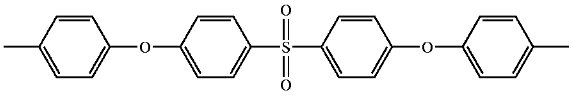

(2) An Image-forming Layer Coating Solution in Thermal Transfer Sheet K (Black) was Changed to the Following Composition.

| Composition of black image-forming layer coating solution | |
|---|---|
| Black pigment dispersion mother solution in Example 2-1 (composition 1/composition 2 = 70:30 (parts)) | 185.7 parts |
| Polyvinyl butyral (Eslec B BL-SH, manufactured by Sekisui Chemical Industries, Ltd.) | 11.9 parts |
| Wax-based compound | |
| Stearic acid amide (Newtron 2, manufactured by Nippon Seika Co., Ltd.) | 1.7 part |
| Behenic acid amide (Diamid BM, (manufactured by Nippon Kasei Co., Ltd.) | 1.7 part |
| Lauric acid amide (Diamid Y, (manufactured by Nippon Kasei Co., Ltd.) | 1.7 part |
| Palmitic acid amide (Diamid KP, (manufactured by Nippon Kasei Co., Ltd.) | 1.7 part |
| Erucic acid amide (Diamid L-200, (manufactured by Nippon Kasei Co., Ltd.) | 3.4 part |
| Rosin (KE-311, (manufactured by Arakawa Kagaku Co., Ltd.) (components: resin acid 80–97%, resin acid components: abietic acid: 30 to 40% neoabietic acid: 10 to 20% dihydroabietic acid: 14% tetrahydroabietic acid: 14%) | 11.4 parts |
| Surface tension decreasing agent (Megafac F-176PF, solid content: 20%, manufactured by Dainippon Chemicals and Ink Co., Ltd., fluorine surfactant, perfluoralkyl-polyoxyalkylene oligomer) | 2.1 parts |
| Inorganic pigment (MEK-ST, 30% methyl ethyl ketone solution, manufactured by Nissan Chemical Industries, Ltd.) | 7.1 parts |
| n-Propyl alcohol | 1,050 parts |
| Methyl ethyl ketone | 295 parts |

(3) An Image-forming Layer Coating Solution in Thermal Transfer Sheet M (Magenta) was Changed to the Following Composition.

| Composition of magenta image-forming layer coating solution | |
|---|---|
| Magenta pigment dispersion mother solution in Example 2-1 (magenta pigment composition 1:magenta pigment composition 2 = 95:5 (parts)) | 163 parts |
| Polyvinyl butyral (Denka Butyral #2000-L, manufactured by Electro Chemical Industry Co., Ltd., Vicat softening point: 57° C.) | 4.0 parts |
| Wax-based compound | |
| Stearic acid amide (Newtron 2, manufactured by Nippon Seika Co., Ltd.) | 1.0 part |
| Behenic acid amide (Diamid BM, (manufactured by Nippon Kasei Co., Ltd.) | 2.0 part |
| Palmitic acid amide (Diamid KP, (manufactured by Nippon Kasei Co., Ltd.) | 1.0 part |
| Erucic acid amide (Diamid L-200, (manufactured by Nippon Kasei Co., Ltd.) | 1.0 part |
| Oleic acid amide (Diamid O-200, (manufactured by Nippon Kasei Co., Ltd.) | 1.0 part |
| Nonionic surfactant (Chemistat 1100, manufactured by Sanyo Chemical Industries, Co., Ltd.) | 0.7 parts |
| Rosin (KE-311, (manufactured by Arakawa Kagaku Co., Ltd.) | 4.6 parts |
| Pentaerythritol tetraacrylate (NK ester A-TMMT, manufactured by Shin-Nakamura Kagaku Co., Ltd.) | 2.5 parts |
| Surface tension decreasing agent (Megafac F-176PF, solid content: 20%, manufactured by Dainippon Chemicals and Ink Co., Ltd., fluorine surfactant, perfluoroalkylpolyoxyalkylene oligomer) | 1.3 parts |
| n-Propyl alcohol | 848 parts |
| Methyl ethyl ketone | 246 parts |

Using the obtained thermal transfer sheet and image-receiving sheet, the reflection optical density of each color of Y, M, C, K of the image transferred to Tokuryo art paper was measured in Y, M, C, K mode with a densitometer X-rite 938 (manufactured by X-rite Co.).

Reflection optical density, reflection optical density/image-forming layer thickness ($\mu$m) of each color are shown in Table 4 below together with the contact angle with water of the image-forming layer in the thermal transfer sheet of each color and the image-receiving layer.

TABLE 4

| | Reflection Optical Density | Reflection Optical Density/Image-Forming Layer Thickness | Contact Angle with Water of Image-Forming Layer and Image-Receiving Layer |
|---|---|---|---|
| Y | 1.01 | 2.40 | 108.1° |
| M | 1.51 | 3.97 | 98.8° |
| C | 1.59 | 3.03 | 95° |
| K | 1.82 | 3.03 | 94.8° |
| Image-Receiving Layer | — | — | 85° |

Example 3-1

Multicolor image-forming materials for use for recording by the above thermal transfer sheets K, Y, M and C were prepared.

Example 3-2

Multicolor image-forming materials comprising a thermal transfer sheet and an image-receiving sheet were prepared in the same manner as in Example 3-1 except that the surface tension decreasing agent, surfactant, in each of the photo-thermal converting layer coating solution, the image-forming layer coating solution and the image-receiving layer coating solution in thermal transfer sheets K, Y, M and C and the image-receiving sheet was replaced with Megafac F113 (a fluorine surfactant, manufactured by Dainippon Chemicals and Ink Co., Ltd.).

Example 3-3

Multicolor image-forming materials comprising a thermal transfer sheet and an image-receiving sheet were prepared in the same manner as in Example 3-1 except that the surface tension decreasing agent, surfactant, in each of the photo-thermal converting layer coating solution, the image-forming layer coating solution and the image-receiving layer coating solution in thermal transfer sheets K, Y, M and C and the image-receiving sheet was replaced with Rapisol B80 (hydrocarbon-based surfactant, manufactured by Nippon Oils and Fats Co., Ltd.).

Reference Example 3-1

Multicolor image-forming materials comprising a thermal transfer sheet and an image-receiving sheet were prepared in the same manner as in Example 3-1 except that the surface tension decreasing agent, surfactant, was excluded from each of the photothermal converting layer coating solution, the image-forming layer coating solution and the image-receiving layer coating solution in thermal transfer sheets K, Y, M and C and the image-receiving sheet. This EXAMPLE shows effect of the surface tension decreasing agent.

The constitutions of the above-obtained thermal transfer sheets are shown in Table 5 below.

TABLE 5

| | Constitution | | Evaluation | | | | |
|---|---|---|---|---|---|---|---|
| | Surface Tension Decreasing Agent | Surface Tension of Coating Solvent in Concentration of 0.5 mass % of Surface Tension Decreasing Agent | Surface State of Photothermal converting layer | Surface State of Image-Forming Layer | Surface State of Image-Receiving Layer | Uniformity of Image Quality | Uniformity of Recording Density |
| Example 3-1 | F176PF | 24.1 mN/m (in N-methyl-2-pyrrolidone) 21.1 mN/m (in 1-propanol) | A | A | A | A | A |
| Example 3-2 | F113 | 39.3 mN/m (in N-methyl-2-pyrrolidone) 23.2 mN/m (in 1-propanol) | B or C | A or B | A or B | B | B |
| Example 3-3 | Rapisol B80 | 37.2 mN/m (in N-methyl-2-pyrrolidone) 23.0 mN/m (in 1-propanol) | C | B | B | B | B |
| Reference Example 3-1 | None | — | C | C | C | C | C |

The above recording properties were evaluated as follows.

(1) Recording was performed by definition of 2,600 dip.

(2) The surface states of the photothermal converting layer, the image-forming layer and the image-receiving layer were visually judged from coating failure and the smoothness of coated surface.

A: Coating failure was not present and the surface was smooth.

B: Coating failure was observed and the layer thickness of the coated layer was uneven.

C: Coating failure was conspicuous and the layer thickness of the coated layer was extremely uneven.

(3) With respect to the uniformity of image quality, the uniformity of the place of impression of dot of a recorded image was observed with an optical microscope and evaluated.

A: Uniform and good image quality

B: Image quality is partially inferior.

C: Image quality is entirely inferior.

(4) With respect to the uniformity of recording density, unevenness of a recorded image was evaluated.

A: Uniform recording density can be obtained.

B: Recording density is partially uneven.

C: Recording density is entirely uneven.

The following evaluations were further performed with respect to Example 3-1.

Dot Shape

The images obtained in Example 3-1 formed the dot image corresponding to print line number of definition of from 2,400 to 2,540 dpi. Since each dot is almost free of blur and chip and the shape is very sharp, dots of a wide range from highlight to shadow can be clearly formed (FIGS. 5 to 12). As a result, output of dots of high grade having the same definition as obtained by an image setter and CTP setter is possible, and dots and gradation which are excellent in approximation to the printed matter can be reproduced (FIGS. 13 and 14). The samples of the present invention also showed good results with definition of 2,600 dpi or higher.

Repeating Reproducibility

Figure 15:
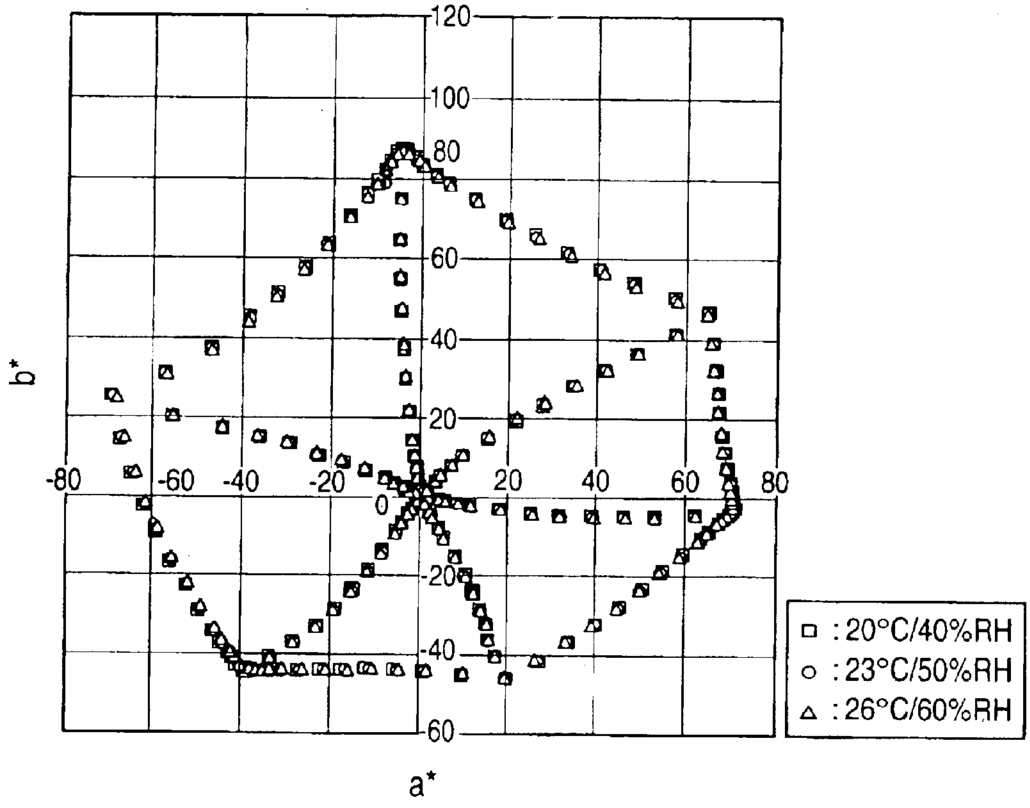
FIG. 15 shows the repeating reproducibility of the image obtained in the Example below in a*b* flat surface of L*a*b* color specification.
Figure 16:
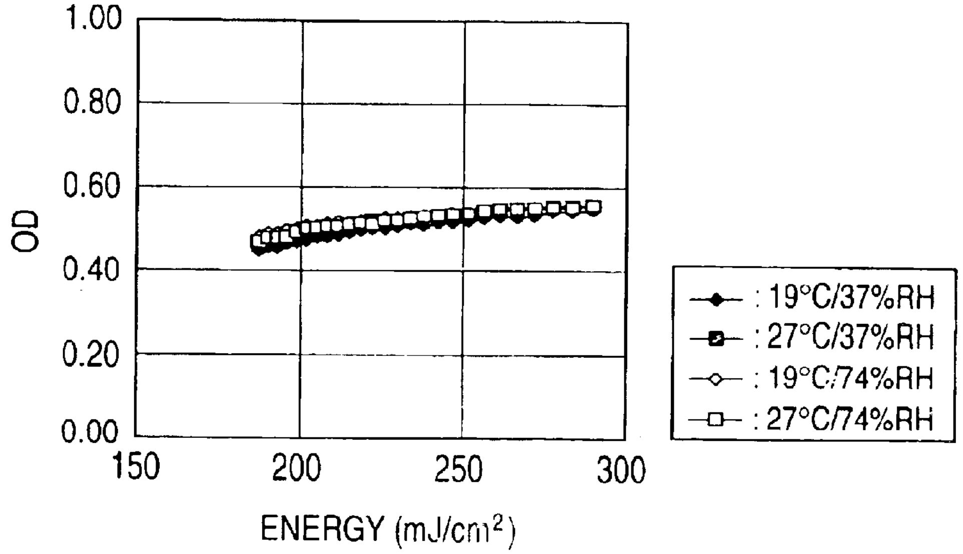
FIG. 16 shows the repeating reproducibility of the image obtained in the Example below.

Since the samples obtained in Example 3-1 are sharp in dot shape, dots corresponding to laser mean can be faithfully reproduced, further recording characteristics are hardly influenced by the surrounding temperature and humidity, and so repeating reproducibility stable in hue and density can be obtained (FIGS. 15 and 16).

A transfer image to the actual paper was obtained in the same manner as in Example 3-1 using the image-forming material in Example 3-1 except for changing the temperature and humidity of the system to 19° C. 37% RH, 27° C. 37% RH, 19° C. 74% RH and 27° C. 74% RH, and the irradiated laser energy to 180 to 290 mJ/cm$^2$, and the OD was shown in the axis of ordinate in FIG. 16. From FIG. 16, it can be seen that according to the present invention, a stable image can be obtained under wide circumferential temperature and humidity even if the laser energy load varies somewhat.

Color Reproduction

Pigments used in printing inks are used as the coloring material in the thermal transfer sheet in the Example, and since the thermal transfer sheet is excellent in repeating reproducibility, highly minute CMS can be realized. The heat transfer image can almost coincide with the hues of the printed matters of Japan-Color, and the colors appear similarly to the printed matter even when light sources of illumination are changed, such as a fluorescent lamp, an incandescent lamp.

Quality of Character

Since the image obtained in the Example is sharp in dot shape, the fine line of a fine character can be reproduced sharply (FIGS. 17 and 18).

Example 4

Example 4-1

A multicolor image-forming material was prepared and a transferred image was formed in the same manner as in Example 2 (Example 2-1) except for changing the following three points.

(1) The binder in the photothermal converting layer in the thermal transfer sheet was changed from the polyvinyl butyral to the following compound.

| | |
|---|---|
| Polyimide resin represented by the following formula (Rika Coat SN-20F, manufactured by Shin Nihon Rika K. K., heat decomposition temperature: 510° C.) | 29.3 parts |

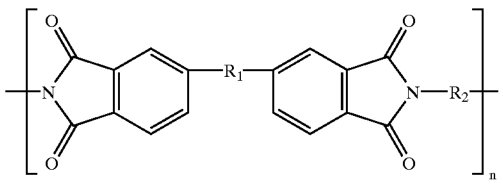

In the formula, $R_1$ represents $SO_2$, $R_2$ represents the following formula:

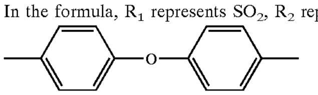

or

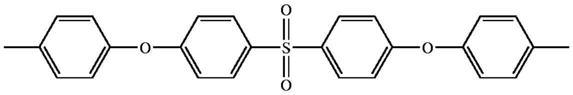

(2) The composition of an image-forming layer coating solution was changed as shown below.

Black

| | |
|---|---|
| **Composition of black pigment dispersion mother solutiom** | |
| **Composition 1 of black pigment** | |
| Polyvinyl butyral (Eslec B BL-SH, manufactured by Sekisui Chemical Industries, Ltd.) | 9.13 parts |
| Pigment Black 7 (carbon black, C.I. No. 77266, Mitsubishi Carbon Black #5, manufactured by Mitsubishi Chemicals Co. Ltd., PVC blackness: 1) | 10.87 parts |
| Dispersion assistant (Solspers S-20000, manufactured by ICI) | 0.57 parts |
| n-Propyl alcohol | 79.43 parts |
| **Composition of black pigment dispersion mother solutiom** | |
| **Composition 2 of black pigment** | |
| Polyvinyl butyral (Eslec B BL-SH, manufactured by Sekisui Chemical Industries, Ltd.) | 12.6 parts |
| Pigment Black 7 (carbon black, C.I. No. 77266, Mitsubishi Carbon Black MA100, manufactured by Mitsubishi Chemicals Co., Ltd., PVC blackness: 10) | 15 parts |
| Dispersion assistant (Solspers S-20000, manufactured by ICI) | 0.8 parts |
| n-Propyl alcohol | 109.6 parts |
| **Composition of black image-forming layer coating solution** | |
| Above black pigment dispersion mother solution | |
| composition 1 | 35.51 parts |
| composition 2 | 82.85 parts |

-continued

| | |
|---|---|
| Polyvinyl butyral (Eslec B BL-SH, manufactured by Sekisui Chemical Industries, Ltd.) | 7.5 parts |
| Wax-based compound | |
| Stearic acid amide (Newtron 2, manufactured by Nippon Seika Co., Ltd.) | 1.1 part |
| Behenic acid amide (Diamid BM, (manufactured by Nippon Kasei Co., Ltd.) | 1.1 part |
| Lauric acid amide (Diamid Y, (manufactured by Nippon Kasei Co., Ltd.) | 1.1 part |
| Palmitic acid amide (Diamid KP, (manufactured by Nippon Kasei Co., Ltd.) | 1.1 part |
| Erucic acid amide (Diamid L-200, (manufactured by Nippon Kasei Co., Ltd.) | 1.1 part |
| Oleic acid amide (Diamid O-200, (manufactured by Nippon Kasei Co., Ltd.) | 1.1 part |
| Rosin (KE-311, (manufactured by Arakawa Kagaku Co., Ltd.) (components: resin acid 80–97%, resin acid components: abietic acid: 30 to 40% neoabietic acid: 10 to 20% dihydroabietic acid: 14% tetrahydroabietic acid: 14%) | 7.24 parts |
| Surfactant (Megafac F-176PF, solid content: 20%, manufactured by Dainippon Chemicals and Ink Co., Ltd.) | 1.33 parts |
| Inorganic pigment (MEK-ST, 30% methyl ethyl ketone solution, manufactured by Nissan Chemical Industries, Ltd.) | 4.51 parts |
| n-Propyl alcohol | 667 parts |
| Methyl ethyl ketone | 188 parts |

Yellow

| | |
|---|---|
| **Composition of yellow pigment dispersion mother solution** | |
| **Composition 1 of yellow pigment** | |
| Polyvinyl butyral (Eslec B BL-SH, manufactured by Sekisui Chemical Industries, Ltd.) | 9.78 parts |
| Pigment Yellow 180 (C.I. No. 21290) (Novoperm Yellow P-HG, manufactured by Clariant Japan, K.K.) | 17.82 parts |
| Dispersion assistant (Solspers S-20000, manufactured by ICI) | 0.8 parts |
| n-Propyl alcohol | 109.6 parts |
| **Composition of yellow pigment dispersion mother solution** | |
| **Composition 2 of yellow pigment** | |
| Polyvinyl butyral (Eslec B BL-SH, manufactured by Sekisui Chemical Industries, Ltd.) | 7.1 parts |
| Pigment Yellow 139 (C.I. No. 56298) (Novoperm Yellow M2R 70, manufactured by Clariant Japan, K.K.) | 12.9 parts |
| Dispersion assistant (Solspers S-20000, manufactured by ICI) | 0.6 parts |
| n-Propyl alcohol | 79.4 parts |
| **Composition of yellow image-forming layer coating solution** | |
| Above yellow pigment dispersion mother solution | |
| composition 1 | 105.56 parts |
| composition 2 | 5.55 parts |
| Polyvinyl butyral (Eslec B BL-SH, manufactured by Sekisui Chemical Industries, Ltd.) | 4.03 parts |
| Wax-based compound | |
| Stearic acid amide (Newtron 2, manufactured by Nippon Seika Co., Ltd.) | 0.6 part |
| Behenic acid amide (Diamid BM, (manufactured by Nippon Kasei Co., Ltd.) | 0.6 part |

-continued

| | |
|---|---|
| Lauric acid amide (Diamid Y, (manufactured by Nippon Kasei Co., Ltd.) | 0.6 part |
| Palmitic acid amide (Diamid KP, (manufactured by Nippon Kasei Co., Ltd.) | 0.6 part |
| Erucic acid amide (Diamid L-200, (manufactured by Nippon Kasei Co., Ltd.) | 0.6 part |
| Oleic acid amide (Diamid O-200, (manufactured by Nippon Kasei Co., Ltd.) | 0.6 part |
| Nonionic surfactant (Chemistat 1100, manufactured by Sanyo Chemical Industries, Co., Ltd.) | 0.32 parts |
| Rosin (KE-311, (manufactured by Arakawa Kagaku Co., Ltd.) | 2.09 parts |
| Surfactant (Megafac F-176PF, solid content: 20%, manufactured by Dainippon Chemicals and Ink Co., Ltd.) | 0.69 parts |
| n-Propyl alcohol | 702 parts |
| Methyl ethyl ketone | 176 parts |

Magenta

| Composition of magenta pigment dispersion mother solution Composition 1 of magenta pigment | |
|---|---|
| Polyvinyl butyral (Denka Butyral #2000-L, manufactured by Electro Chemical Industry Co., Ltd., Vicat softening point: 57° C.) | 12.6 parts |
| Pigment Red 57:1 (C.I. No. 15850:1) (Symuler Brilliant Carmine 6B-229, manufactured by Dainippon Chemicals and Ink Co., Ltd.) | 15.0 parts |
| Dispersion assistant (Solspers S-20000, manufactured by ICI) | 0.8 parts |
| n-Propyl alcohol | 139.6 parts |
| **Composition of magenta pigment dispersion mother solution Composition 2 of magenta pigment** | |
| Polyvinyl butyral (Denka Butyral #2000-L, manufactured by Electro Chemical Industry Co., Ltd., Vicat softening point: 57° C.) | 12.6 parts |
| Pigment Red 57:1 (C.I. No. 15850:1) (Lionol Red 6B-4290G, manufactured by Toyo Ink Mfg. Co., Ltd.) | 15.0 parts |
| Dispersion assistant (Solspers S-20000, manufactured by ICI) | 0.8 parts |
| n-Propyl alcohol | 139.6 parts |
| **Composition of magenta image-forming layer coating solution** | |
| Above magenta pigment dispersion mother solution | |
| composition 1 | 121.75 parts |
| composition 2 | 6.42 parts |
| Polyvinyl butyral (Denka Butyral #2000-L, manufactured by Electro Chemical Industry Co., Ltd., Vicat softening point: 57° C.) | 3.13 parts |
| Wax-based compound | |
| Stearic acid amide (Newtron 2, manufactured by Nippon Seika Co., Ltd.) | 0.8 parts |
| Behenic acid amide (Diamid BM, (manufactured by Nippon Kasei Co., Ltd.) | 0.8 parts |
| Lauric acid amide (Diamid Y, (manufactured by Nippon Kasei Co., Ltd.) | 0.8 parts |
| Palmitic acid amide (Diamid KP, (manufactured by Nippon Kasei Co., Ltd.) | 0.8 parts |
| Erucic acid amide (Diamid L-200, (manufactured by Nippon Kasei Co., Ltd.) | 0.8 parts |
| Oleic acid amide (Diamid O-200, (manufactured by Nippon Kasei Co., Ltd.) | 0.8 parts |
| Nonionic surfactant (Chemistat 1100, manufactured by Sanyo Chemical Industries, Co., Ltd.) | 0.52 parts |

-continued

| | |
|---|---|
| Rosin (KE-311, (manufactured by Arakawa Kagaku Co., Ltd.) | 3.59 parts |
| Pentaerythritol tetraacrylate (NK ester A-TMMT, manufactured by Shin-Nakamura Kagaku Co., Ltd.) | 2.19 parts |
| Surfactant (Megafac F-176PF, solid content: 20%, manufactured by Dainippon Chemicals and Ink Co., Ltd.) | 1.05 parts |
| n-Propyl alcohol | 664 parts |
| Methyl ethyl ketone | 193 parts |

Cyan

| Composition of cyan pigment dispersion mother solution Composition 1 of cyan pigment | |
|---|---|
| Polyvinyl butyral (Eslec B BL-SH, manufactured by Sekisui Chemical Industries, Ltd.) | 12.6 parts |
| Pigment Blue 15:4 (C.I. No. 74160) (Cyanine Blue 700-10FG, manufactured by Toyo Ink Mfg. Co., Ltd.) | 15.0 parts |
| Dispersion assistant (PW-36, manufactured by Kusumoto Kasei Co., Ltd.) | 0.8 parts |
| n-Propyl alcohol | 110 parts |
| **Composition of cyan pigment dispersion mother solution Composition 2 of cyan pigment** | |
| Polyvinyl butyral (Eslec B BL-SH, manufactured by Sekisui Chemical Industries, Ltd.) | 12.6 parts |
| Pigment Blue 15 (C.I. No. 74160) (Lionol Blue 7027, manufactured by Toyo Ink Mfg. Co., Ltd.) | 15.0 parts |
| Dispersion assistant (PW-36, manufactured by Kusumoto Kasei Co., Ltd.) | 0.8 parts |
| n-Propyl alcohol | 110 parts |
| **Composition of cyan image forming layer coating solution** | |
| Above cyan pigment dispersion mother solution | |
| composition 1 | 55.3 parts |
| composition 2 | 19.1 parts |
| Polyvinyl butyral (Eslec B BL-SH, manufactured by Sekisui Chemical Industries, Ltd.) | 4.77 parts |
| Inorganic pigment (MEK-ST) | 1.35 parts |
| Wax-based compound | |
| Stearic acid amide (Newtron 2, manufactured by Nippon Seika Co., Ltd.) | 0.6 part |
| Behenic acid amide (Diamid BM, (manufactured by Nippon Kasei Co., Ltd.) | 0.6 part |
| Lauric acid amide (Diamid Y, (manufactured by Nippon Kasei Co., Ltd.) | 0.6 part |
| Palmitic acid amide (Diamid KP, (manufactured by Nippon Kasei Co., Ltd.) | 0.6 part |
| Erucic acid amide (Diamid L-200, (manufactured by Nippon Kasei Co., Ltd.) | 0.6 part |
| Oleic acid amide (Diamid O-200, (manufactured by Nippon Kasei Co., Ltd.) | 0.6 part |
| Rosin (KE-311, (manufactured by Arakawa Kagaku Co., Ltd.) | 4.17 parts |
| Pentaerythritol tetraacrylate (NK ester A-TMMT, manufactured by Shin-Nakamura Kagaku Co., Ltd.) | 2.12 parts |
| Surfactant (Megafac F-176PF, solid content: 20%, manufactured by Dainippon Chemicals and Ink Co., Ltd.) | 2.15 parts |
| n-Propyl alcohol | 713 parts |
| Methyl ethyl ketone | 194 parts |

(3) In formation of a transferred image, drum rotation speed was changed to 600 rpm.

Using the obtained thermal transfer sheet and image-receiving sheet, the reflection optical density of each color of Y, M, C, K of the image transferred to Tokuryo art paper was measured in Y, M, C, K mode with a densitometer X-rite 938 (manufactured by X-rite Co.).

Reflection optical density, reflection optical density/image-forming layer thickness (μm) of each color are shown in Table 6 below together with the contact angle with water of the image-forming layer in the thermal transfer sheet of each color and the image-receiving layer.

TABLE 6

| | Reflection Optical Density | Reflection Optical Density/Image-Forming Layer Thickness | Contact Angle with Water of Image-Forming Layer and Image-Receiving Layer |
|---|---|---|---|
| Y | 1.01 | 2.40 | 108.1° |
| M | 1.51 | 3.97 | 98.8° |
| C | 1.59 | 3.03 | 95° |
| K | 1.82 | 3.03 | 94.8° |
| Image-Receiving Layer | — | — | 85° |

Example 4-2

A recording material was prepared in the same manner as in Example 4-1 except that the addition amounts of three kinds of the stearic acid amide, behenic acid amide and lauric acid amide of the wax-based compounds for use in an image-forming layer were doubled, and the use amounts of other wax-based compounds were adjusted so that the entire use amount of the wax-based compounds was equal to the amount in Example 4-1.

Example 4-3

A recording material was prepared in the same manner as in Example 4-1 except that the addition amounts of two kinds of the stearic acid amide and behenic acid amide of the wax-based compounds for use in an image-forming layer were tripled, and the use amounts of other wax-based compounds were adjusted so that the entire use amount of the wax-based compounds was equal to the amount in Example 4-1.

Reference Example 4-1

A recording material was prepared in the same manner as in Example 4-1 except that all the fatty acid amide used in the image-forming layer was replaced with a stearic acid amide.

Evaluation

The transfer rate (%) of the transferred image obtained under each temperature and humidity condition using the above four color thermal transfer sheets was found. The transfer rate means the value obtained by dividing the density of a transferred image to an actual paper after being printed solidly by the density of a transferred image to an actual paper after a non-recorded toner is laminated on an image-receiving sheet with heat. A densitometer X-rite 938 (manufactured by X-rite Co.) was used in the measurement. The results obtained are shown in Table 7 below.

TABLE 7

| | | Transfer Rate (%) | | |
|---|---|---|---|---|
| | | 18° C. 30% RH | 23° C. 50% RH | 25° C. 65% RH |
| Example 4-1 | Y | 97 | 98 | 98 |
| | M | 97 | 98 | 99 |
| | C | 95 | 96 | 95 |
| | K | 98 | 97 | 94 |
| Example 4-2 | Y | 95 | 96 | 96 |
| | M | 94 | 95 | 95 |
| | C | 93 | 94 | 94 |
| | K | 96 | 96 | 96 |
| Example 4-3 | Y | 94 | 96 | 95 |
| | M | 95 | 94 | 95 |
| | C | 93 | 94 | 94 |
| | K | 95 | 96 | 95 |
| Reference Example 4-1 | Y | 93 | 94 | 92 |
| | M | 92 | 93 | 93 |
| | C | 91 | 90 | 89 |
| | K | 88 | 89 | 85 |

It is apparent from the results in Table 7 that the recording materials according to the present invention are higher in transfer rate and transfer sensitivity as compared with the materials of reference examples. Furthermore, from the result in Reference Example 4-3, it can be seen that transfer sensitivity is further greatly improved when (meth)acrylate is added to an image-forming layer as the plasticizer.

Example 5

Example 5-1

A multicolor image-forming material was prepared and a transferred image was formed in the same manner as in Example 2 (Example 2-1) except that a thermal transfer sheet was formed according to the following prescription.

Formation of Thermal Transfer Sheet

1) Preparation of Photothermal Converting Layer Coating Solution

The following components were mixed with heating and stirring by a stirrer to prepare a light-sensitive layer coating solution.

| Composition of coating solution | |
|---|---|
| Methyl ethyl ketone | 800 parts |
| N-Methyl-2-pyrrolidone | 1,200 parts |
| Surfactant (F-177, manufactured by Dainippon Chemicals and Ink Co., Ltd.) | 1 part |
| Infrared absorbing dye (NK-2014 manufactured by Nippon Kanko Shikiso Co., Ltd.) | 10 parts |
| Polyimide (Rika Coat SN-20, manufactured by Shin Nihon Rika K.K.) | 200 parts |

2) Formation of Photothermal Converting Layer on Support Surface

The above coating solution for a photothermal converting layer was coated with a wire bar coater on one surface of a polyethylene terephthalate film (support) having a thickness of 75 μm, and the coated product was dried in an oven at 120° C. for 2 minutes, thus a photothermal converting layer was formed on the support. The obtained photothermal converting layer had absorption near wavelength 808 nm, and the absorbance (optical density: OD) measured by UV-spectrophotometer UV-240 (manufactured by Shimadzu Seisakusho Co. Ltd.) was 1.03. The layer thickness of the photothermal converting layer measured by observing the cross section with a scanning electron microscope was 0.3 μm on average.

3) Preparation of Image-forming Layer Coating Solution

| Composition of coating solution | |
|---|---|
| Four kinds of image-forming layer coating solutions A to D each having the composition shown below were prepared. | |
| Polyvinyl butyral (Denka Butyral #2000-L, manufactured by Electro Chemical Industry Co., Ltd., Vicat softening point: 57° C.) | 12 parts |
| Dispersion assistant (Solspers S-20000, manufactured by ICI Japan) | 0.8 parts |
| Solvent (n-propanol) | 110 parts |
| Pigment | |
| Coating solution A | |
| Cyan pigment Pigment Blue 15:4 (C.I. No. 74160) (Cyanine Blue 700-10FG, manufactured by Toyo Ink Mfg. Co., Ltd.) | 15 parts |
| Coating solution B | |
| Magenta pigment Pigment Red 57:1 (C.I. No. 15850:1) (Symuler Brilliant Carmine 6B-229, manufactured by Dainippon Chemicals and Ink Co., Ltd.) | 15 parts |
| Coating solution C | |
| Yellow pigment Pigment Yellow 14 (C.I. NO. 21095) (Permanent Yellow G, manufactured by Clariant Japan, K.K.) | 15 parts |
| Coating solution D | |
| Black pigment Pigment Black 7 (carbon black, C.I. No. 77266) (Mitsubishi Carbon Black MA100, manufactured by Mitsubishi Chemicals Co., Ltd., PVC blackness: 10) | 15 parts |

4) Formation of Image-forming Layer on Photothermal Converting Layer Surface

A coating solution was prepared by adding 0.24 parts of stearic acid amide, 0.12 parts of rosin-based resin (Rosin KR610, manufactured by Arakawa Kagaku Co., Ltd.), 0.4 parts of the above polyvinyl butyral resin, 0.045 parts of surfactant (F-177, manufactured by Dainippon Chemicals and Ink Co., Ltd.), and 100 parts of n-propanol to 10 parts each of image-forming layer coating solution A, B, C or D. These coating solutions were coated on the photothermal converting layer in a dry thickness of A: 0.4 μm, B: 0.4 μm, C: 0.4 μm, D: 0.35 μm.

The reflection optical density of the image-forming layer ($OD_r$) was in the case of A: 1.59, B: 1.51, C: 1.01, and D: 1.82, and ($OD_r$)/layer thickness of the image-forming layer (μm) was in the case of A: 3.98, B: 3.78, C: 2.53, and D: 5.2. The contact angle with water of the image-forming layer and the image-receiving layer was in the case of A: 95°, B: 98.8°, C: 108.1°, and D: 94.8°, and contact angle with water of the image-receiving layer was in the case of 85°.

The transferability from the image-forming layer to the image-receiving sheet, the definition of a transferred image, and adhesion resistance were evaluated by the method as shown below. The results obtained are shown in Table 8 below.

Transferability to Actual Paper

After laser recording of an image, the laminate for image-forming was detached from the recording drum and passed through a laminator (the temperature of the heat roller: 130° C., application of compressed air at a rate of 4 kg/cm$^2$, linear velocity: 0.3 m/min), and after the temperature was lowered to room temperature, the image-receiving sheet and the thermal transfer sheet were separated and the image-forming layer was transferred to the image-receiving sheet.

The evaluation of the transferability of an image was performed according to the following criteria.

A: All of the image-forming layer was lifted and transferred without unevenness.

B: The image-forming layer was lifted a little and glistened.

C: The image-forming layer was partially remained after transferring.

Definition

The definition of a transferred image was visually evaluated according to the following criteria.

AA: Excellent definition could be obtained.

A: Sufficiently practicable definition could be obtained.

B: Practicable definition could be obtained.

Adhesion Resistance

Five image-receiving sheets each cut to a size of 5×5 cm were superposed, a load of 1.2 kg was applied, the laminate was subjected to heat sealing treatment at 45° C., and then the image-receiving sheets were separated. The state of adhesion was evaluated according to the following criteria.

A: Each sheet was separated like sliding.

C: Sheets were not separated when they were not bent one time.

CC: Sheets were not separated even when they were bent two times.

Examples 5-2 to 5-6

Each multicolor image-forming material was prepared and a transferred image was formed in the same manner as in Example 5-1 except that the rosin shown in Table 8 below was used in place of the rosin used in the image-forming layer. The results of evaluations are shown in Table 8.

TABLE 8

| | Rosin Added to the Image-Forming Layer | Acid Value | Softening Point | Definition | Transferability to Actual Paper | Adhesion Resistance |
|---|---|---|---|---|---|---|
| Example 5-1 | Special rosin KR610 | 165–175 | 80–87 | A | A | A |
| Example 5-2 | Pentaerythritol ester of hydrogenated rosin | 12 | 97 | A | A | A |
| Example 5-3 | Gum rosin | 165 | 78 | A | A | A |
| Example 5-4 | Wood rosin | 163 | 72 | B | B | A |
| Example 5-5 | Tole rosin | 175 | 75 | B | B | A |
| Example 5-6 | Special rosin ester KE311 | 2–10 | 90–100 | B | B | A |

From the results in Table 8, it is apparent that when the rosin-based resin having the physical property specified in one embodiment of the present invention is used in an image-forming layer in a thermal transfer sheet, the characteristics such as the transferability to an actual paper, the definition of a transferred image and adhesion resistance are greatly improved. Accordingly, an acid value of a rosin added to the image-forming layer is preferably from 2 to 220, more preferably from 11 to 180.

Example 5-5

An image-receiving sheet was prepared in the same manner as in Example 5-1 except that the same amount of the rosin-based resin (Rosin KR610, manufactured by Arakawa Kagaku Co., Ltd.) used in the thermal transfer sheet in Example 5-1 was used in the image-receiving layer in the image-receiving sheet.

A thermal transfer sheet was prepared in the same manner as in Example 5-1 except that the rosin-based resin was not used in the image-forming layer.

A transferred image was formed in the same manner as in Example 5-1 using the above-prepared image-receiving sheet and thermal transfer sheet, and transferability to an actual paper, definition and adhesion resistance were evaluated.

As a result, transferability and definition were excellent and adhesion resistance was on a practicable level.

The materials for proof developed by the present inventors are based on the membrane transfer technique, and as a result for solving novel problems in laser transfer technique and further improving the image quality, the present inventors have developed a heat transfer recording system by laser irradiation for DDCP which comprises an image-forming material of B2 size or larger having performances of transfer to actual printing paper, reproduction of actual dots and of a pigment type, output driver, and high grade CMS software. Thus, a system capable of sufficiently exhibiting the performances of the materials of high definition could be realized according to the present invention. Specifically, the present invention can provide proof corresponding to CTP system and contract proof substituting analog style color proof. By this proof, color reproduction which coincides with printed matters and analog style color proofs for obtaining the approval of customers can be realized. The present invention can provide DDCP system by using the same pigment materials as used in the printing inks, effecting transfer to actual paper and generating no moire. The present invention can also provide a large sized high grade DDCP (A2/B2 or more) capable of transferring to actual paper, capable of using the same pigment materials as used in the printing inks, and showing high approximation to printed matters. The system of the present invention is a system adopting laser membrane transfer, using pigment coloring materials and capable of transferring to actual paper by real dot recording. According to the multicolor image-forming system according to the present invention, even when laser recording by high energy using multi-beam two dimensional array under different temperature humidity conditions is performed, an image having good image quality and stable transfer density can be formed on the image-receiving sheet. In particular, the present invention can enhance the adhesion of the image-forming layer and the image-receiving sheet at transfer recording by laser irradiation, and improve recording sensitivity, image quality and transferability to an actual paper.

While the invention has been described in detail and with reference to specific examples thereof, it will be apparent to one skilled in the art that various changes and modifications can be made therein without departing from the spirit and scope thereof.

What is claimed is:

1. A multicolor image-forming membrane heat transfer system comprising:

an image-receiving sheet comprising an image-receiving layer; and at least four thermal transfer sheets each comprising a support, a photothermal converting layer and an image-forming layer, and each having a different color, wherein an image is formed by the method comprising the steps of:

superposing each one of the at least four thermal transfer sheets on the image-receiving sheet to be in a state of the image-forming layer being in contact with the image-receiving layer; and irradiating the thermal transfer sheet with a laser beam to membrane heat transfer an image in an area of the image-forming layer subjected to irradiation onto the image-receiving layer, wherein the transferred image has resolution of 2,400 dpi or more and an area of the image-receiving layer on which an image is transferred is a size of 515×728 mm or more, and the surface of the image-forming layer has a smooster value of from 2.3 to 50 mmHg, a ratio of the reflection optical density ($OD_r$) of the image-forming layer to a thickness of the image-forming layer ($\mu$m unit) is 1.50 or more, and a contact angle in relation to water of the image-forming layer and the image-receiving layer is from 7.0 to 120.0°.

2. The multicolor image-forming membrane heat transfer system according to claim 1, wherein a difference between the contact angle in relation to water of the image-forming layer and the contact angle in relation to water of the image-receiving layer is 73° or less.

3. The multicolor image-forming membrane heat transfer system according to claim 1, wherein a difference between the contact angle in relation to water of the image-forming layer and the contact angle in relation to water of the image-receiving layer is 65° or less.

4. The multicolor image-forming membrane heat transfer system according to claim 1, wherein the image-forming layer comprises a first binder comprising a monomer unit and the image-receiving layer comprises a second binder comprising a monomer unit, and at least one of the monomer unit of the first binder and at least one of the monomer unit of the second binder are the same.

5. The multicolor image-forming membrane heat transfer system according to claim 4, wherein the same monomer unit is a vinyl acetal unit.

6. The multicolor image-forming membrane heat transfer system according to claim 4, wherein at least one of the same monomer unit is selected from a styrene unit, a butyral unit and a styrene acrylate unit.

7. The multicolor image-forming membrane heat transfer system according to claim 1, wherein each of the at least four thermal transfer sheets and the image-receiving sheet comprises a coating layer and at least one of the coating layer comprises a surface tension decreasing agent.

8. The multicolor image-forming membrane heat transfer system according to claim 7, wherein the surface tension decreasing agent is capable of:

making a surface tension of 1-propanol 22.5 mN/m or less at the time of being contained in a solvent of 1-propanol to be in concentration of 0.5% by weight;

making a surface tension of methyl ethyl ketone 22.5 mN/m or less at the time of being contained in a solvent of methyl ethyl ketone to be in concentration of 0.5% by weight; and making a surface tension of N-methyl-2-pyrrolidone 25.0 mN/m or less at the time of being contained in a solvent of N-methyl-2-pyrrolidone to be in concentration of 0.5% by weight.

9. The multicolor image-forming membrane heat transfer system according to claim 7, wherein the surface tension decreasing agent is a perfluoroalkylpolyoxyalkylene oligomer.

10. The multicolor image-forming membrane heat transfer system according to claim 1, wherein each of the at least four thermal transfer sheets and the image-receiving sheet comprises a coating layer and at least one of the coating layer comprises at least two kinds of waxes having a melting point of 100° C. or less.

11. The multicolor image-forming membrane heat transfer system according to claim 10, wherein the wax is a fatty acid amide.

12. The multicolor image-forming membrane heat transfer system according to claim 11, wherein the fatty acid amide comprises a fatty acid amide in which a fatty acid moiety is a saturated fatty acid and a fatty acid amide in which a fatty acid moiety is an unsaturated fatty acid.

13. The multicolor image-forming membrane heat transfer system according to claim 10, wherein at least one of the coating layer comprises at least one of monomethacrylate, monoacrylate, dimethacrylate, diacrylate, trimethacrylate, triacrylate, tetramethacrylate and tetraacrylate.

14. The multicolor image-forming membrane heat transfer system according to claim 10, wherein at least one of the coating layer comprises one of:

a monomer represented by the following formula (1):

$$R_1R_2R_3C—CH_2—OCO—CR{=}CH_2 \quad (1)$$

wherein $R_1$, $R_2$ and $R_3$ each independently represents one of a hydrogen atom, a lower alkyl group, and a $—CH_2—OCO—CR{=}CH_2$ group in which R represents one of a hydrogen atom and a methyl group; and a homo- or copolymer comprising the monomer as the main component.

15. The multicolor image-forming membrane heat transfer system material according to claim 1, wherein the image-forming layer comprises a rosin-based resin having a softening point of 100° C. or less measured by a ring and ball method and an acid value of from 2 to 220 measured according to JIS K3504.

16. The multicolor image-forming membrane heat transfer system according to claim 15, wherein the rosin-based resin is a resin selected from a rosin, a hydrogenated rosin, a modified rosin, derivatives of these rosins, and a rosin-modified maleic acid resin.

17. The multicolor image-forming membrane heat transfer system according to claim 15, wherein the rosin-based resin comprises 30% by weight or more of an abietic acid type rosin acid.

18. The multicolor image-forming membrane heat transfer system according to claim 15, wherein the rosin-based resin is an esterified product of a rosin comprising 30% by weight or more of an abietic acid type rosin acid and at least one kind of polyhydric alcohol selected from ethylene glycol, glycerol and pentaerythritol.

19. The multicolor image-forming membrane heat transfer system according to claim 1, wherein the image-receiving layer comprises a rosin-based resin having a softening point of less than 130° C. measured by a ring and ball method and an acid value of from 2 to 250 measured according to JIS K3504.

20. The multicolor image-forming membrane heat transfer system according to claim 1, wherein a ratio of a optical density ($OD_{LH}$) of the photothermal converting layer to a thickness of the photothermal converting layer (μm unit) is 4.36 or more.

21. The multicolor image-forming membrane heat transfer system according to claim 1, wherein a ratio of the reflection optical density ($OD_r$) of the image-forming layer to a thickness of the image-forming layer (μm unit) is 2.50 or more.

22. The multicolor image-forming membrane heat transfer system according to claim 1, wherein a ratio of the reflection optical density ($OD_r$) of the image-forming layer to a thickness of the image-forming layer (μm unit) is 1.80 or more, and a contact angle in relation to water of the image-receiving layer is 86° or less.

23. The multicolor image-forming membrane heat transfer system according to claim 1, wherein the photothermal converting layer comprises a heat resisting resin having a glass transition temperature of from 200° C. to 400° C. and a heat decomposition temperature of 450° C. or more.

24. The multicolor image-forming membrane heat transfer system according to claim 23, wherein the heat resisting resin is an organic solvent-soluble polyimide resin.

25. The multicolor image-forming membrane heat transfer system material according to claim 1, wherein the image-forming layer comprises from 20 to 80% by weight of a pigment and 20 to 80% by weight of an amorphous organic high molecular weight polymer having a softening point of from 40 to 150° C., and the image-forming layer has a thickness of from 0.2 μm to 1.5 μm.

26. A method for forming a multicolor image using the image-receiving sheet according to claim 1 and the at least four thermal transfer sheets according to claim 1, the method comprising the steps of:

superposing each one of the at least four thermal transfer sheets on the image-receiving sheet to be in a state of the image-forming layer being in contact with the image-receiving layer; and irradiating the thermal transfer sheet with a laser beam to membrane heat transfer an image in an area of the image-forming layer subjected to irradiation onto the image-receiving layer, wherein each of the image-forming layer is a thin film.

27. The multicolor image-forming membrane heat transfer system according to claim 1, wherein the contact angle in relation to water of the image-forming layer and the image-receiving layer is from 7.0 to 86°.

28. The multicolor image-forming membrane heat transfer system according to claim 1, wherein the thermal transfer sheet comprises a photothermal converting layer with a deformation factor of 110% or more.

* * * * *